US012804950B2

(12) United States Patent
Cheng et al.

(10) Patent No.: US 12,804,950 B2
(45) Date of Patent: Nov. 17, 2026

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Chung-Liang Cheng, Changhua County (TW); Ziwei Fang, Baoshan Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 774 days.

(21) Appl. No.: 18/069,747

(22) Filed: Dec. 21, 2022

(65) Prior Publication Data

US 2023/0131388 A1 Apr. 27, 2023

Related U.S. Application Data

(60) Continuation of application No. 17/461,458, filed on Aug. 30, 2021, now Pat. No. 11,563,099, which is a division of application No. 16/589,957, filed on Oct. 1, 2019, now Pat. No. 11,127,832.

(51) Int. Cl.

| | |
|---|---|
| ***H10D 30/67*** | (2025.01) |
| ***H10D 64/66*** | (2025.01) |
| ***H10D 64/68*** | (2025.01) |
| ***H10D 84/01*** | (2026.01) |
| ***H10D 84/03*** | (2025.01) |
| ***H10D 84/83*** | (2025.01) |

(52) U.S. Cl.

CPC ....... *H10D 30/6735* (2025.01); *H10D 64/667* (2025.01); *H10D 64/681* (2025.01); *H10D 84/0128* (2025.01); *H10D 84/0144* (2025.01); *H10D 84/0158* (2025.01); *H10D 84/038* (2025.01); *H10D 84/834* (2025.01)

(58) Field of Classification Search

CPC ............. H10D 30/6735; H10D 64/667; H10D 84/0158; H10D 84/834; H10D 84/0144; H10D 84/0128; H10D 84/038

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |

(Continued)

OTHER PUBLICATIONS

U.S. Appl. No. 17/461,458, filed Aug. 30, 2021.
U.S. Appl. No. 16/589,957, filed Oct. 1, 2019.

*Primary Examiner* — Christine A Enad

(74) *Attorney, Agent, or Firm* — Birch, Stewart, Kolasch & Birch, LLP

(57) ABSTRACT

A semiconductor structure is provided. The semiconductor structure includes a first channel layer over a first region of a substrate, a first gate dielectric layer over the first channel layer, and a first gate electrode structure over the first gate dielectric layer. The first gate electrode structure includes a barrier layer over the first gate dielectric layer, a barrier oxide over and in contact with the barrier layer, and a metal fill layer over the barrier oxide. The barrier layer is made of a nitride of a metal, and the barrier oxide is made of an oxide of the metal.

20 Claims, 42 Drawing Sheets

(56) References Cited

U.S. PATENT DOCUMENTS

| | | | | |
|---|---|---|---|---|
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 9,972,623 | B1 * | 5/2018 | Lin | H10D 84/83 |
| 2016/0307896 | A1 * | 10/2016 | Lin | H10D 64/693 |
| 2018/0350946 | A1 * | 12/2018 | Bih | H10D 64/017 |
| 2018/0374926 | A1 * | 12/2018 | Lee | H10D 64/671 |
| 2019/0131185 | A1 * | 5/2019 | Huang | H10D 84/038 |
| 2019/0237336 | A1 | 8/2019 | Wang et al. | |
| 2019/0371675 | A1 * | 12/2019 | Tsai | H10D 84/0158 |
| 2019/0378906 | A1 | 12/2019 | Loubet et al. | |
| 2020/0020690 | A1 | 1/2020 | Ando et al. | |
| 2020/0294865 | A1 | 9/2020 | Cheng et al. | |
| 2021/0057544 | A1 | 2/2021 | Lin et al. | |

* cited by examiner

SEMICONDUCTOR STRUCTURE AND METHOD FOR FORMING THE SAME

PRIORITY CLAIM AND CROSS-REFERENCE

This application is a continuation application of U.S. patent application Ser. No. 17/461,458, filed on Aug. 30, 2021, entitled of "SEMICONDUCTOR STRUCTURE, which is a divisional application of U.S. patent application Ser. No. 16/589,957, filed on Oct. 1, 2019, now U.S. Pat. No. 11,127,832, issued on Sep. 21, 2021, and entitled of "SEMICONDUCTOR STRUCTURE AND METHOD FOR FORMING THE SAME," the entirety of which is incorporated by reference herein.

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 2A-1 through 2G-2 are cross-sectional views illustrating the formation of a semiconductor device at various intermediate stages, in accordance with some embodiments of the disclosure.

FIGS. 3-1 and 3-2 are enlarged views of area A of FIG. 2G-1 to further illustrate additional details of metal gate structures of various transistors, in accordance with some embodiments.

FIGS. 3-3 and 3-4 are enlarged views of area B of FIG. 2G-2 to further illustrate details of metal gate structures of various transistors, in accordance with some embodiments.

FIGS. 4A-1 through 4O-2 are cross-sectional views illustrating the formation of the metal gate structures of FIGS. 3-1 through 3-4 at various intermediate stages, in accordance with some embodiments of the disclosure.

DETAILED DESCRIPTION

Figure 1:
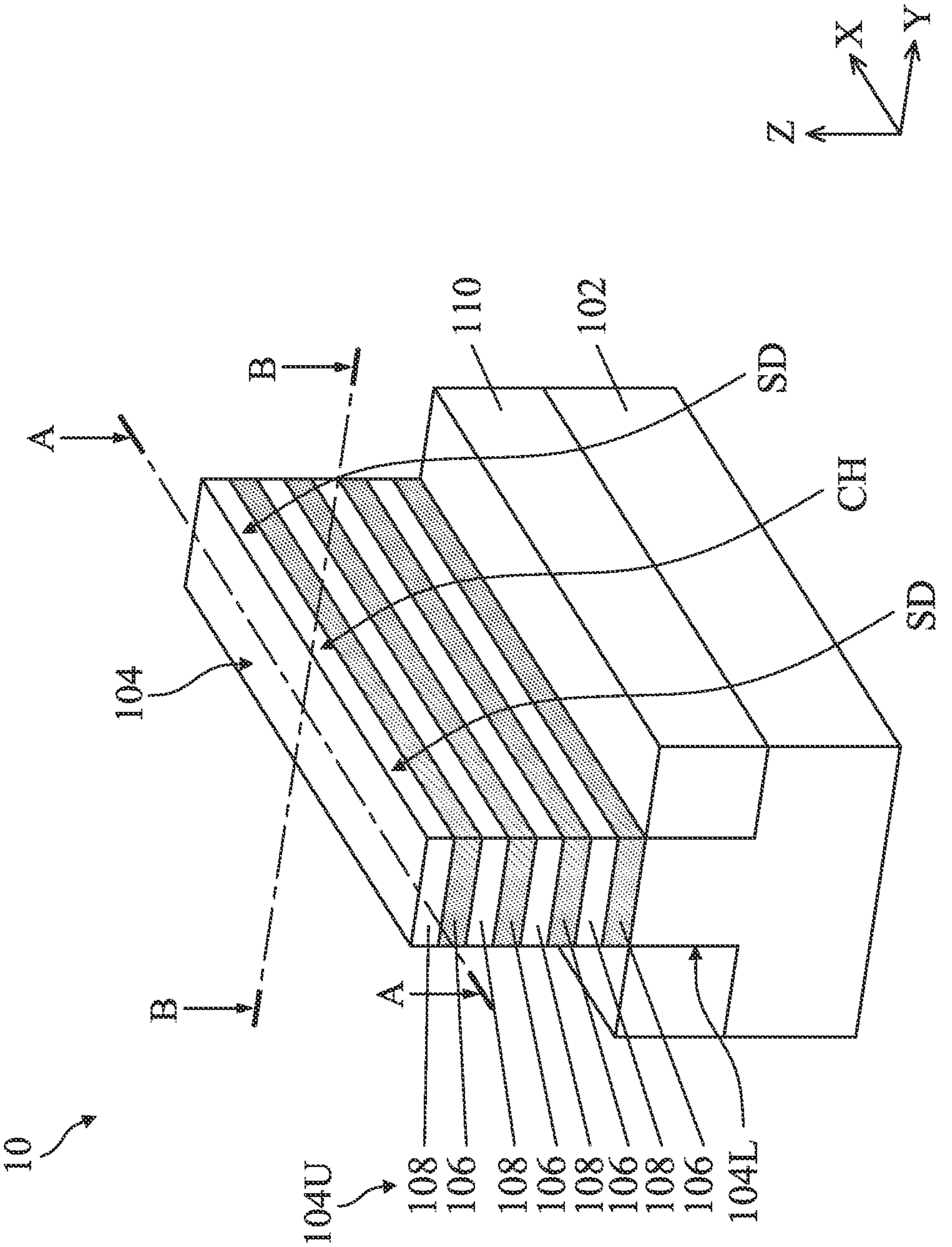
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of forming respective metal gate structures for various transistors (e.g., GAA FET) with different threshold voltages in a semiconductor structure are provided. The metal gate structures may include respective barrier layers having different thicknesses or may not include a barrier layer. The method for forming the semiconductor structure may include forming a gate dielectric layer on the channel layers, and forming a barrier material on the gate dielectric layer. At least a portion of the barrier material is oxidized to form a barrier oxide. The method also includes etching away the barrier oxide and forming a work function layer to wrap around the channel layers. As a result, the etching process for thinning down the barrier material may be precisely controlled, which may achieve the various transistors having different threshold voltages in a semiconductor structure.

FIG. 1 is a perspective view of a semiconductor structure, in accordance with some embodiments of the disclosure. For a better understanding of the semiconductor structure, an X-Y-Z coordinate reference is provided in FIG. 1. The X-axis and Y-axis are generally orientated along the lateral directions that are parallel to the main surface of the semiconductor structure. The Y-axis is transverse (e.g., substantially perpendicular) to the X-axis. The Z-axis is generally oriented along the vertical direction that is perpendicular to the main surface of a semiconductor structure (or the X-Y plane).

A semiconductor structure 10 is provided, as shown in FIG. 1, in accordance with some embodiments. The semiconductor structure 10 includes a substrate 102, and a fin structure 104 and an isolation structure 110 formed on the substrate 102 in accordance with some embodiments.

In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

The fin structure 104 extends in the X direction, in accordance with some embodiments. That is, the fin structure 104 has a longitudinal axis parallel to the X direction, in accordance with some embodiments. The fin structure 104 includes a lower portion 104L and an upper portion 104U, in accordance with some embodiments. The lower portion 104N of the fin structure 104 is formed by a portion of the substrate 102, in accordance with some embodiments. The upper portion 104U of the fin structure 104 is formed by a stacked semiconductor structure, which includes first semiconductor layers 106 and second semiconductor layers 108 alternately stacked over the lower portion 104L, in accordance with some embodiments.

The fin structure 104 includes a channel region CH and source/drain regions SD, where the channel region CH is defined between the source/drain regions SD, in accordance with some embodiments. As explained in detail below, the first semiconductor layers 106 of the fin structure 104 will be removed and the second semiconductor layers 108 of the fin structure 104 form nano structures (e.g., nanowires or nanosheet structures) that laterally extend between source/drain features and serve as the channel layers for the resulting transistor, in accordance with some embodiments. Gate structures (not shown) will be formed across and wrap around the nano structures of the second semiconductor layers 108 and interpose the source/drain regions SD, in accordance with some embodiments. For example, the embodiments described herein illustrate processes and materials that may be used to form nano structures with a GAA design for n-channel FinFETs and p-channel FinFETs.

In some embodiments, the formation of the fin structure 104 includes forming a stacked semiconductor structure including a first semiconductor material for the first semiconductor layers 106 and a second semiconductor material for the second semiconductor layers 108 over the substrate 102.

The first semiconductor material for the first semiconductor layers 106 has a different lattice constant than the second semiconductor material for the second semiconductor layers 108, in accordance with some embodiments. In some embodiments, the first semiconductor layers 106 are made of SiGe, where the percentage of germanium (Ge) in the SiGe is in a range from about 20 atomic % to about 50 atomic %, and the second semiconductor layers 108 are made of silicon. In some embodiments, the first semiconductor layers 106 are $Si_{1-x}Ge_x$, where xis more than about 0.3, or Ge (x=1.0) and the second semiconductor layers 108 are Si or $Si_{1-y}Ge_y$, where y is less than about 0.4, and x>y. In some embodiments, the first semiconductor material and the second semiconductor material are alternatingly formed using an epitaxial growth process such as molecular beam epitaxy (MBE), metal organic chemical vapor deposition (MOCVD), or vapor phase epitaxy (VPE), or another suitable technique.

In some embodiments, the thickness of each of the first semiconductor layers 106 is in a range from about 1.5 nanometers (nm) to about 20 nm. In some embodiments, the first semiconductor layers 106 are substantially uniform in thickness. In some embodiments, the thickness of each of the second semiconductor layers 108 is in a range from about 1.5 nm to about 20 nm. In some embodiments, the second semiconductor layers 108 are substantially uniform in thickness.

Afterward, the stacked semiconductor structure including the first semiconductor material and the second semiconductor material and the underlying substrate 102 are patterned into the fin structure 104. In some embodiments, the patterning process includes forming a patterned hard mask layer (not shown) over the stacked semiconductor structure, and etching the semiconductor structure and the substrate 102 uncovered by the patterned hard mask layer to form trenches and the fin structure 104 therebetween. In some embodiments, after the etching process, the substrate 102 has a portion which protrudes from between the trenches to form the lower portion 104L of the fin structure 104. In some embodiments, the remainder of the stacked semiconductor structure directly above the lower portion 104L forms the upper portions 104U of the fin structure 104.

An insulating material for the isolation structure 110 is formed over the fin structure 104 and the patterned hard mask layer and fills the trenches, in accordance with some embodiments. In some embodiments, the insulating material includes silicon oxide, silicon nitride, silicon oxynitride (SiON), another suitable insulating material, multilayers thereof, and/or a combination thereof. In some embodiments, the insulating material is formed using CVD (such as LPCVD, plasma enhanced CVD (PECVD), high density plasma CVD (HDP-CVD), high aspect ratio process (HARP), flowable CVD (FCVD)), atomic layer deposition (ALD), another suitable technique, and/or a combination thereof.

The insulating material is planarized using such as a chemical mechanical polishing (CMP) process to remove the portion of insulating material formed above the patterned hard mask layer, and then recessed using an etch-back process to form isolation structures 110, in accordance with some embodiments. The planarization process may further remove the patterned hard mask layer over the fin structure 104. The upper portion 104U of the fin structure 104 is exposed from the recessed isolation structures 110, in accordance with some embodiments.

FIG. 1 further illustrates a reference cross-section that is used in later figures. Cross-section A-A is in a plan along the longitudinal axis of the fin structure 104, in accordance with some embodiments. Cross-section B-B is in a plane across the channel region CH of the fin structure 104 and is along the longitudinal axis of a gate structure, in accordance with some embodiments.

Figures 2, 2A:
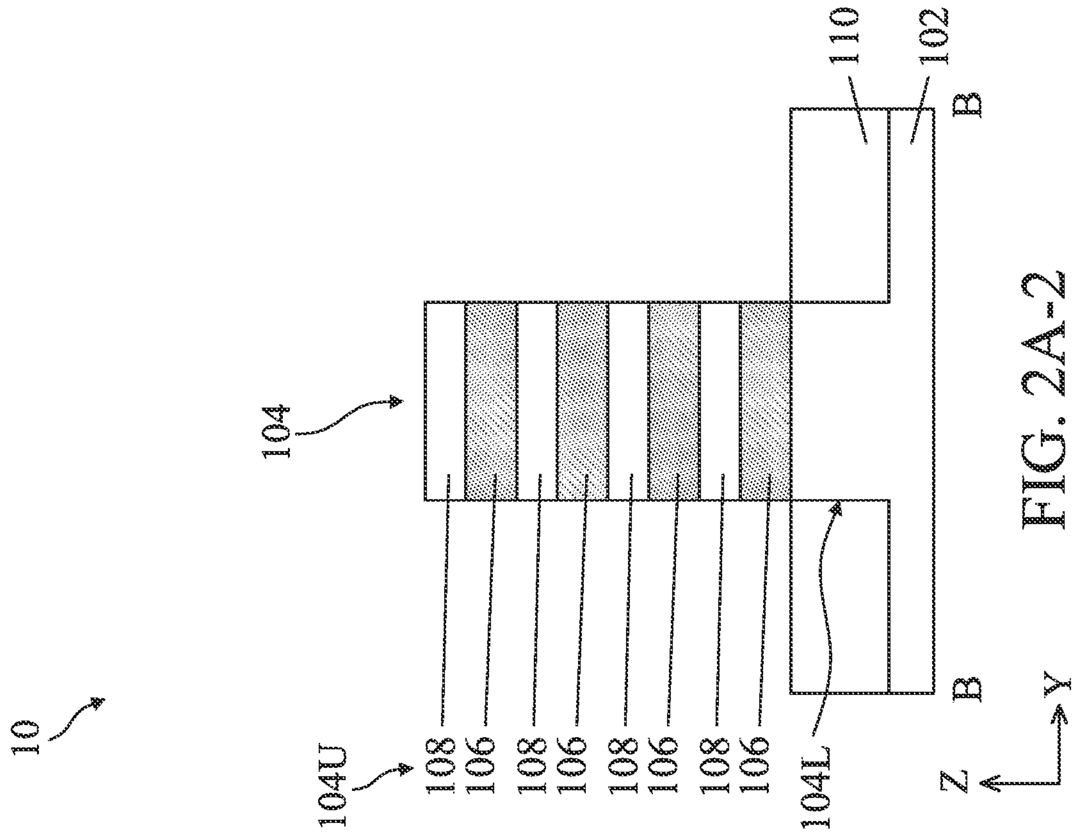
Figures 1, 2A:
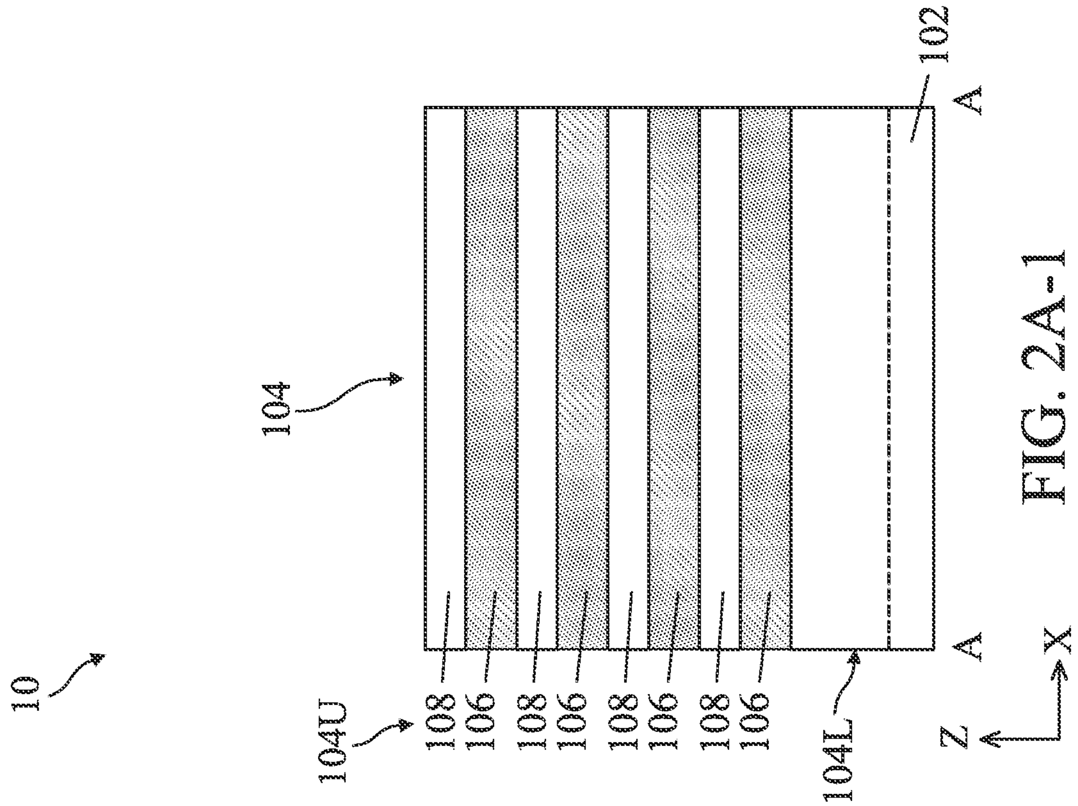
Figures 2, 2B:
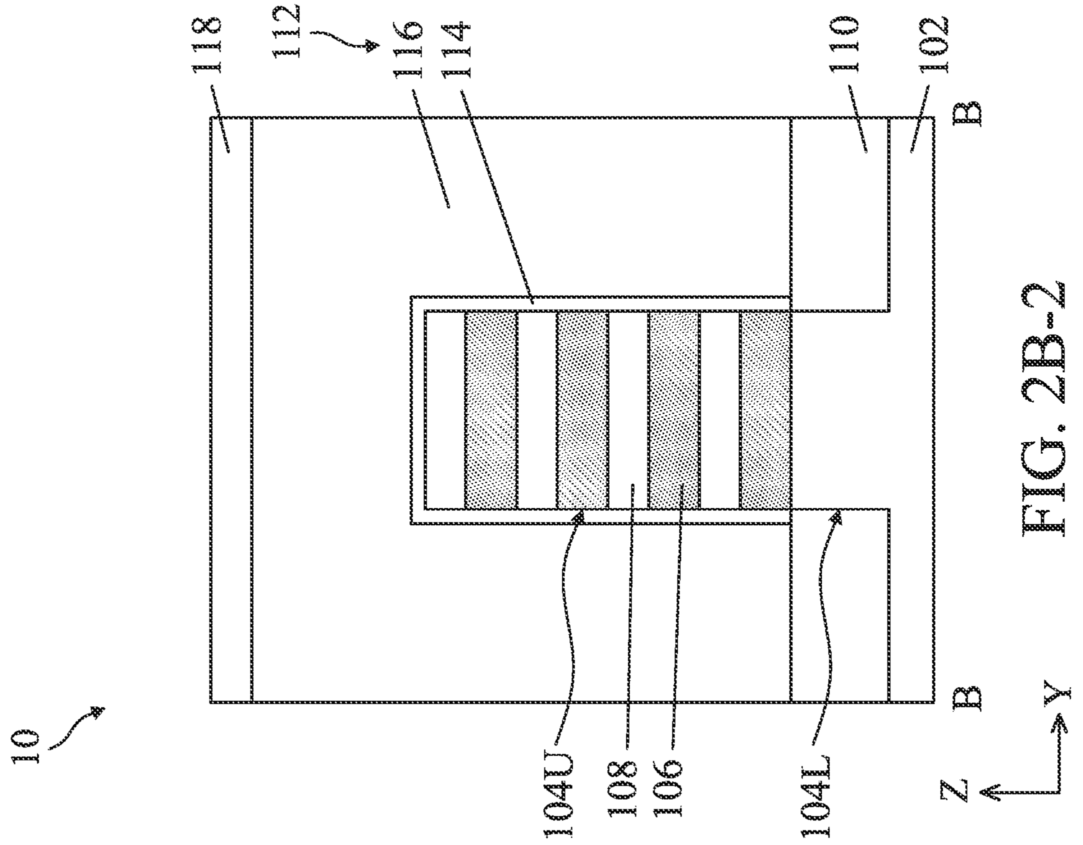
Figures 1, 2B:
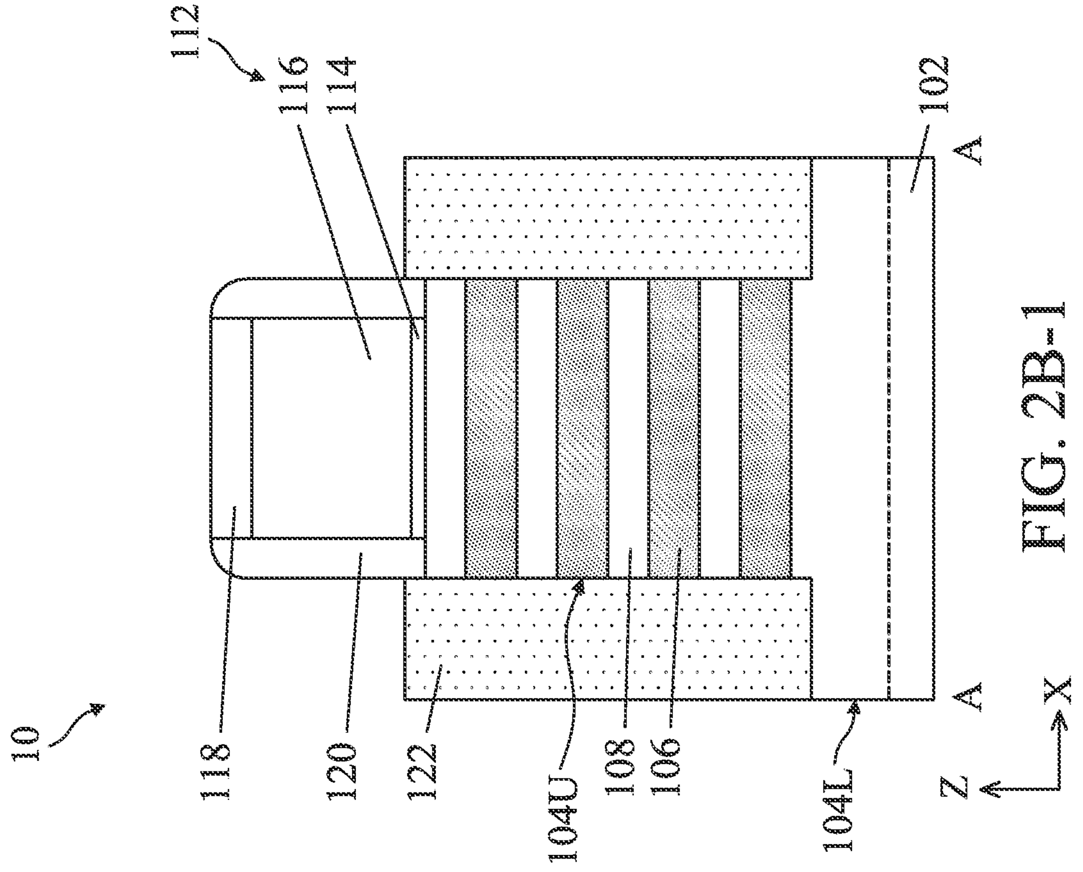
Figures 2, 2C:
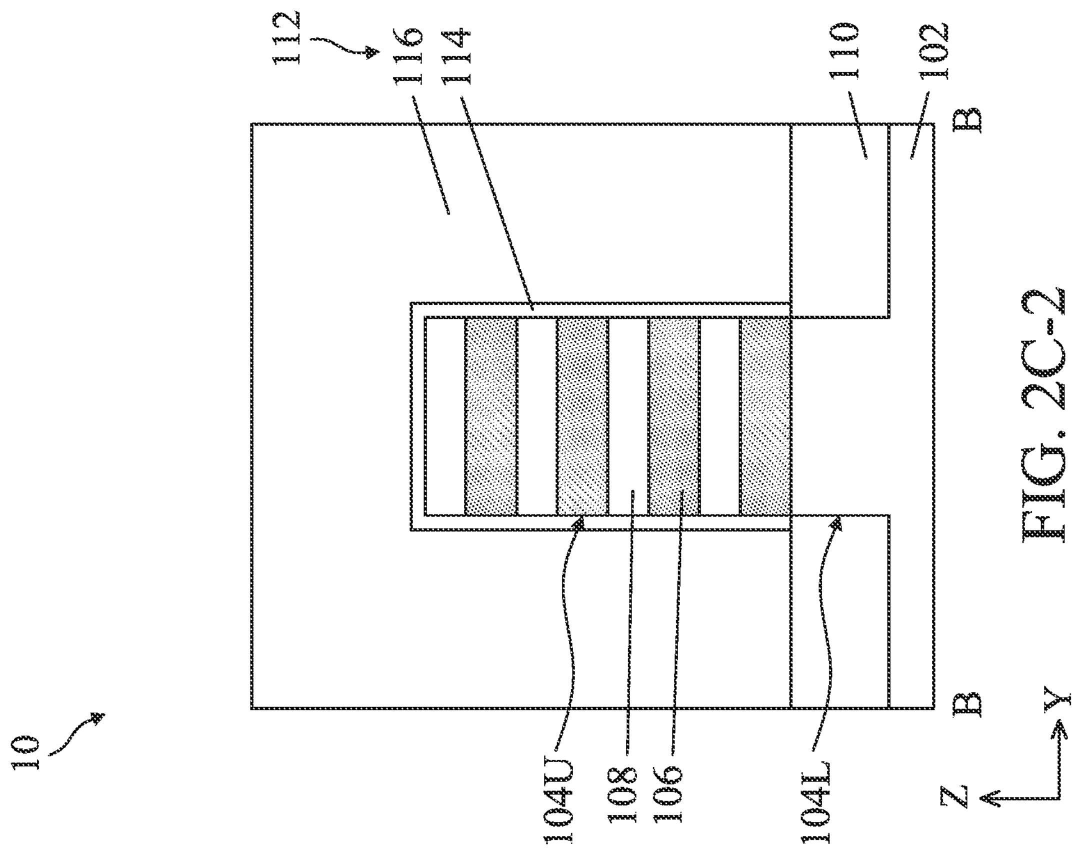
Figures 1, 2C:
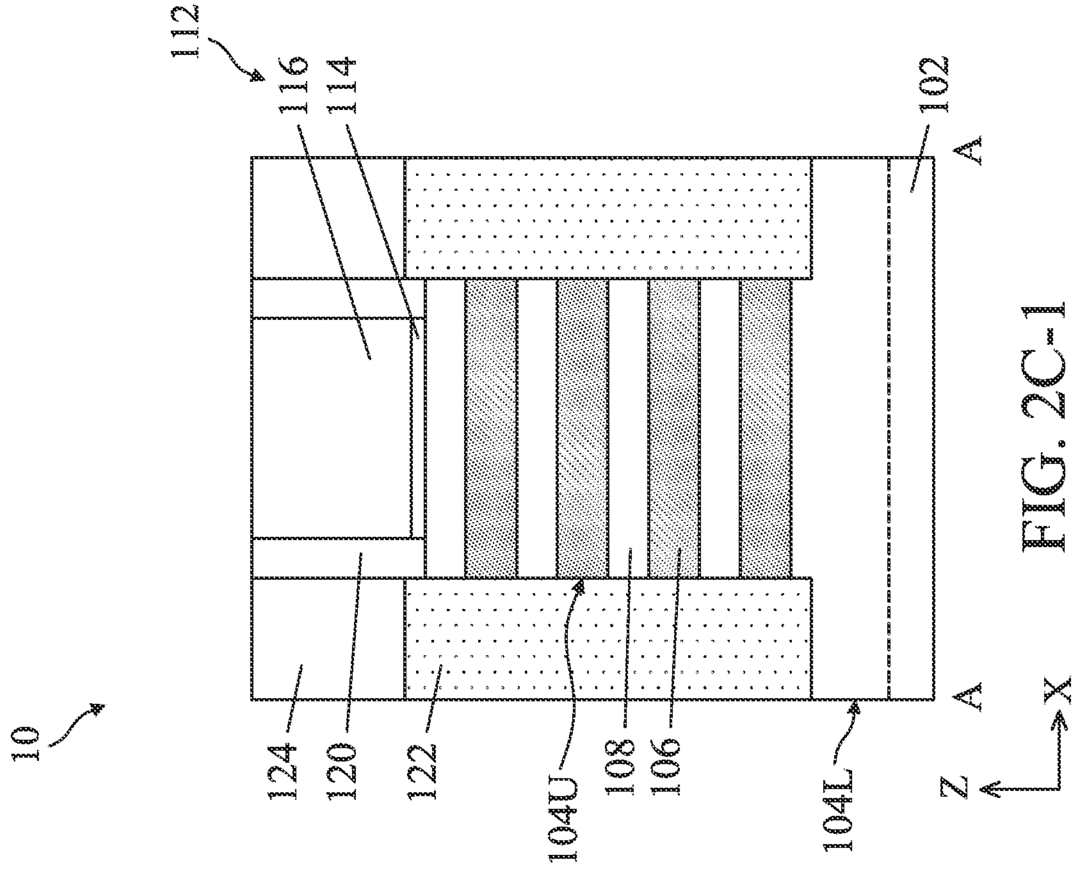
Figures 2, 2D:
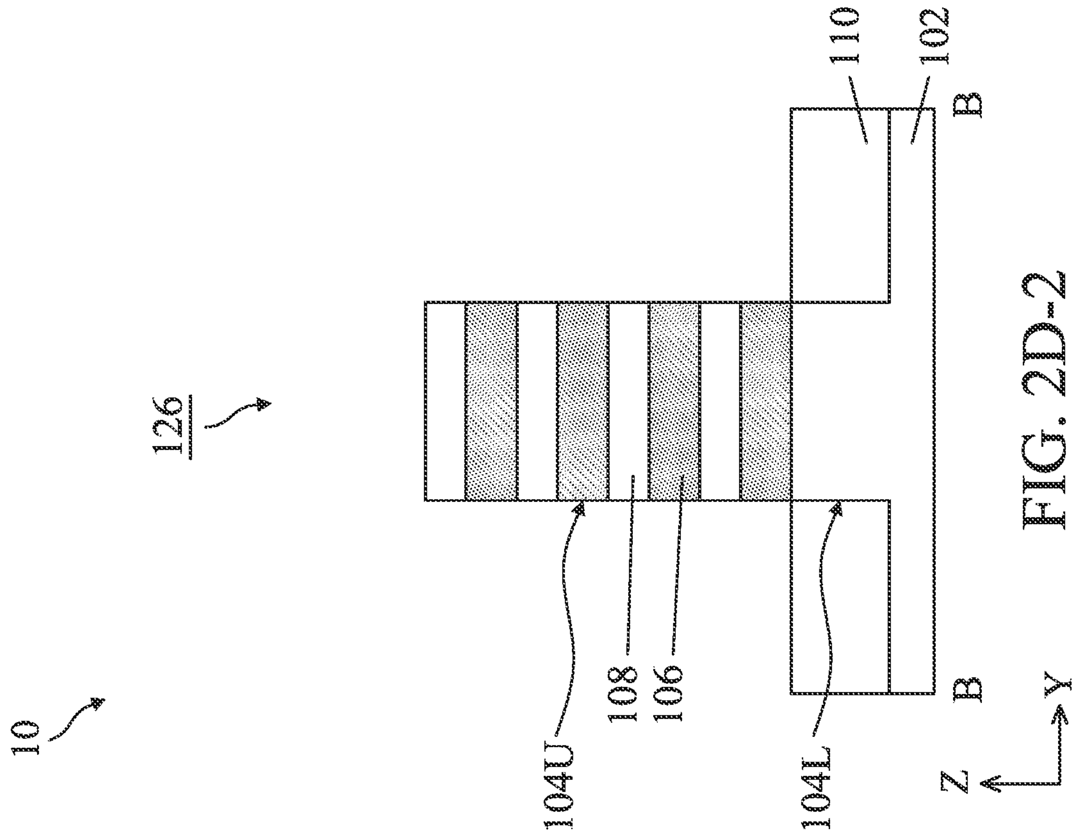
Figures 1, 2D:
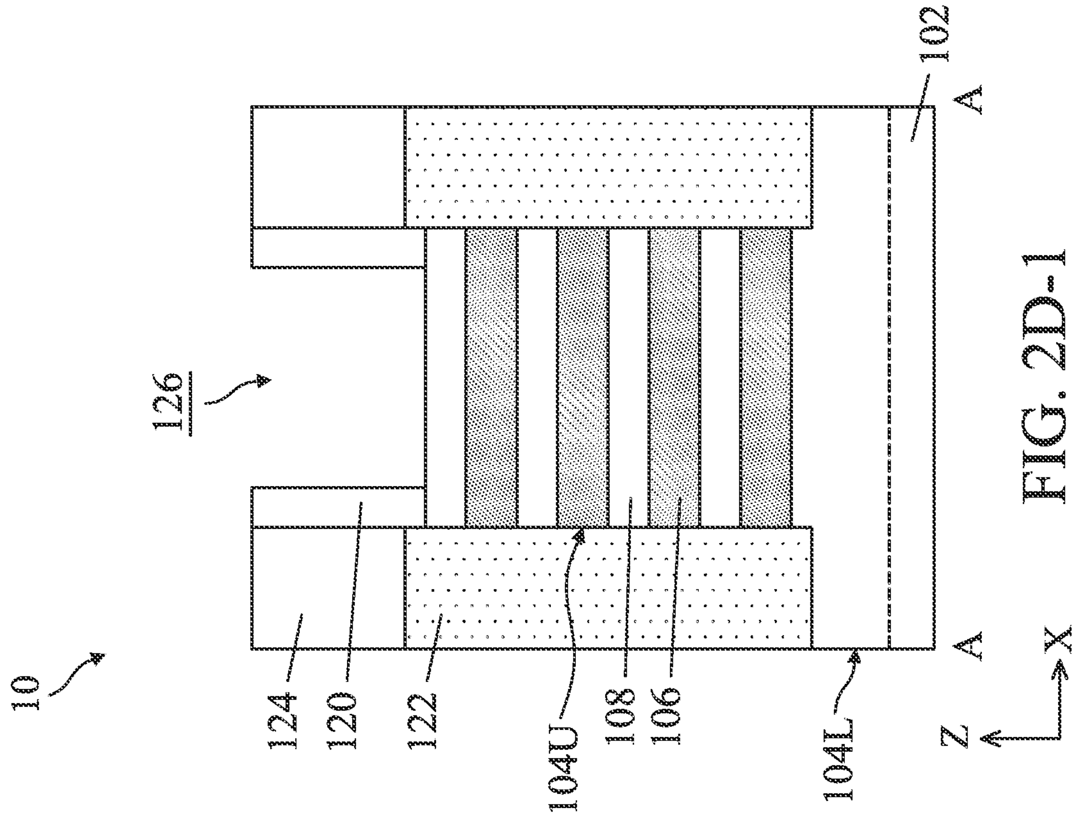
Figures 2, 2E:
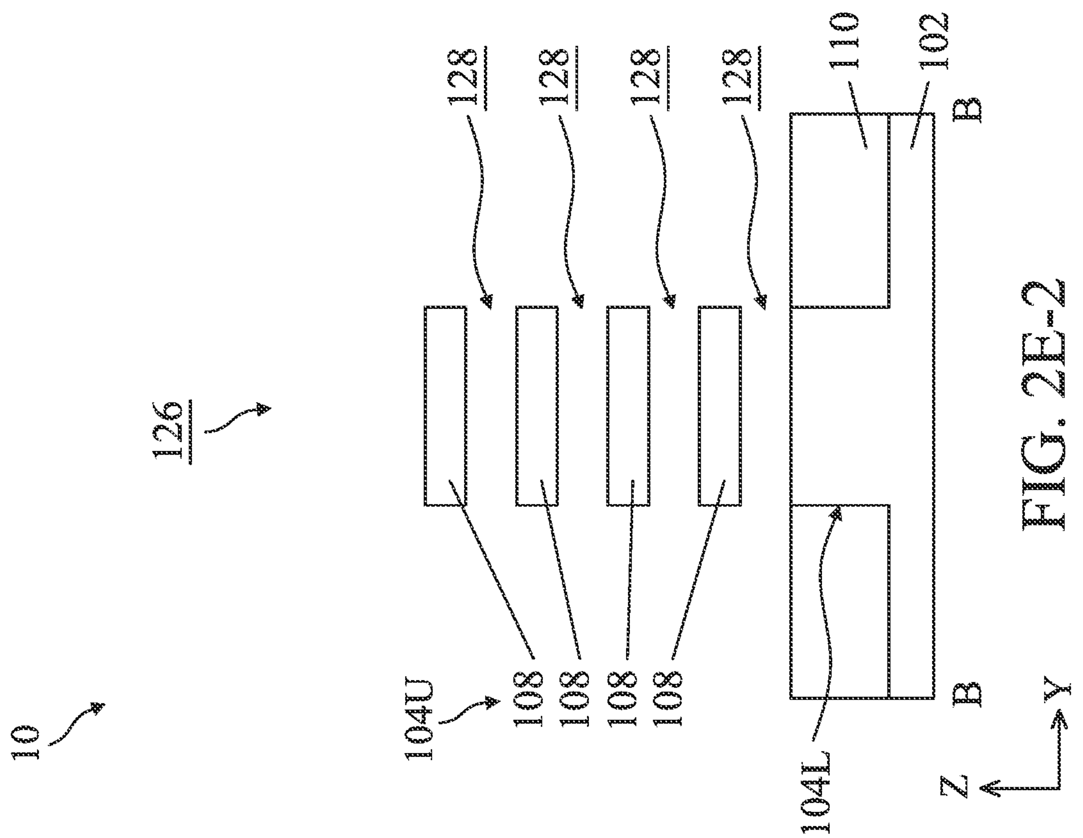
Figures 1, 2E:
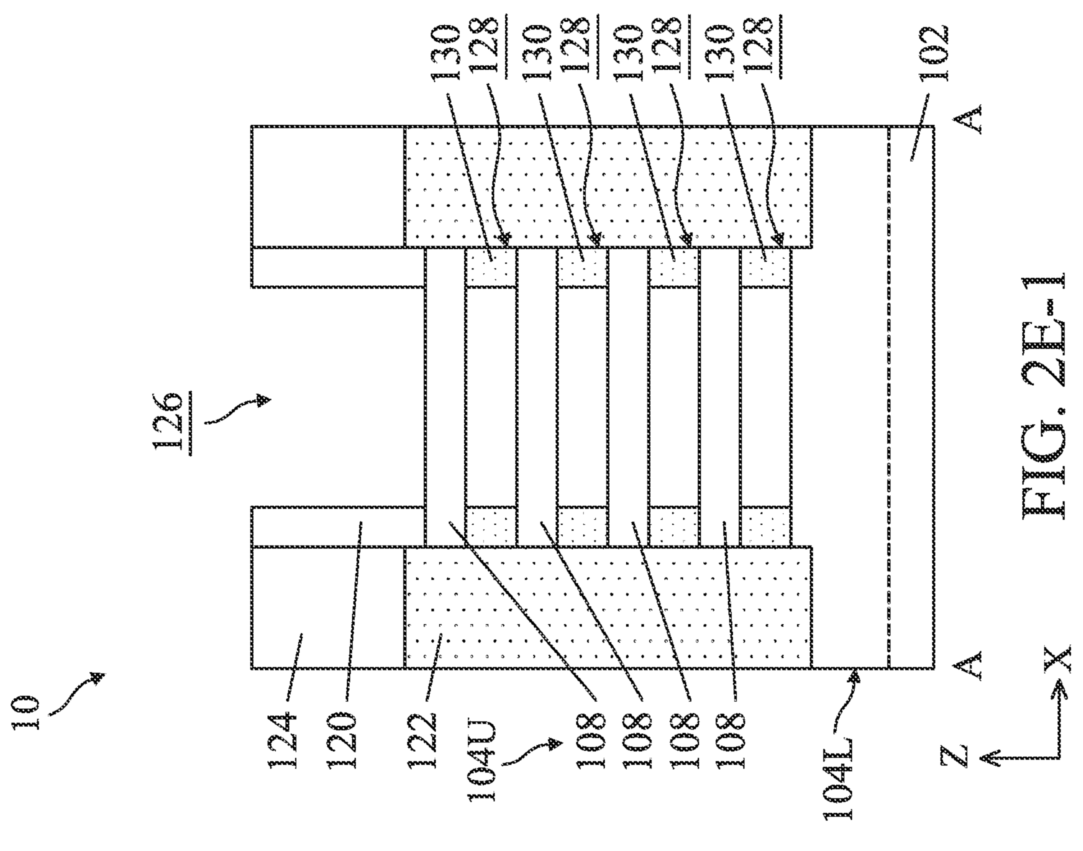
Figures 1, 2F:
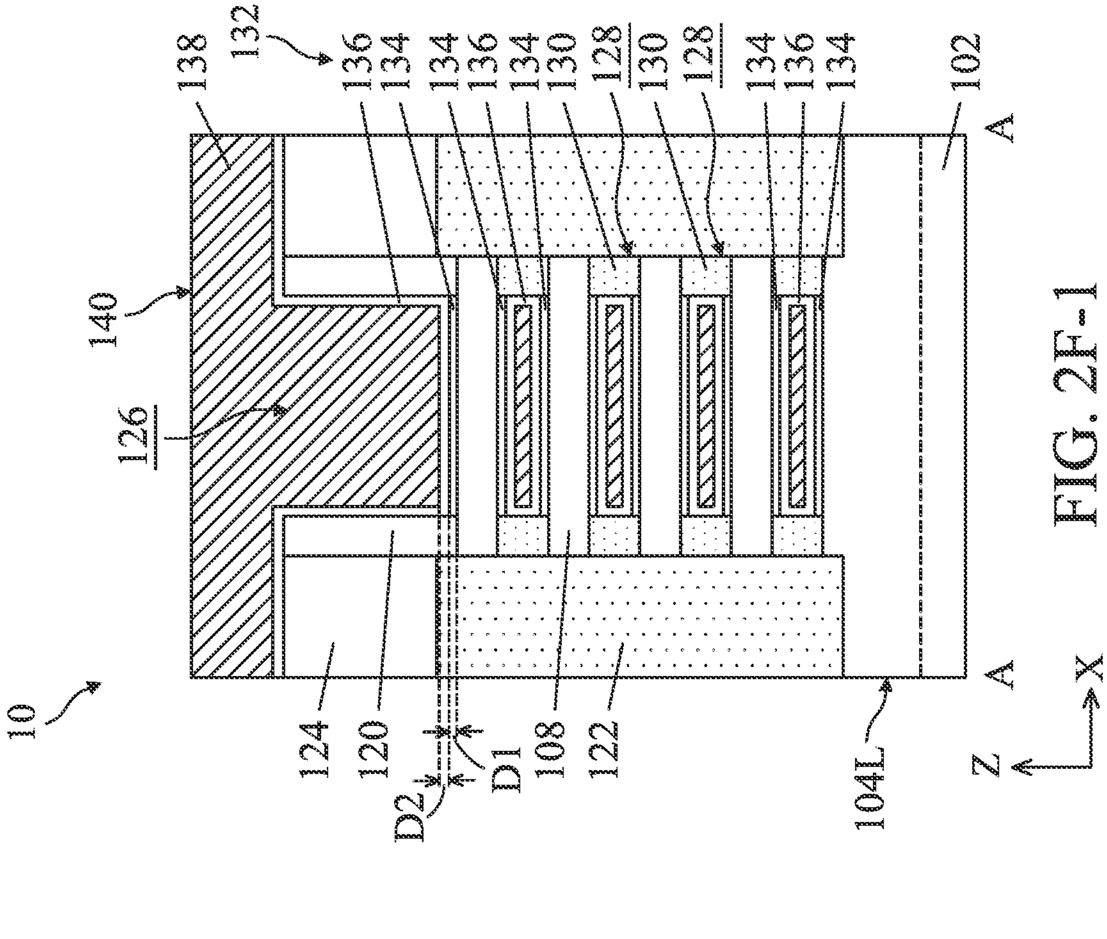
Figures 2, 2F:
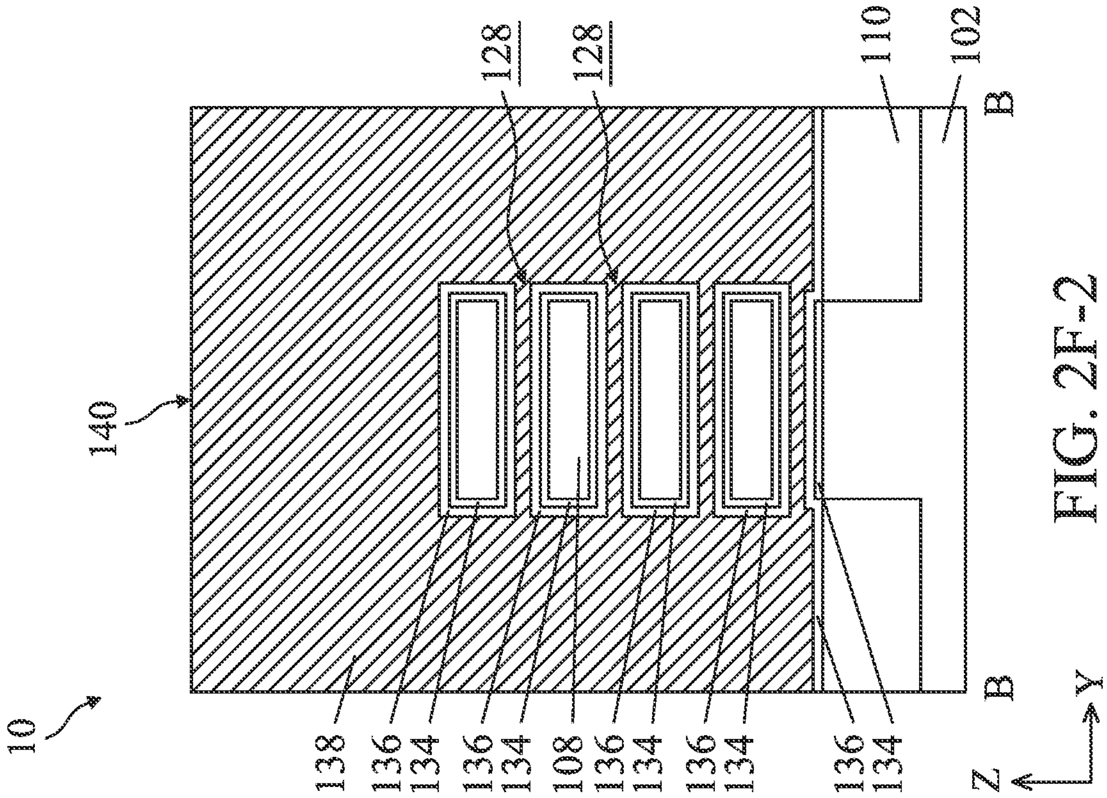
Figures 2, 2G:
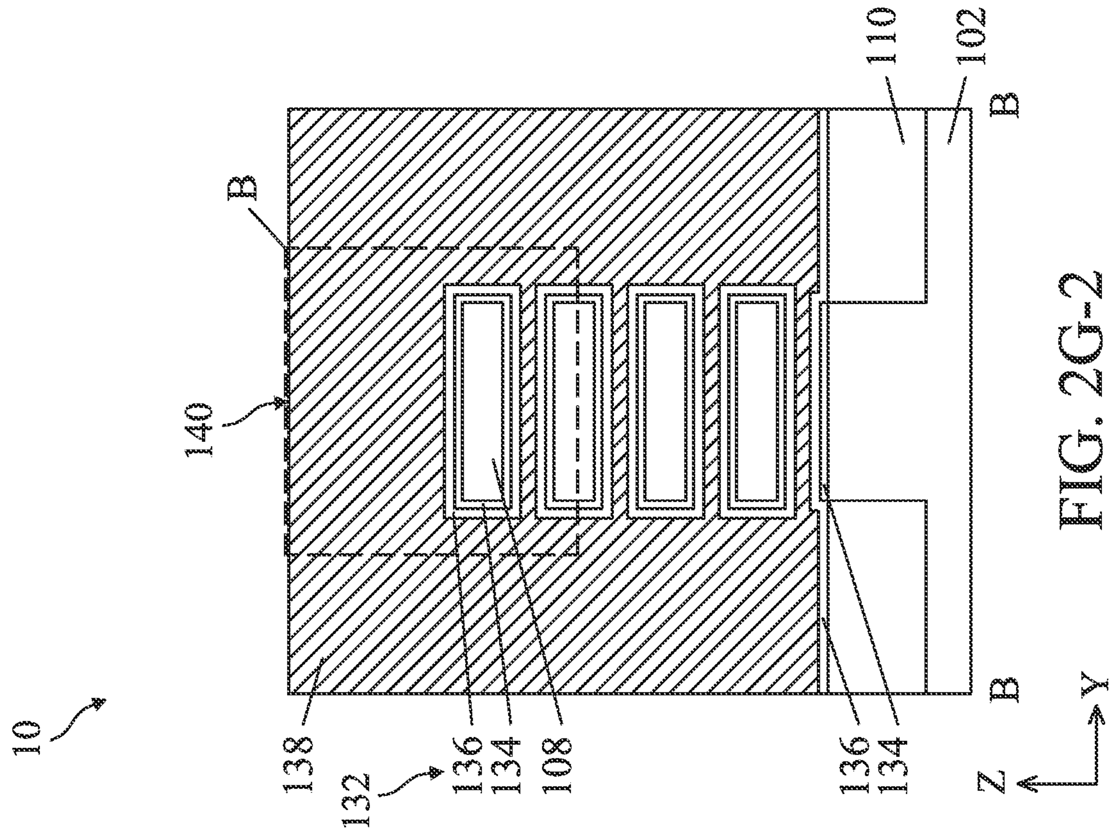
Figures 1, 2G:
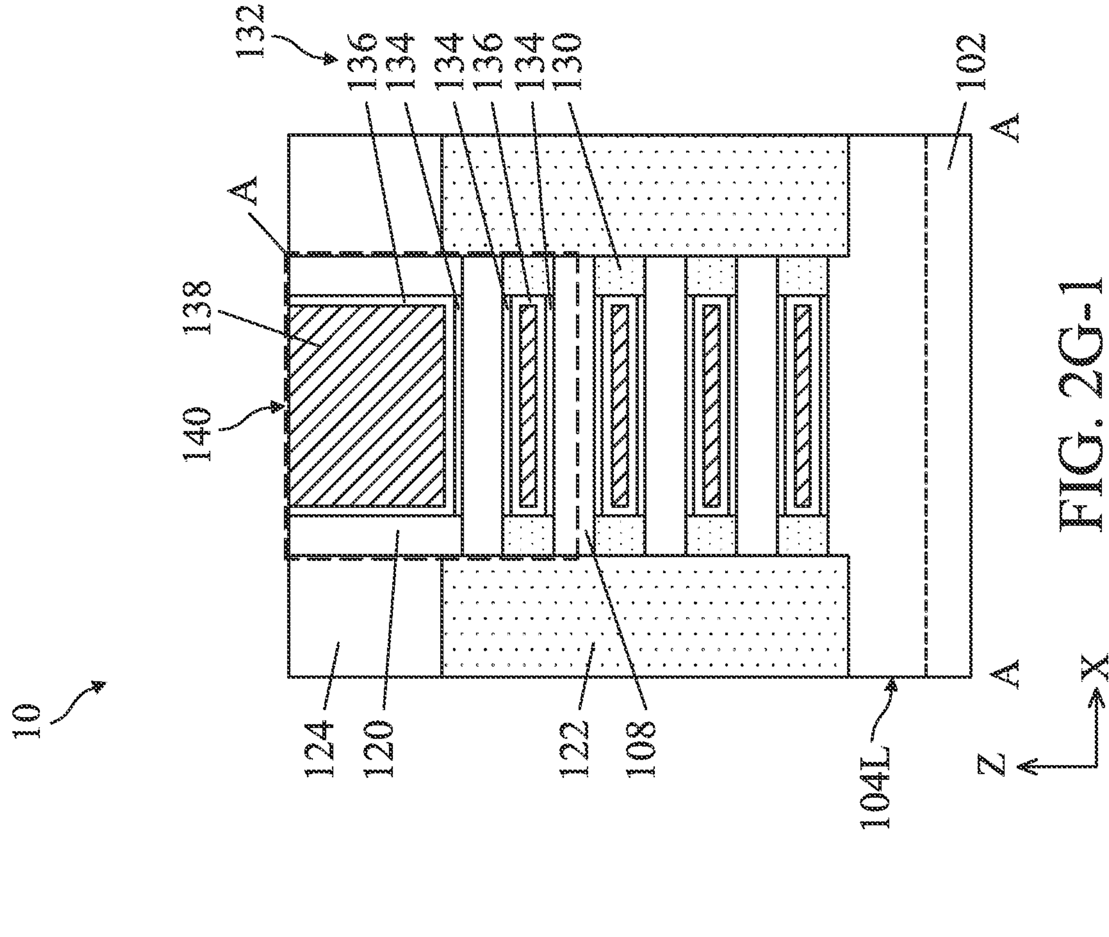

FIGS. 2A-1 through 2G-2 are cross-sectional views illustrating the formation of a semiconductor device at various intermediate stages, in accordance with some embodiments of the disclosure. FIGS. 2A-1 through 2G-1 are cross-sectional views corresponding to cross-section A-A of FIG. 1 and FIGS. 2A-2 and 2G-2 are cross-sectional views corresponding to cross-section B-B of FIG. 1.

FIGS. 2A-1 and 2A-2 are cross-sectional views of the semiconductor structure 10 of FIG. 1, in accordance with some embodiments.

FIGS. 2B-1 and 2B-2 are cross-sectional views of a semiconductor structure after the formation of a dummy gate structure, a gate spacer layer, source/drain features, in accordance with some embodiments.

A dummy gate structure 112 is formed over the semiconductor structure 10, as shown in FIGS. 2B-1 and 2B-2, in accordance with some embodiments. The dummy gate structure 112 extends across and wraps the channel region of the fin structure 104, in accordance with some embodiments.

The dummy gate structure 112 includes a dummy gate dielectric layer 114 and a dummy gate electrode layer 116 formed on the dummy gate dielectric layer 114, in accordance with some embodiments. In some embodiments, the dummy gate dielectric layer 114 is made of one or more dielectric materials, such as silicon oxide (SiO), silicon nitride (SiN), silicon oxynitride (SiON), $HfO_2$, HfZrO, HfSiO, HfTiO, HfAlO, and/or a combination thereof. In some embodiments, the dielectric material is formed using thermal oxidation, CVD, ALD, physical vapor deposition (PVD), another suitable technique, and/or a combination thereof.

In some embodiments, the dummy gate electrode layer 116 is made of a conductive material, such as polysilicon, poly-silicon germanium, metallic nitrides, metallic silicides, metals, and/or a combination thereof. In some embodiments, the conductive material is formed using CVD, another suitable technique, and/or a combination thereof.

In some embodiments, the formation of the dummy gate structure 112 includes depositing a dielectric material for the dummy gate dielectric layer 114 and a conductive material for the dummy gate electrode layer 116, planarizing the conductive material, and patterning the dielectric material and the conductive material into the dummy gate structure 112. The patterning process may include forming an etching mask 118 (such as patterned hard mask layer or patterned photoresist layer) over the conductive material to cover the channel region of the fin structure 104. The conductive material and dielectric material, uncovered by the etching mask 118, may be etched away to expose the source/drain regions of the fin structure 104.

A gate spacer layer 120 is formed over the semiconductor structure 10, as shown in FIGS. 2B-1 and 2B-2, in accordance with some embodiments. The gate spacer layer 120 is formed along opposite sidewalls of the dummy gate structure 112, in accordance with some embodiments.

In some embodiments, the gate spacer layer 120 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the formation of the gate spacer layer 120 includes conformally depositing a dielectric material for the gate spacer layer 120 over the semiconductor structure 10 followed by an anisotropic etching process such as dry etching.

Figures 1, 3:
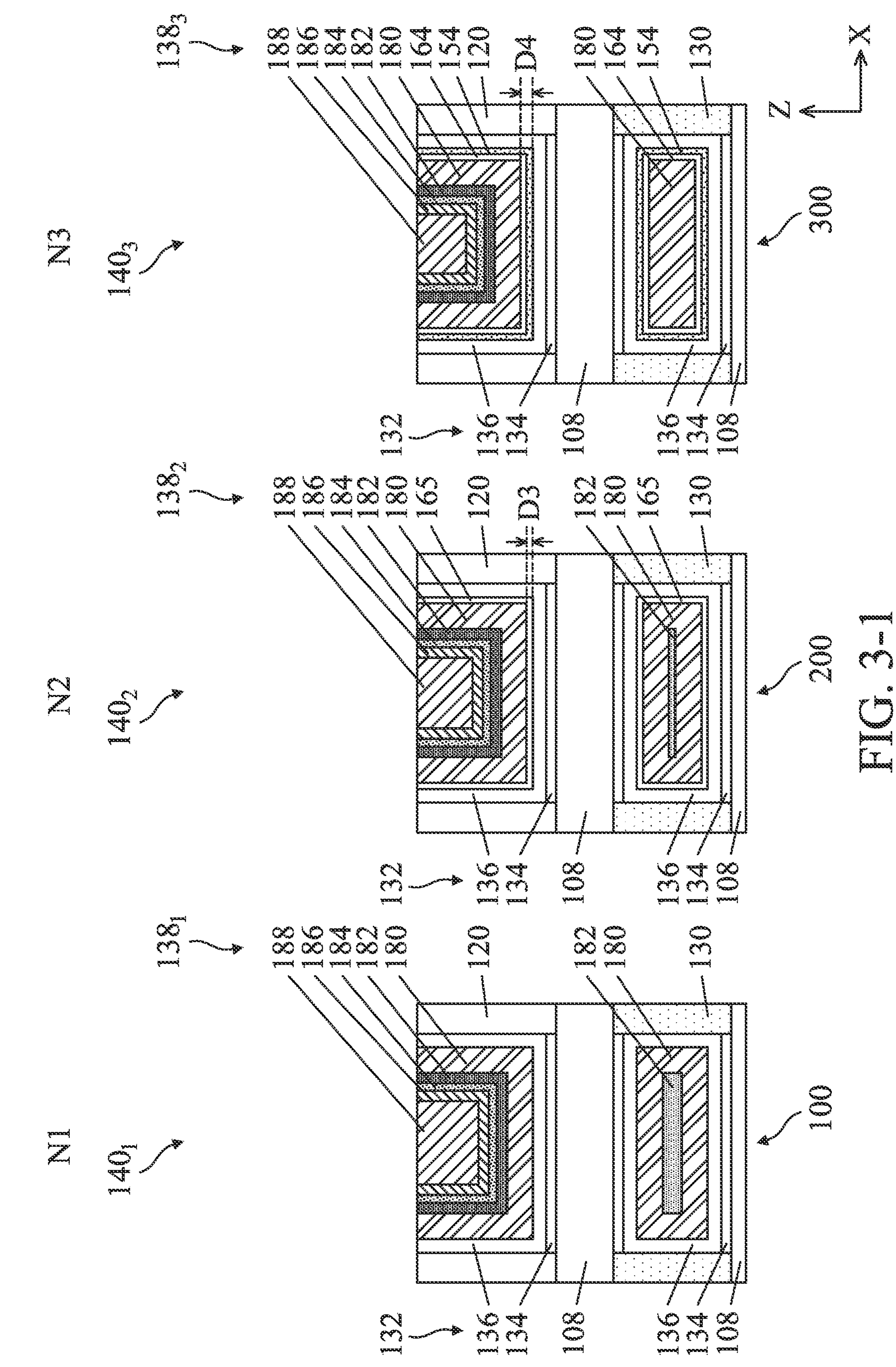
Figures 2, 3:
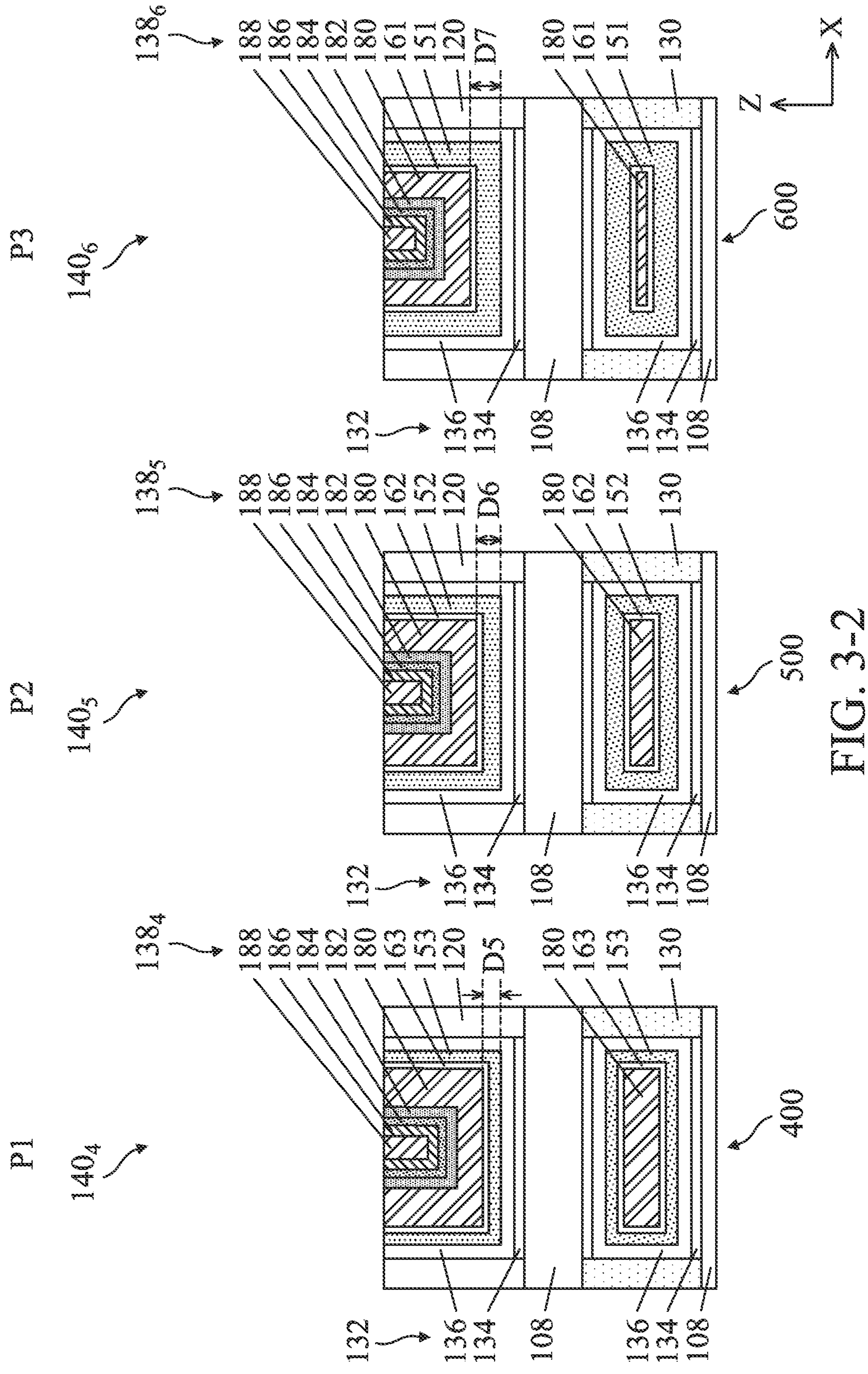
Figure 3:
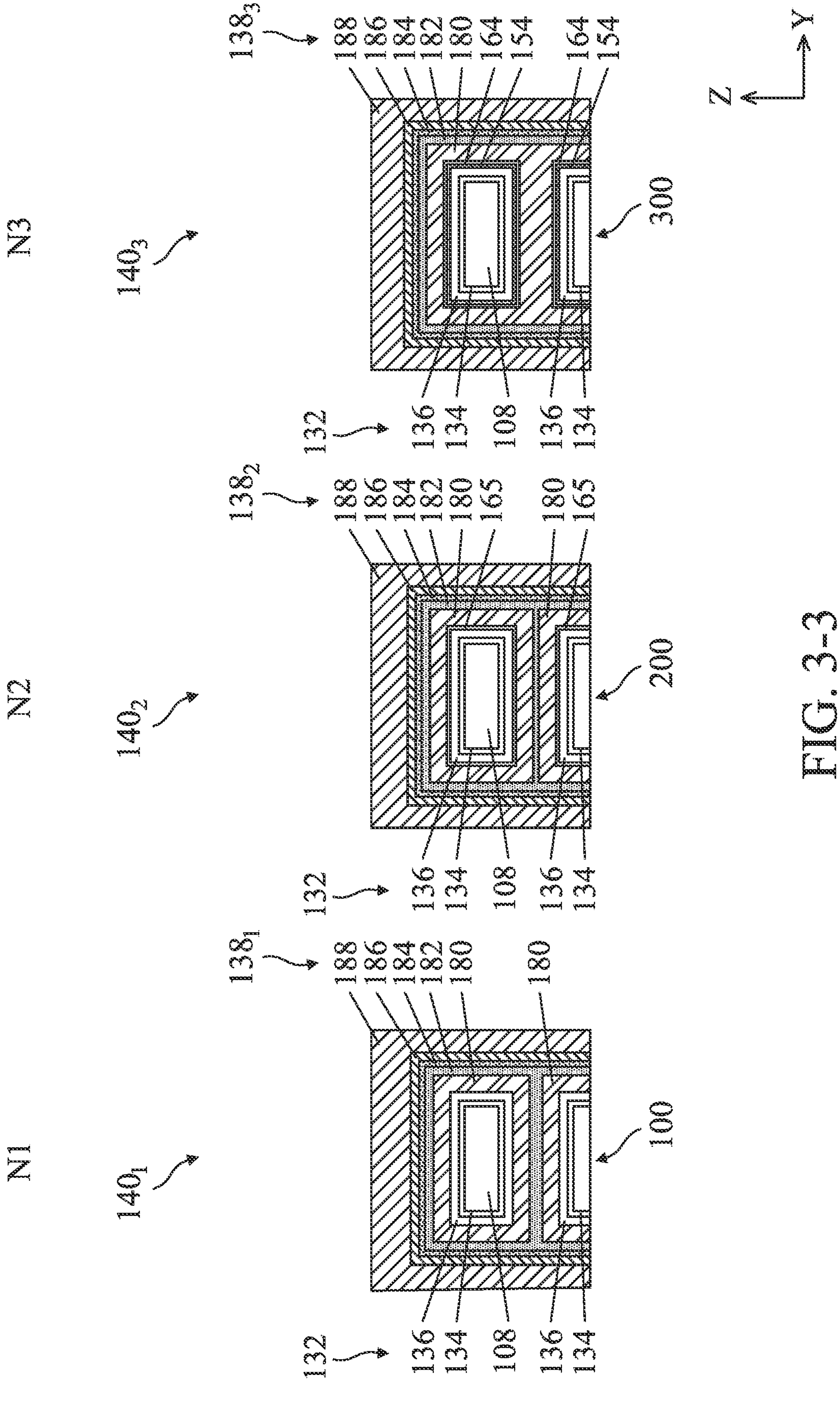

Source/drain features 122 are formed over the semiconductor structure 10, as shown in FIGS. 2F-2 and 2F-3, in accordance with some embodiments. The source/drain features 122 are formed on opposite sides of the dummy gate structure 112, in accordance with some embodiments. The source/drain features 122 are formed on the lower portion 104L of the fin structure 104 at the source/drain region, in accordance with some embodiments.

The formation of the source/drain features 122 includes first recessing the fin structure 104 to form source/drain recesses (not shown) at the source/drain regions, in accordance with some embodiments. The bottom surfaces of the source/drain recesses may extend to a position below the upper surface of the isolation structure 110. Afterward, the source/drain features 122 are grown on the lower portion 104L of the fin structure 104 from the source/drain recesses using epitaxial growth processes, in accordance with some embodiments.

In some embodiments, the source/drain features 122 are made of any suitable material for n-type semiconductor devices and p-type semiconductor devices, such as Ge, Si, GaAs, AlGaAs, SiGe, GaAsP, SiP, SiC, SiCP, or a combination thereof. In some embodiments, the source/drain features 122 are in-situ doped during the epitaxial growth process. For example, the source/drain features 122 may be the epitaxially grown SiGe doped with boron (B). For example, the source/drain features 122 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features.

FIGS. 2C-1 and 2C-2 are cross-sectional views of a semiconductor structure after the formation of an interlayer dielectric (ILD) layer, in accordance with some embodiments.

An ILD layer 124 is formed over the semiconductor structure 10, as shown in FIGS. 2C-1 and 2C-2, in accordance with some embodiments. The ILD layer 124 is formed to cover the source/drain features 122, in accordance with some embodiments. The ILD layer 124 may also cover the isolation structure 110 (not shown).

In some embodiments, the ILD layer 124 is made of a dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the formation of the ILD layer 124 includes depositing one or more dielectric material for the ILD layer 124 over the semiconductor structure 10 using such as CVD (such as HDP-CVD, PECVD, or HARP), another suitable technique, and/or a combination thereof, and planarizing the dielectric material using such as CMP until the upper surface of the dummy gate structure 112 is exposed. During the planarization process, the etching mask 118 may be also removed. In some embodiments, the upper surface of the ILD layer 124 is substantially coplanar with the upper surface of the dummy gate structure 112.

FIGS. 2D-1 and 2D-2 are cross-sectional views of a semiconductor structure after the removal of the dummy gate structure, in accordance with some embodiments.

The dummy gate structure 112 is removed using an etching process to form a gate trench 126, as shown in FIGS. 2D-1 and 2D-2, in accordance with some embodiments. The gate trench 126 exposes the upper portion 104U of the fin structure 104 and the gate spacer layer 120, in accordance with some embodiments.

In some embodiments, the etching process includes one or more etching processes. For example, when the dummy gate electrode layer 116 is made of polysilicon, a wet etchant such as a tetramethylammonium hydroxide (TMAH) solution may be used to selectively remove the dummy gate electrode layer 116. For example, the dummy gate dielectric layer 114 may be thereafter removed using a plasma dry etching, a dry chemical etching, and/or a wet etching.

FIGS. 2E-1 and 2E-2 are cross-sectional views of a semiconductor structure after the removal of the first semiconductor layers and the formation of an inner spacer layer, in accordance with some embodiments.

The first semiconductor layers 106 are removed using an etching process to form gaps 128, as shown in FIGS. 2E-1 and 2E-2, in accordance with some embodiments. The gaps 128 are formed between the neighboring second semiconductor layers 108 and between the lowermost second semiconductor layer 108 and the lower portion 104L of the fin structure 104, in accordance with some embodiments.

After the etching process, the four main surfaces of the second semiconductor layers 108 are exposed, in accordance with some embodiments. The exposed second semiconductor layers 108 form a nano structure that functions as channel layers of the resulting semiconductor device (e.g., GAA transistor), in accordance with some embodiments.

In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions.

Inner spacer layers 130 are formed in the gaps 128, as shown in FIGS. 2E-1 and 2E-2, in accordance with some embodiments. The inner spacer layers 130 are formed on the surfaces of the source/drain features 122 exposed by the gaps 128, in accordance with some embodiments. The inner spacer layers 130 are aligned below the gate spacer layer 120, in accordance with some embodiments. The inner spacer layers 130, formed between the source/drain features 122 and a subsequently formed metal gate structure, are configured to reduce the parasitic capacitance between the metal gate structure and the source/drain features (i.e. Cgs and Cgd), in accordance with some embodiments.

In some embodiments, the inner spacer layers 130 are made of a dielectric material, such as silicon oxycarbide (SiOC), silicon oxide carbonitride (SiOCN), silicon carbon nitride (SiCN), and/or a combination thereof, in accordance with some embodiments. In some embodiments, the inner spacer layers 130 are formed using a deposition process followed by an etching process. In some embodiments, the deposition process includes CVD (such as PECVD or LPCVD), ALD, another suitable technique, and/or a combination thereof. In some embodiments, the etching process includes a plasma dry etching, a dry chemical etching, and/or a wet etching.

FIGS. 2F-1 and 2F-2 are cross-sectional views of a semiconductor structure after the formation of a metal gate structure, in accordance with some embodiments.

A metal gate structure 140 is formed over the semiconductor structure 10, as shown in FIGS. 2F-1 and 2F-2, in accordance with some embodiments. The metal gate structure 140 is formed to fill the gate trench 128 and the gaps 128 (FIGS. 2E-1 and 2E-2), thereby wrapping around the nano structures of the second semiconductor layers 108, in accordance with some embodiments. The metal gate structure 140 is further formed over the upper surface of the ILD layer 124 and the gate spacer layer 120, in accordance with some embodiments.

The metal gate structure 140 interposes the source/drain features 122 and combines with the source/drain features 122 to form a FET, e.g., GAA FET, in accordance with some embodiments. The metal gate structure 140 may engage the channel region (i.e., the nano structures of the second semiconductor layers 108) of the GAA FET, such that current can flow between the source/drain regions during operation.

The metal gate structure 140 includes a gate dielectric structure 132 and the gate electrode structure 138 formed on the gate dielectric structure 132, as shown in FIGS. 2F-1 and 2F-2, in accordance with some embodiments. The gate dielectric structure 132 includes interfacial layers 134 and high-k gate dielectric layers 136 formed on the interfacial layers 134, in accordance with some embodiments. The interfacial layers 134 are formed on the exposed main surfaces of the second semiconductor layers 108 to wrap around respective second semiconductor layers 108, in accordance with some embodiments. The interfacial layers 134 are further formed on the exposed upper surface of the lower portion 104, in accordance with some embodiments. In some embodiments, the interfacial layer 134 has a thickness D1 ranging from about 5 angstrom (Å) to about 15 Å.

In some embodiments, the interfacial layers 134 are made of a chemically formed silicon oxide. In some embodiments, the interfacial layers 134 are formed using one or more cleaning processes. In some embodiments, the one or more cleaning process includes ozone ($O_3$) clean, standard clean 1 (SC1) and/or standard clean 2 (SC2). In some embodiments, the SC1 includes ammonia hydroxide-hydrogen peroxide-water mixture. In some embodiments, the SC2 includes hydrochloric acid-hydrogen peroxide-water mixture.

The high-k gate dielectric layers 136 are formed conformally along the interfacial layer 134 to around respective second semiconductor layers 108, in accordance with some embodiments. The high-k gate dielectric layers 136 are further conformally formed along the inner spacers 130 in the gaps 128, in accordance with some embodiments. The high-k gate dielectric layers 136 are further along the surface of the gate spacer layer 120 exposed by the gate trench 126, in accordance with some embodiments. The high-k gate dielectric layers 136 are further conformally formed along the respective upper surfaces of the ILD layer 124, the gate spacer layer 120 and the upper surface of the isolation structure 110, in accordance with some embodiments. In some embodiments, the high-k gate dielectric layer 136 has a thickness D2 ranging from about 10 Å to about 20 Å.

In some embodiments, the high-k gate dielectric layers 136 are made of a dielectric material with high dielectric constant (k value), for example, greater than 3.9. In some embodiments, the high-K dielectric material includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), a combination thereof, or another suitable material. The high-K gate dielectric layer 136 may be formed by ALD, PVD, CVD, and/or another suitable technique.

The gate electrode structure 138 is formed on the high-k gate dielectric layers 136, in accordance with some embodiments. The gate electrode structure 138 wraps around the second semiconductor layers 108 and fills the remainders of the gaps 128 and the gate trench 126, in accordance with some embodiments.

In some embodiments, the metal gate electrode structure 138 is made of more than one conductive material, such as a metal, metal alloy, conductive metal oxide and/or metal nitride, another suitable conductive material, and/or a combination thereof. As discussed in detail below, the metal gate electrode structure 138 may be a multi-layer structure with various combinations of a barrier layer, a work function layer with a selected work function to enhance the device performance for n-channel transistor and p-channel transistor, a capping layer, a glue layer, a metal fill layer, and/or another suitable layer.

FIGS. 2G-1 and 2G-2 are cross-sectional views of a semiconductor structure after a planarization process, in accordance with some embodiments.

A planarization process such as CMP is performed on the semiconductor structure 10 to remove the metal gate structure 140 formed over the upper surface of the ILD layer 124, as shown in FIGS. 2G-1 and 2G-2, in accordance with some embodiments. After the planarization process, the upper surface of the metal gate structure 140 is substantially coplanar with the upper surface of the ILD layer 124, in accordance with some embodiments. It is understood that the semiconductor structure 10 may undergo further CMOS processes to form various features over the semiconductor structure 10 of FIGS. 2G-1 and 2G-2, such as a multilayer interconnect structure (e.g., contacts, vias, lines, inter metal dielectric layers, passivation layers, etc.)

Although FIGS. 2G-1 and 2G-2 only show one transistor of the semiconductor structure 10, the semiconductor structure 10 may include various transistors having different threshold voltages. For example, three different threshold voltages are set for n-channel transistors and three different threshold voltages are set for p-channel transistors. These transistors may be are formed in different device regions such as a logic region, a memory region, an analog region, a peripheral region, or a combination thereof, in accordance with some embodiments.

Figures 3, 4:
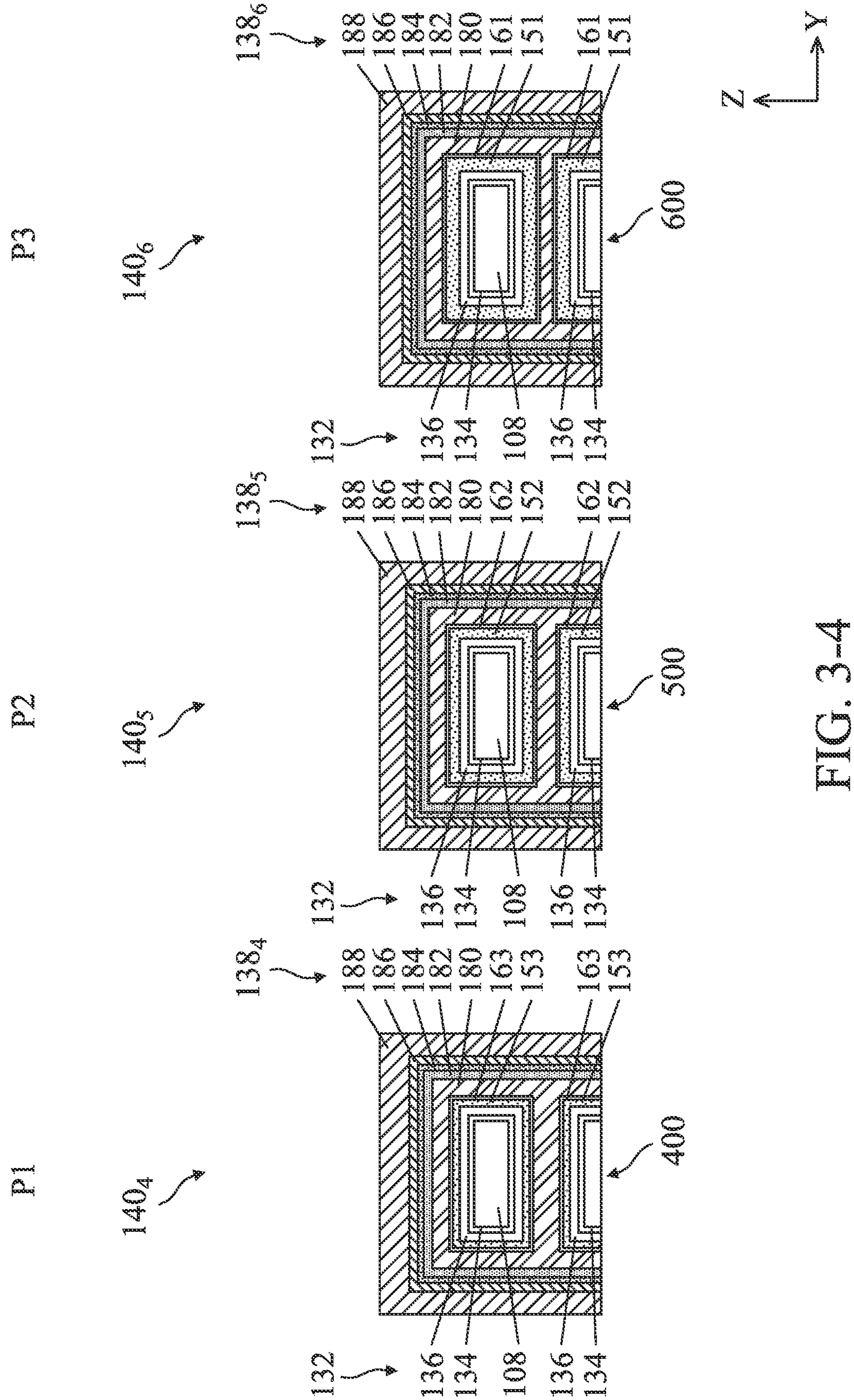

FIGS. 3-1 and 3-2 are enlarged views of area A of FIG. 2G-1 to further illustrate details of the metal gate structures of various transistors, in accordance with some embodiments; and FIGS. 3-3 and 3-4 are enlarged views of area B of FIG. 2G-2 to further illustrate details of metal gate structures of various transistors, in accordance with some embodiments.

The semiconductor structure 10 includes three n-type transistors N1, N2 and N3 (shown in FIGS. 3-1 and 3-3) and three p-type transistors P1. P2 and P3 (shown in FIGS. 3-2 and 3-4), in accordance with some embodiments. In some embodiments, the n-type transistors N1, N2 and N3 are n-channel GAA FETs having different threshold voltages. In some embodiments, the n-type transistor N1 is formed in the region 100 of the substrate 102 and has a threshold voltage Vn1 (e.g., ultra-low voltage); the n-type transistor N2 is formed in the region 200 of the substrate 102 and has a threshold voltage Vn2 (e.g., low-voltage); and the n-type transistor N3 is formed in the region 300 of the substrate 102 and has a threshold voltage Vn3 (e.g., standard voltage). Here, 0<Vn1<Vn2<Vn3.

In some embodiments, the p-type transistors P1, P2 and P3 are p-channel GAA FETs having different threshold voltages. In some embodiments, the p-type transistor P1 is formed in the region 400 of the substrate 102 and has a threshold voltage Vp1 (e.g., standard voltage); the p-type transistor P2 is formed in the region 500 of the substrate 102 and has a threshold voltage Vp2 (e.g., low-voltage); and the p-type transistor P3 is formed in the region 600 of the substrate 102 and has a threshold voltage Vp3 (e.g., ultra-low voltage). Here, Vp1<Vp2<Vp3<0. That is, the absolute value of Vp1 is greater the absolute value of Vn2 that is greater than the absolute value of Vn3.

In the region 100 of the substrate 102, a metal gate structure 1401 of the n-type transistor N1 includes a gate electrode structure $138_1$ including a work function layer 180, a first capping layer 182, a second capping layer 184, a glue layer 186, and a metal fill layer 188 subsequently formed on the high-k gate dielectric layer 136, in accordance with some embodiments. The work function layer 180 is in direct contact with the high-k gate dielectric layer 136, in accordance with some embodiments. In the region 100 of the substrate 102, separate work function layers 180 wrap around respective second semiconductor layers 108 and the work function layers 180 and the first capping layer 182 extend into the gap 128, as shown in FIG. 3-3, in accordance with some embodiments.

In the region 200 of the substrate 102, a metal gate structure 1402 of the n-type transistor N2 includes a gate electrode structure $138_2$ including a barrier layer 165, the work function layer 180, the first capping layer 182, the second capping layer 184, the glue layer 186, and the metal fill layer 188 subsequently formed on the high-k gate dielectric layer 136, in accordance with some embodiments. The barrier layer 165 interposes the high-k gate dielectric layer 136 and the work function layer 180, in accordance with some embodiments. In the region 200 of the substrate 102, separate work function layers 180 wrap around respective second semiconductor layers 108 and the first capping layer 182 extend into the gap 128, as shown in FIG. 3-3, in accordance with some embodiments.

In the region 300 of the substrate 102, a metal gate structure 1403 of the n-type transistor N3 includes a gate electrode structure $138_3$ including an inner barrier layer 154, an outer barrier layer 164, the work function layer 180, the first capping layer 182, the second capping layer 184, the glue layer 186, and the metal fill layer 188 subsequently formed on the high-k gate dielectric layer 136, in accordance with some embodiments. The barrier layers 154 and 164 interpose the high-k gate dielectric layer 136 and the work function layer 180, in accordance with some embodiments. In the region 300 of the substrate 102, adjacent work function layers 180 merge to form a continuous work function layer 180 to overfill the gap 128, as shown in FIG. 3-3, in accordance with some embodiments.

In the region 400 of the substrate 102, a metal gate structure 1404 of the p-type transistor P1 includes a gate electrode structure $138_4$ including an inner barrier layer 153, an outer barrier layer 163, the work function layer 180, the first capping layer 182, the second capping layer 184, the glue layer 186, and the metal fill layer 188 subsequently formed on the high-k gate dielectric layer 136, in accordance with some embodiments. The barrier layers 153 and 163 interpose the high-k gate dielectric layer 136 and the work function layer 180, in accordance with some embodiments. In the region 400 of the substrate 102, adjacent work function layers 180 merge to form a continuous work function layer 180 to overfill the gap 128, as shown in FIG. 3-4, in accordance with some embodiments.

In the region 500 of the substrate 102, a metal gate structure 1405 of the p-type transistor P2 includes a gate electrode structure $138_5$ including an inner barrier layer 152, an outer barrier layer 162, the work function layer 180, the first capping layer 182, the second capping layer 184, the glue layer 186, and the metal fill layer 188 subsequently formed on the high-k gate dielectric layer 136, in accordance with some embodiments. The barrier layers 152 and 162 interpose the high-k gate dielectric layer 136 and the work function layer 180, in accordance with some embodiments. In the region 500 of the substrate 102, adjacent work function layers 180 merge to form a continuous work function layer 180 to overfill the gap 128, as shown in FIG. 3-4, in accordance with some embodiments.

In the region 600 of the substrate 102, a metal gate structure 1406 of the p-type transistor P3 includes a gate electrode structure $138_6$ including an inner barrier layer 151, an outer barrier layer 161, the work function layer 180, the first capping layer 182, the second capping layer 184, the glue layer 186, and the metal fill layer 188 subsequently formed on the high-k gate dielectric layer 136, in accordance with some embodiments. The barrier layers 151 and 161 interpose the high-k gate dielectric layer 136 and the work function layer 180, in accordance with some embodiments. In the region 600 of the substrate 102, adjacent work function layers 180 merge to form a continuous work function layer 180 to overfill the gap 128, as shown in FIG. 3-4, in accordance with some embodiments.

The inner barrier layers 151, 152, 153 and 154 are made of a metal nitride, e.g., TaN, TiN, WCN, another suitable barrier material, and/or a combination thereof, in accordance with some embodiments. The outer barrier layers 161, 162, 163, 164 and 165 are a metal oxide or a metal oxynitride, e.g., $Ta_2O_5$, TaON, $TiO_2$, TiON, $W_2O_5$, WOCN, another suitable oxide, and/or a combination thereof, in accordance with some embodiments. In some embodiments, the outer barrier layer is formed by oxidizing at least a portion of the inner barrier layer. This will be discussed in detail below.

In some embodiments, the work function layer 180 is made of an n-type work function metal such as TiAlC, TaAlN, TiAlN, another suitable n-type work function metal, and/or a combination thereof. In some embodiments, the capping layers 182 and 184 are configured to prevent oxidation of the work function metal of the work function layer (e.g., Al atom). In some embodiments, the first capping layer 182 is made of TiN. In some embodiments, the second capping layer 182 is made of Al, $Al_2O_3$, Si, $SiO_2$, or a combination thereof. In some embodiments, the glue layer 186 is configured to provide a better adhesion of the metal fill layer 188 to the underlying layers (e.g., the capping layers 182 and 184, the work function layer 180, etc.). In some embodiments, the glue layer 186 is made of TiN. In some embodiments, the metal fill layer 188 is made of W, Ru, Al, Cu, Co, another suitable conductive material with low resistance, and/or a combination thereof.

The barrier layers (including inner barrier layers and the outer barrier layer) formed between the high-k gate dielectric layer 136 and the work function layer 180 may reduce the influence from the work function metal of the work function layer 180 (e.g., Al) on the energy band of the conductive carrier flowing through the channel region. As such, the threshold voltage of a transistor may be adjusted by adjusting the thickness of the barrier layer.

For example, in the region 100 of the substrate 100, the gate electrode structure $138_1$ of the n-type transistor N1 may have no barrier layer formed between the gate dielectric structure 132 and the work function layer 180.

For example, in the region 200 of the substrate 100, the barrier layer 165 of the gate electrode structure $138_2$ of the n-type transistor N2 may have a thickness D3 in a range from about 3.6 Å to about 4.4 Å.

For example, in the region 300 of the substrate 100, the barrier layers 154 and 164 of the gate electrode structure $138_3$ of the n-type transistor N3 may have a total thickness D4 in a range from about 7.2 Å to about 8.8 Å.

For example, in the region 400 of the substrate 100, the barrier layers 153 and 163 of the gate electrode structure $138_4$ of the p-type transistor P1 may have a total thickness D5 in a range from about 10.8 Å to about 13.2 Å.

For example, in the region 500 of the substrate 100, the barrier layers 152 and 162 of the gate electrode structure $138_5$ of the p-type transistor P2 may have a total thickness D6 in a range from about 14.4 Å to about 17.6 Å.

For example, in the region 600 of the substrate 100, the barrier layers 151 and 161 of the gate electrode structure $138_6$ of the p-type transistor P3 may have a total thickness D7 in a range from about 18.0 Å to about 22.0 Å.

Here, $D3<D4<D5<D6<D7$, in accordance with some embodiments. In some embodiments, a ratio of the thickness D6 to thickness D7 ranges from about 0.7 to about 0.9; a ratio of the thickness D5 to thickness D7 ranges from about 0.5 to about 0.7; a ratio of the thickness D4 to thickness D7 ranges from about 0.35 to about 0.45; a ratio of the thickness D3 to thickness D7 ranges from about 0.15 to about 0.25. If the ratio is outside the above range, the work function of a transistor may exceed the tolerance of its expected value.

In the embodiments of the present disclosure, by forming the respective barrier layers having different thicknesses for various GAA FETs N1, N2, N3, P1, P2 and P3 (where thickness is zero for the transistor N1), the GAA FETs having different threshold voltages formed in a semiconductor structure 10 may be realized FIGS. 4A-1 through 4O-2 are cross-sectional views illustrating the formation of the metal gate structures of FIGS. 3-1 and 3-2 at various intermediate stages, in accordance with some embodiments of the disclosure. In FIGS. 4A-1 through 4O-2, the figures ending with "-1" designation illustrate cross-sectional views of various n-type transistor corresponding to FIG. 3-1 and the figures ending with "-2" designation illustrate cross-sectional views of various p-type transistor corresponding to FIG. 3-2.

Figures 1, 4A:
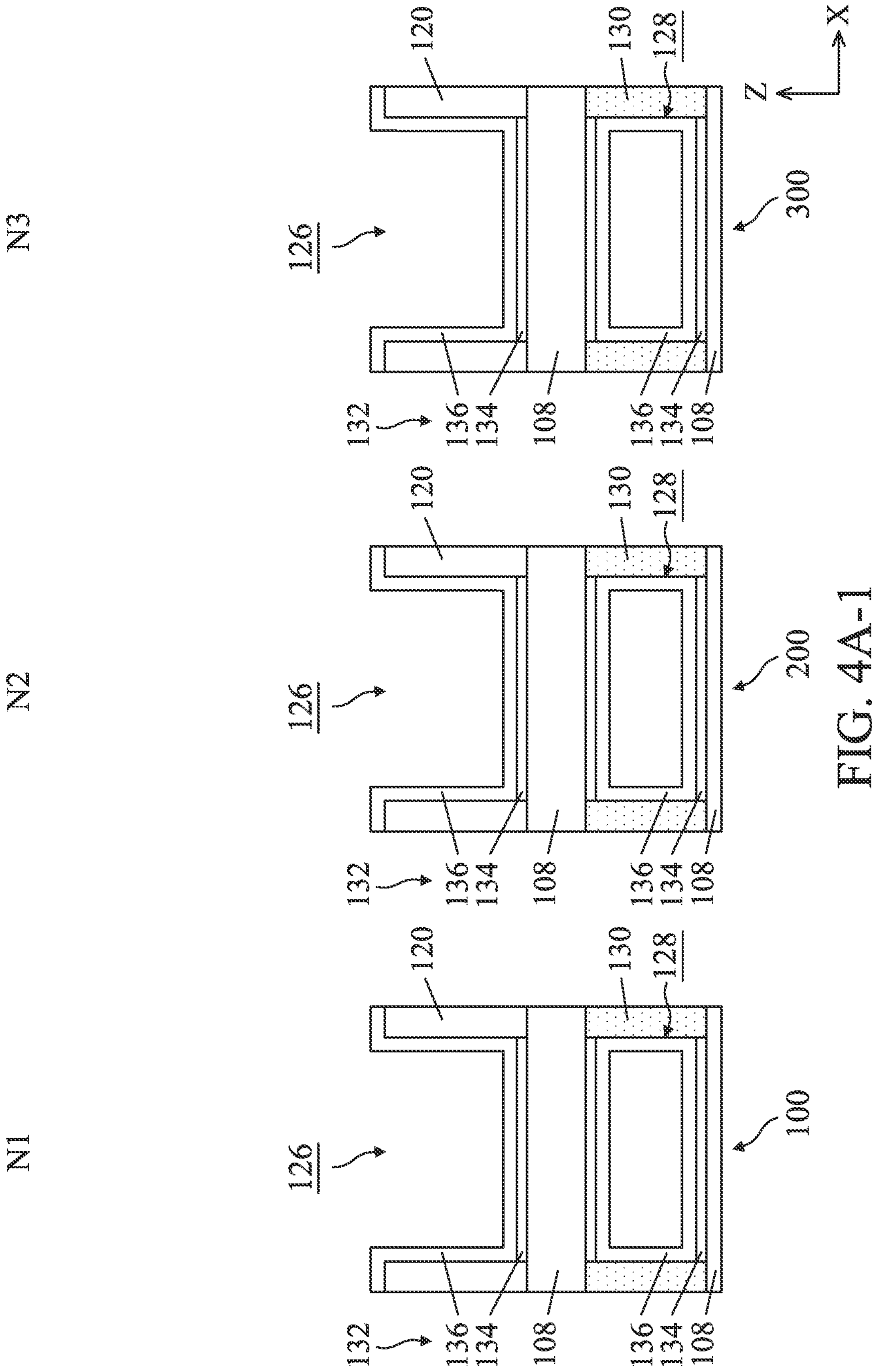
Figures 2, 4A:
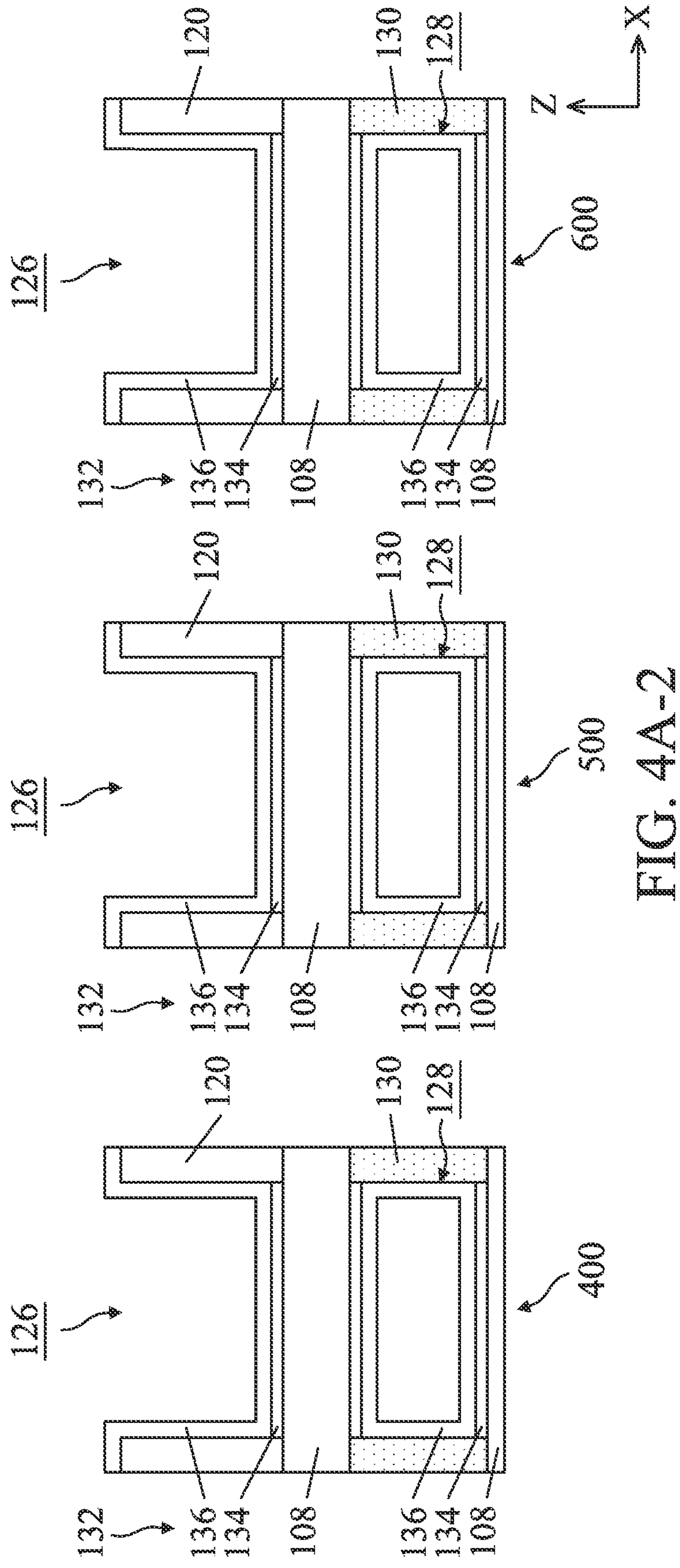

FIGS. 4A-1 and 4A-2 are cross-sectional views illustrating some portions of a semiconductor structure after the formation of a gate dielectric structure, in accordance with some embodiments.

An interfacial layer 134 is formed on the exposed main surfaces of the second semiconductor layer 108 to wrap around the second semiconductor layers 108, in accordance with some embodiments. A high-k gate dielectric layer 136 is formed conformally along the interfacial layer 134, the inner spacers 130, and the gate spacer layer 120, in accordance with some embodiments. The interfacial layers 134 and the high-k gate dielectric layer 136 combine to form a gate dielectric structure 132, in accordance with some embodiments.

Figures 1, 4B:
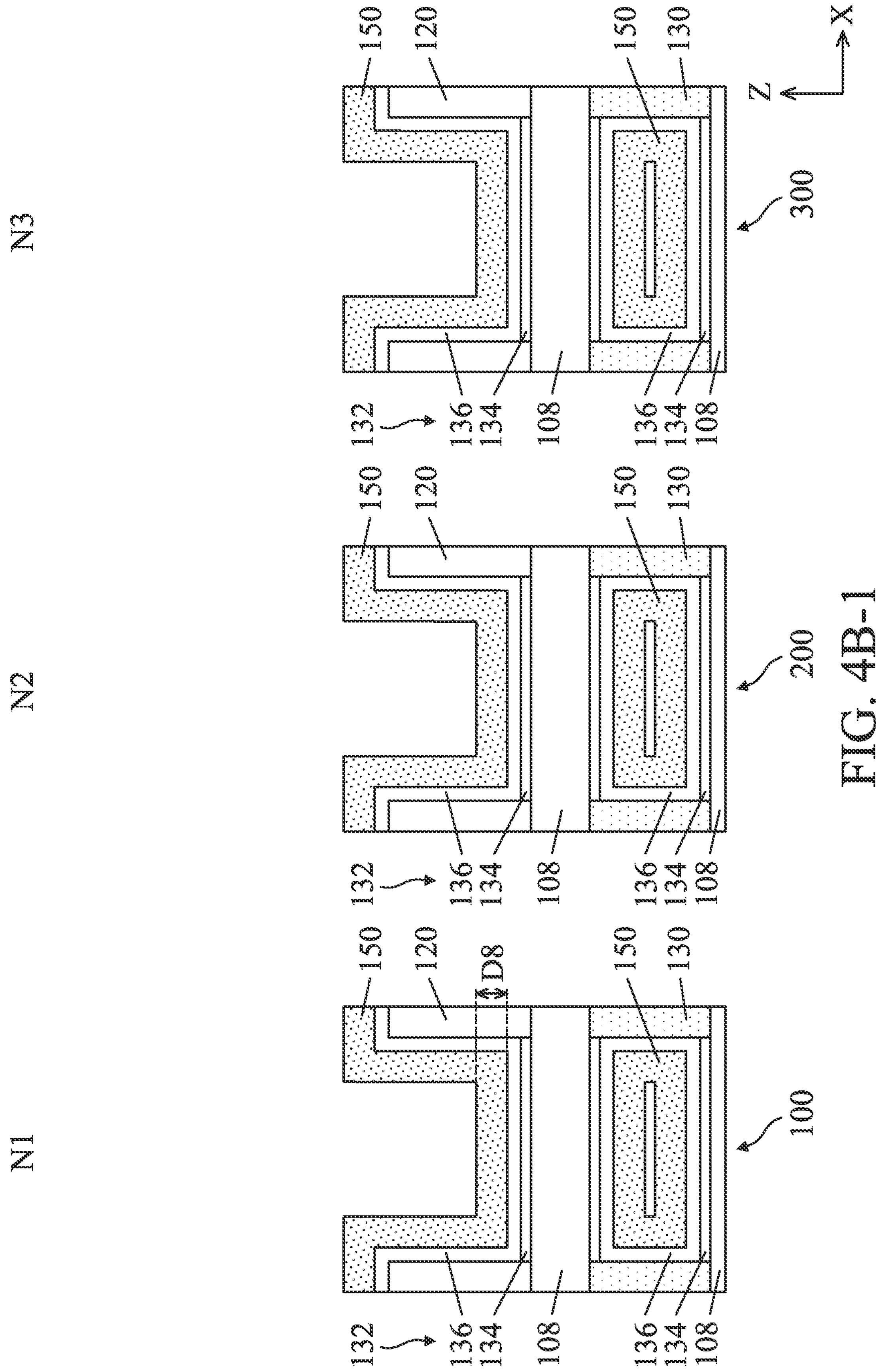
Figures 2, 4B:
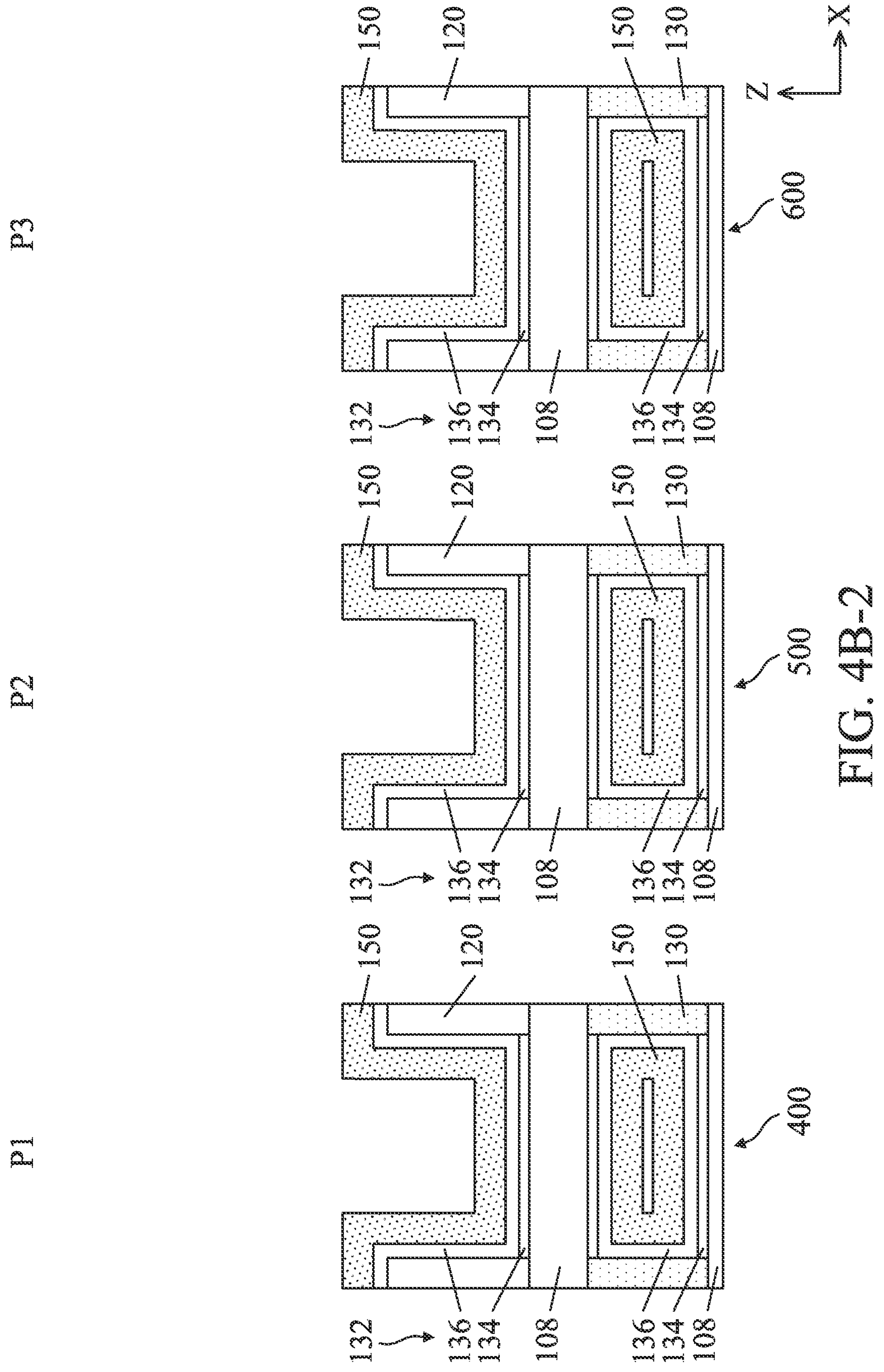

FIGS. 4B-1 and 4B-2 are cross-sectional views illustrating some portions of a semiconductor structure after the deposition of a barrier material, in accordance with some embodiments.

A barrier material 150 is formed over the semiconductor structure of FIGS. 4A-1 and 4A-2 at the regions 100, 200, 300, 400, 500 and 600, in accordance with some embodiments. The barrier material 150 is formed on the high-k gate dielectric layer 136 and partially filled into the gap 128 and the gate trench 126, in accordance with some embodiments.

In some embodiments, the barrier material 150 is metal nitride, e.g., TaN, TiN, WCN, another suitable barrier material, and/or a combination thereof. The barrier material 150 is deposited using ALD, CVD, PVD, another suitable technique, and/or a combination thereof. In some embodiments, the barrier material 150 is TaN using ALD, which uses pentakis-dimethylamino tantalum (PDMAT) and $NH_3$ as precursors and is performed at a temperature of about 225° C. to about 325° C., and a pressure of about 2 Torr to about 5 Torr for about 40 cycles. In some embodiments, the barrier material 150 has a thickness D8 ranging from about 18.0 Å to about 22.0 Å.

Figures 1, 4C:
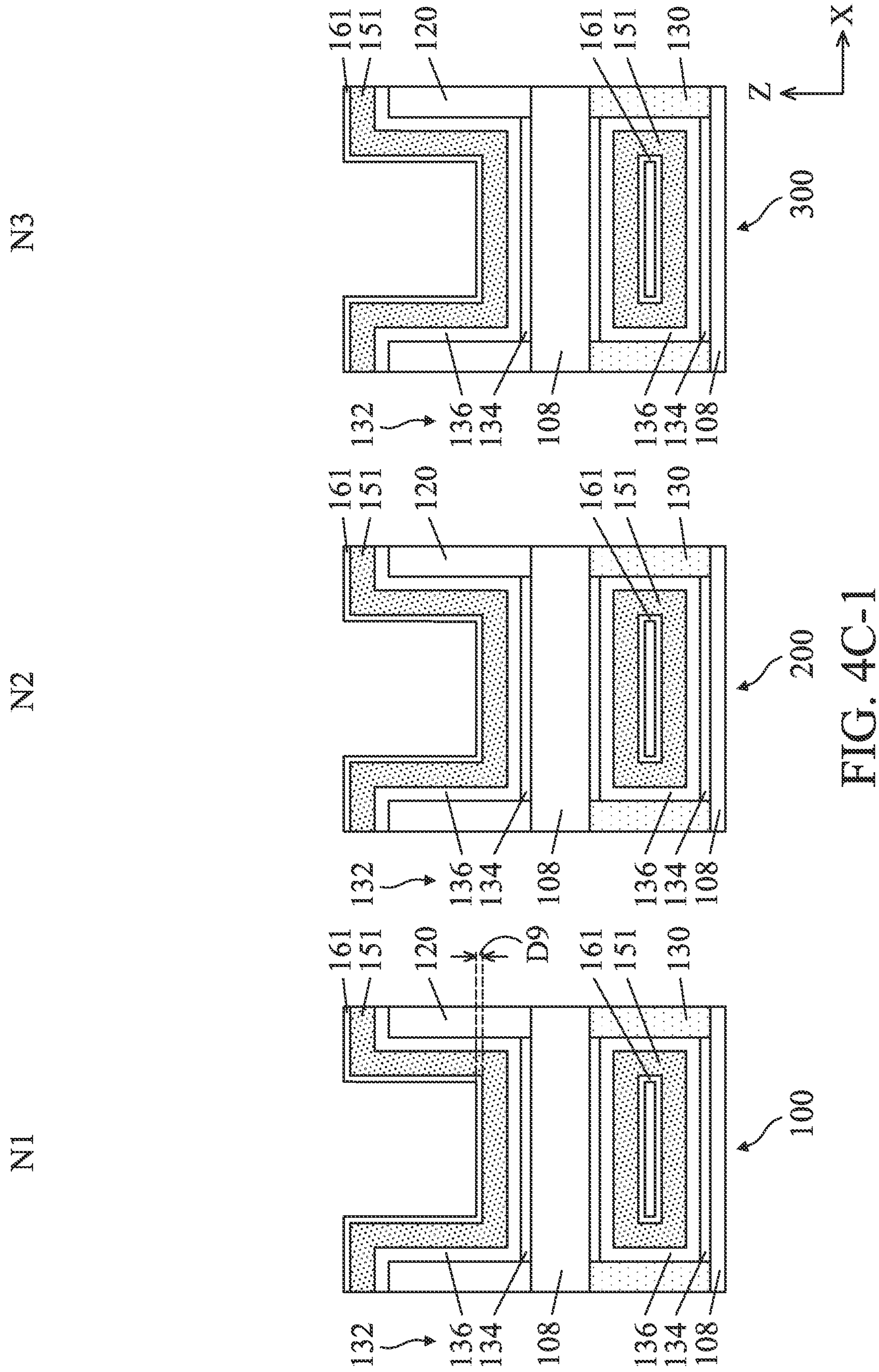
Figures 2, 4C:
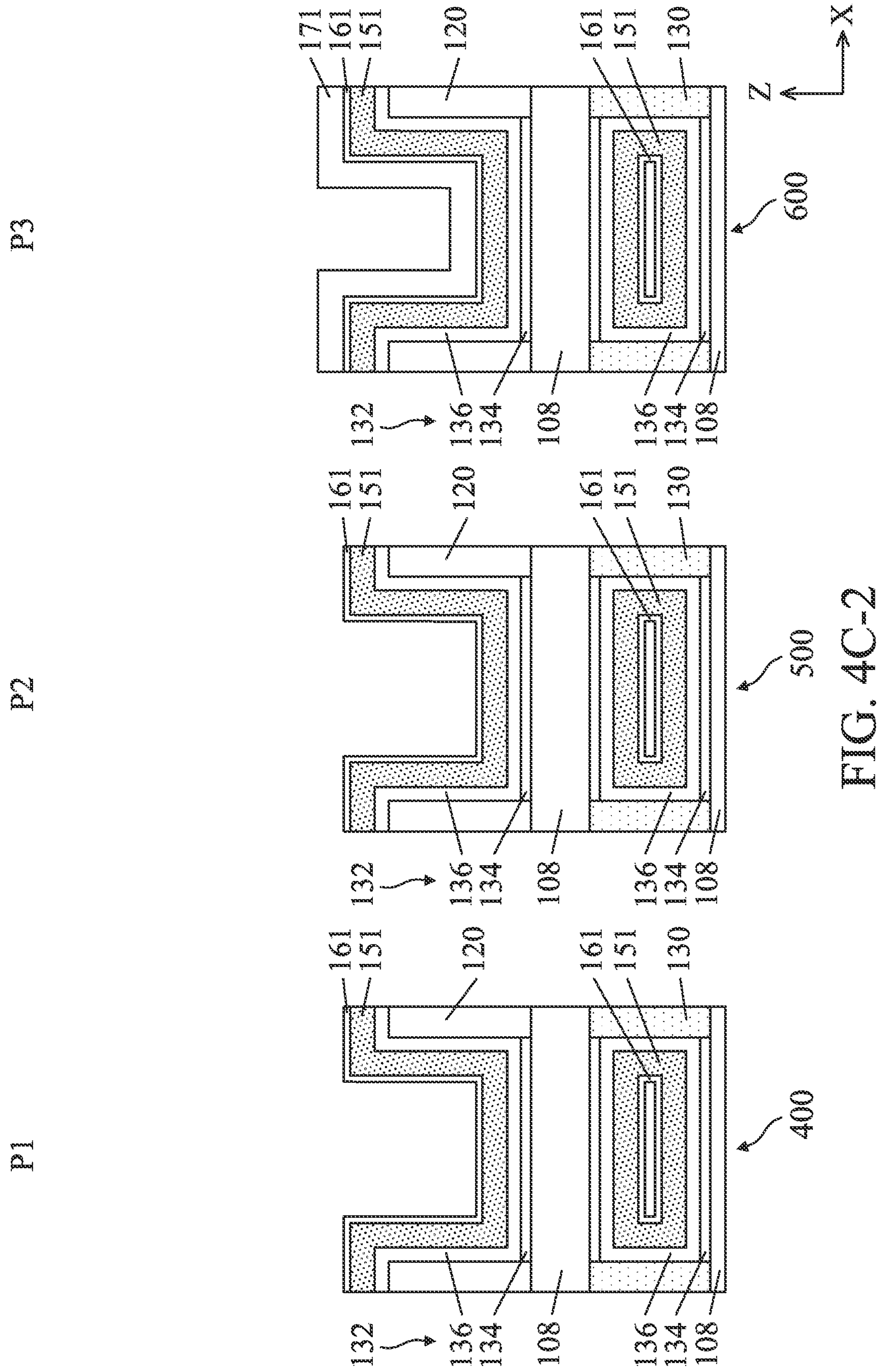

FIGS. 4C-1 and 4C-2 are cross-sectional views illustrating some portions of a semiconductor structure after the formation of a mask element, in accordance with some embodiments.

After the deposition process of the barrier material 150, an outer portion of the barrier material 150 (i.e., surface portion exposed to the ambient) is oxidized to form a native oxide layer 161 (also referred to as barrier oxide) at the regions 100, 200, 300, 400, 500, and 600 of the substrate due to being exposed to an ambient containing $O_2$ or $H_2O$, as shown in FIGS. 4C-1 and 4C-2, in accordance with some embodiments. The remaining portion (i.e., the inner portion) of the barrier material 150 remains unoxidized and is denoted as a barrier material 151.

In some embodiments, the barrier oxide 161 is a metal oxide or a metal oxynitride based on the chosen barrier material 150, e.g., $Ta_2O_5$, TaON, $TiO_2$, TiON, $W_2O_5$, WOCN, another suitable oxide, and/or a combination thereof, in accordance with some embodiments. In some embodiments, the thickness D9 of the barrier oxide 161 is in a range from about 3.6 Å to about 4.4 Å. In some embodiments, the thickness of the barrier material 151 is in a range from about 14.4 Å to about 17.6 Å.

Afterward, a mask element 171 is formed over the region 600 of the substrate, in accordance with some embodiments. In some embodiments, the mask element 171 is made of a material having a different etching selectivity from the barrier oxide 161, in accordance with some embodiments. In some embodiments where the barrier oxide 161 is $Ta_2O_5$ or TaON, the mask element 171 is made of TiN. In some embodiments, the thickness of the mask element 171 is in a range from about 15.0 Å to about 30.0 Å.

In some embodiments, the formation of the mask element 171 includes forming a mask layer over the substrate, and patterning the mask layer. In some embodiments, the mask layer is TiN using ALD, which uses TiC14 and $NH_3$ as precursors and is performed at a temperature of about 400° C. to about 450° C. for about 40 cycles to about 80 cycles. For example, a photoresist may be formed on the mask layer at the region 600 of the substrate, such as by using spin-on coating, and patterned with a pattern corresponding to the mask element 171 by exposing the photoresist to light using an appropriate photomask. Exposed or unexposed portions of the photo resist may be removed depending on whether a positive or negative resist is used. The pattern of the photoresist may then be transferred to the mask layer, such as by using one or more suitable etch processes. The photoresist can be removed in an ashing or wet strip process, for example.

Figures 1, 4D:
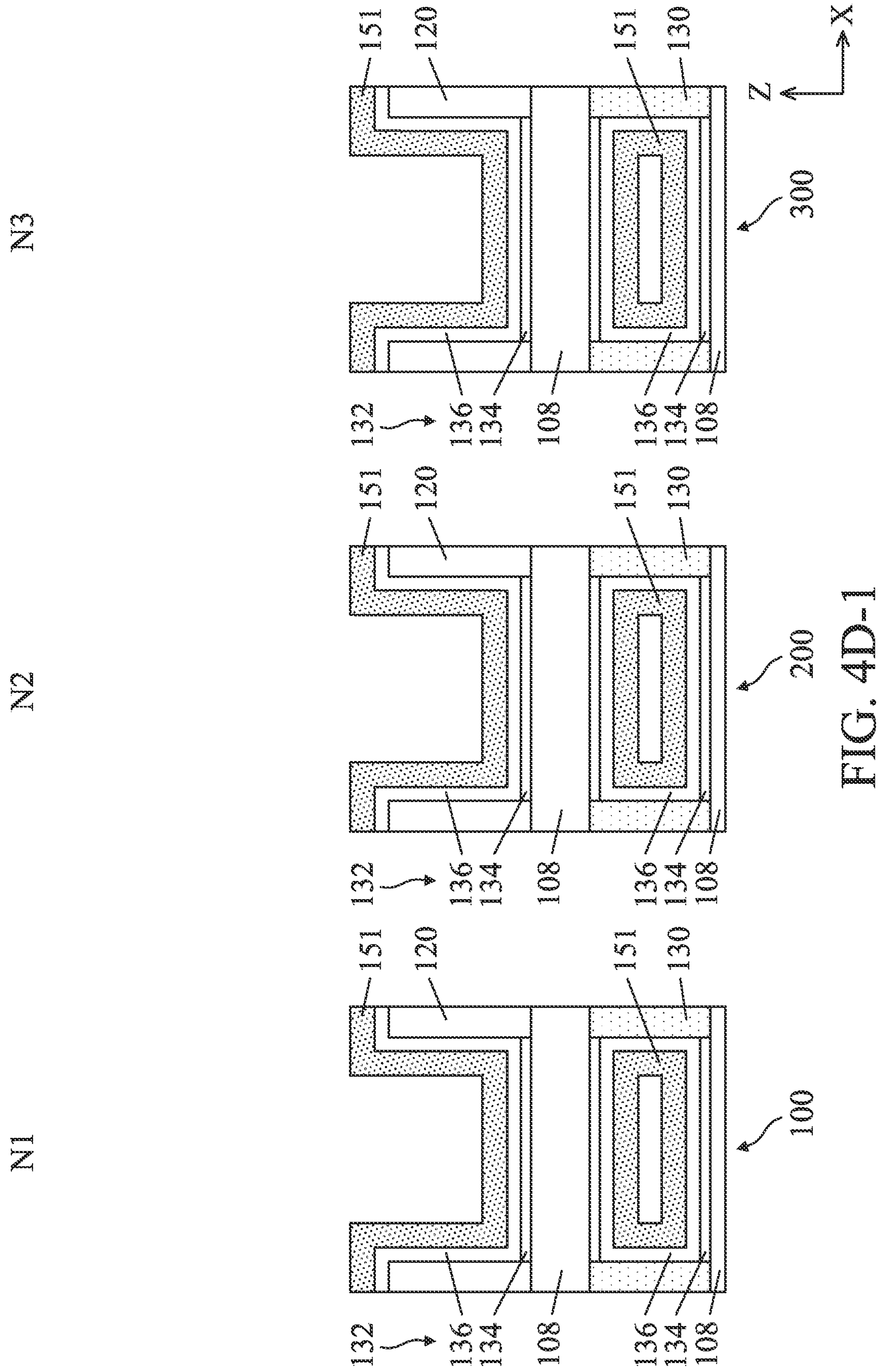
Figures 2, 4D:
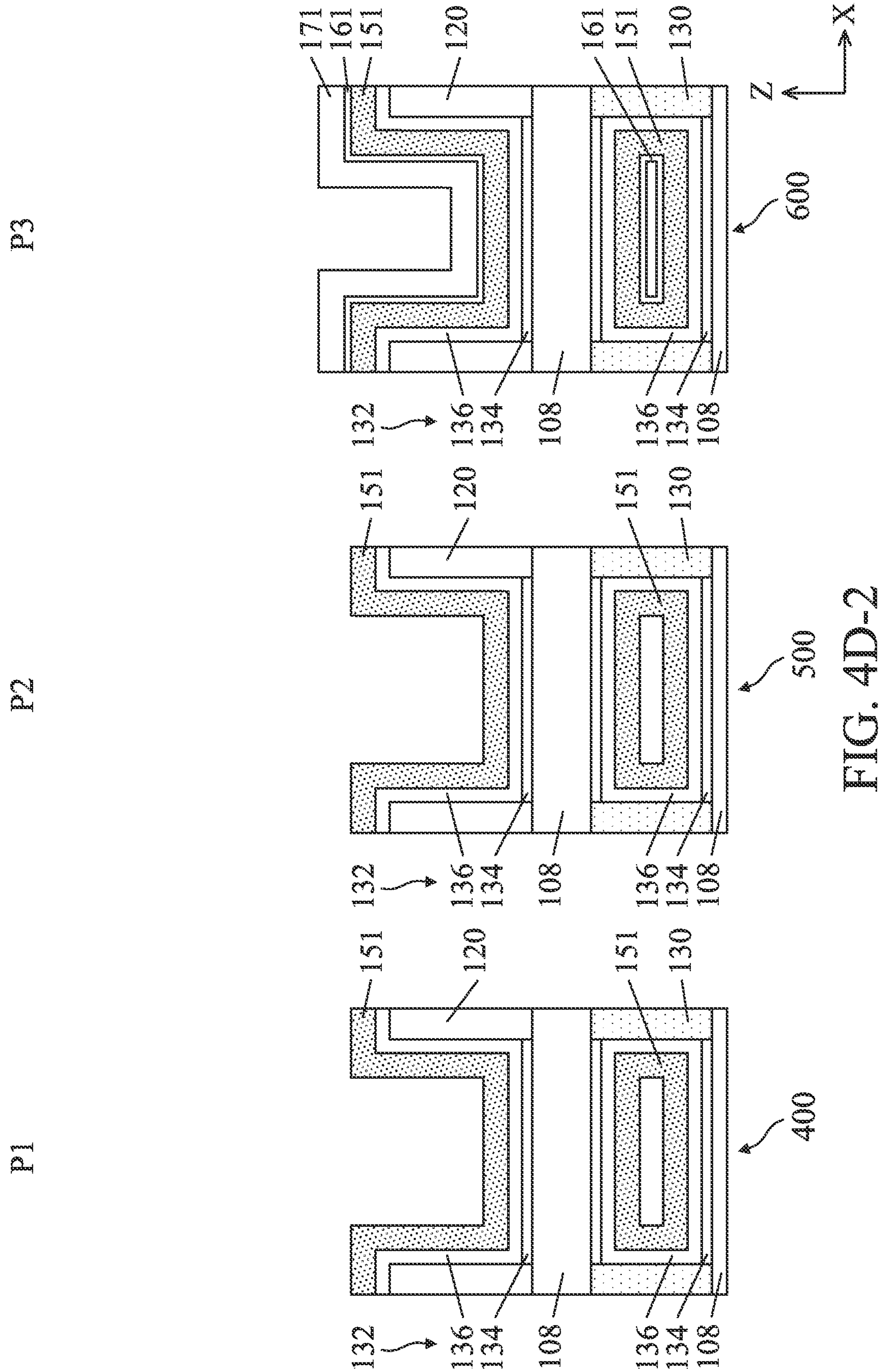

FIGS. 4D-1 and 4D-2 are cross-sectional views illustrating some portions of a semiconductor structure after an etching process, in accordance with some embodiments.

An etching process is performed on the semiconductor structure of FIGS. 4C-1 and 4C-2 to remove the barrier oxide 161 at the regions 100, 200, 300, 400 and 500 of the substrate, as shown in FIGS. 4D-1 and 4D-2, in accordance with some embodiments. The mask element 171 protects the barrier oxide 161 at the region 600 from being removed, in accordance with some embodiments. The etching process is performed until the barrier material 151 is exposed, in accordance with some embodiments.

In some embodiments, the etching process uses $TaCl_5$, $WCl_5$, another suitable etchant, and/or a combination thereof as etchant and is performed at a temperature of about 400° C. to about 550° C., and a pressure ranging from about 5 Torr to about 30 Torr. Because the barrier material 151 has a different etching selectively from the barrier oxide 161, the barrier material 151 may be used as an etching stop layer in the etching process. As such, the etching process is a self-limiting etching process.

Afterward, the mask element 171 may be removed by a clean process using for example standard clean 1 (SC1). For example, SC1 may include ammonia hydroxide-hydrogen peroxide-water mixture.

Figures 1, 4E:
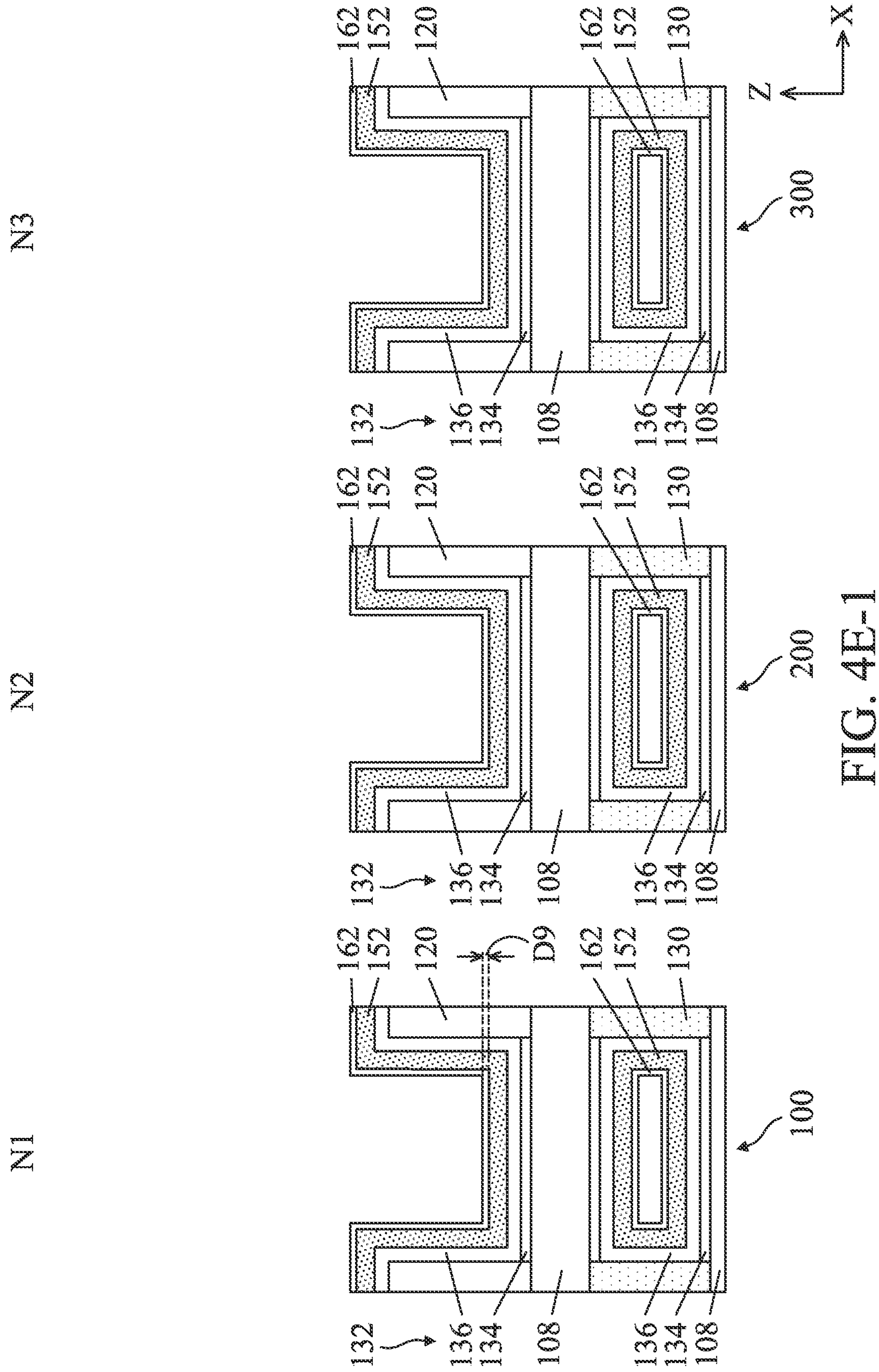
Figures 2, 4E:
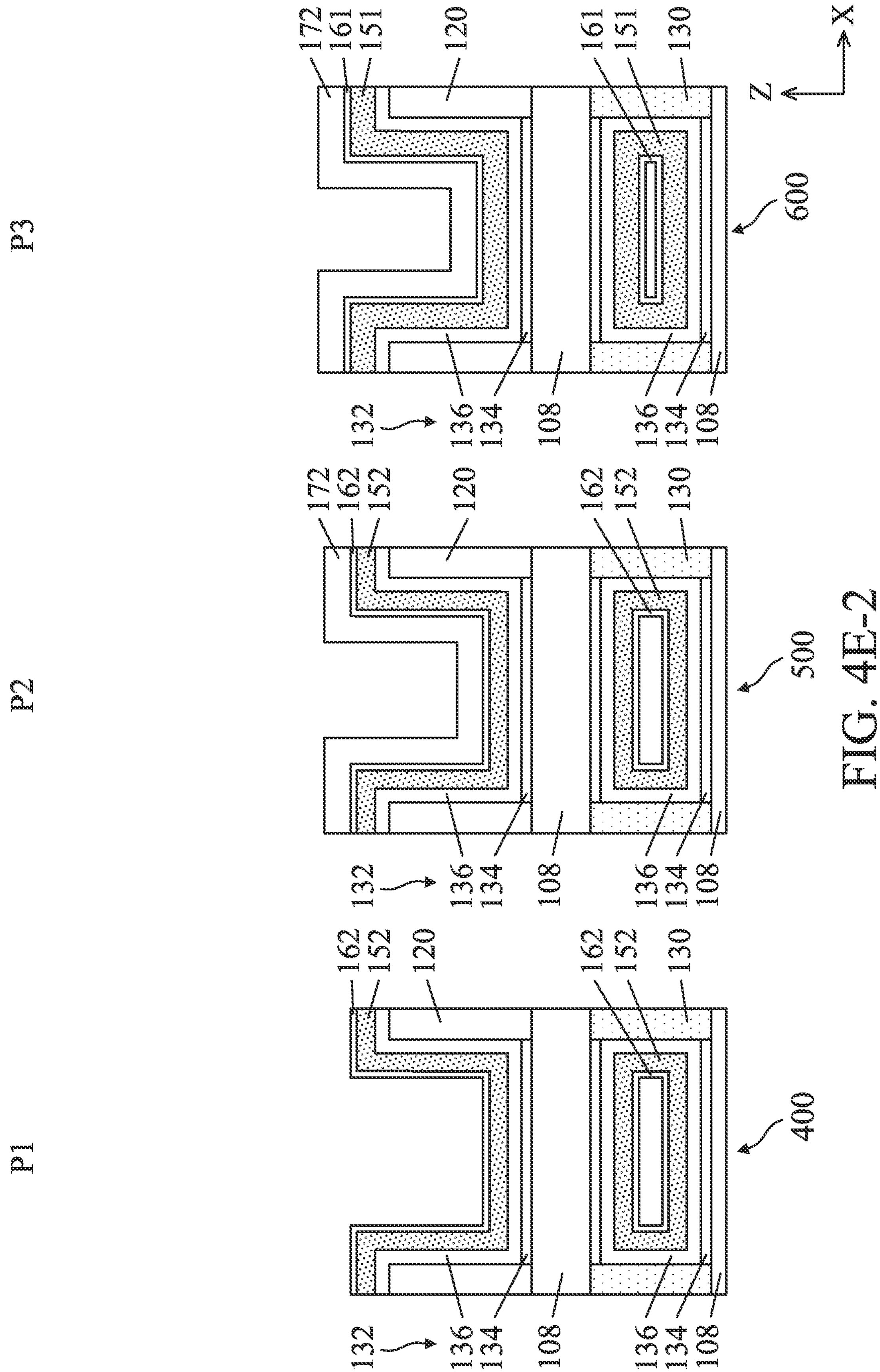

FIGS. 4E-1 and 4E-2 are cross-sectional views illustrating some portions of a semiconductor structure after the formation of a mask element, in accordance with some embodiments.

After the etching process for removing the barrier oxide 161, an outer portion of the exposed barrier material 151 (i.e., surface portion exposed to the ambient) is oxidized to form a native oxide layer 162 (also referred to as barrier oxide) at the regions 100, 200, 300, 400 and 500 of the substrate due to being exposed to an ambient containing $O_2$ or $H_2O$, as shown in FIGS. 4E-1 and 4E-2, in accordance with some embodiments. The remaining portion (i.e., the inner portion) of the barrier material 151 remains unoxidized and is denoted as a barrier material 152.

In some embodiments, the barrier oxide 162 is a metal oxide or a metal oxynitride based on the chosen barrier material 150, e.g., $Ta_2O_5$, TaON, $TiO_2$, TiON, $W_2O_5$, WOCN, another suitable oxide, and/or a combination thereof, in accordance with some embodiments. In some embodiments, the thickness D9 of the barrier oxide 162 is in a range from about 3.6 Å to about 4.4 Å. In some embodiments, the thickness of the barrier material 152 is in a range from about 10.8 Å to about 13.2 Å.

Afterward, a mask element 172 is formed over the regions 500 and 600 of the substrate, in accordance with some embodiments. In some embodiments, the material and formation method of the mask element 172 is similar to or the same as the mask element 171.

Figures 1, 4F:
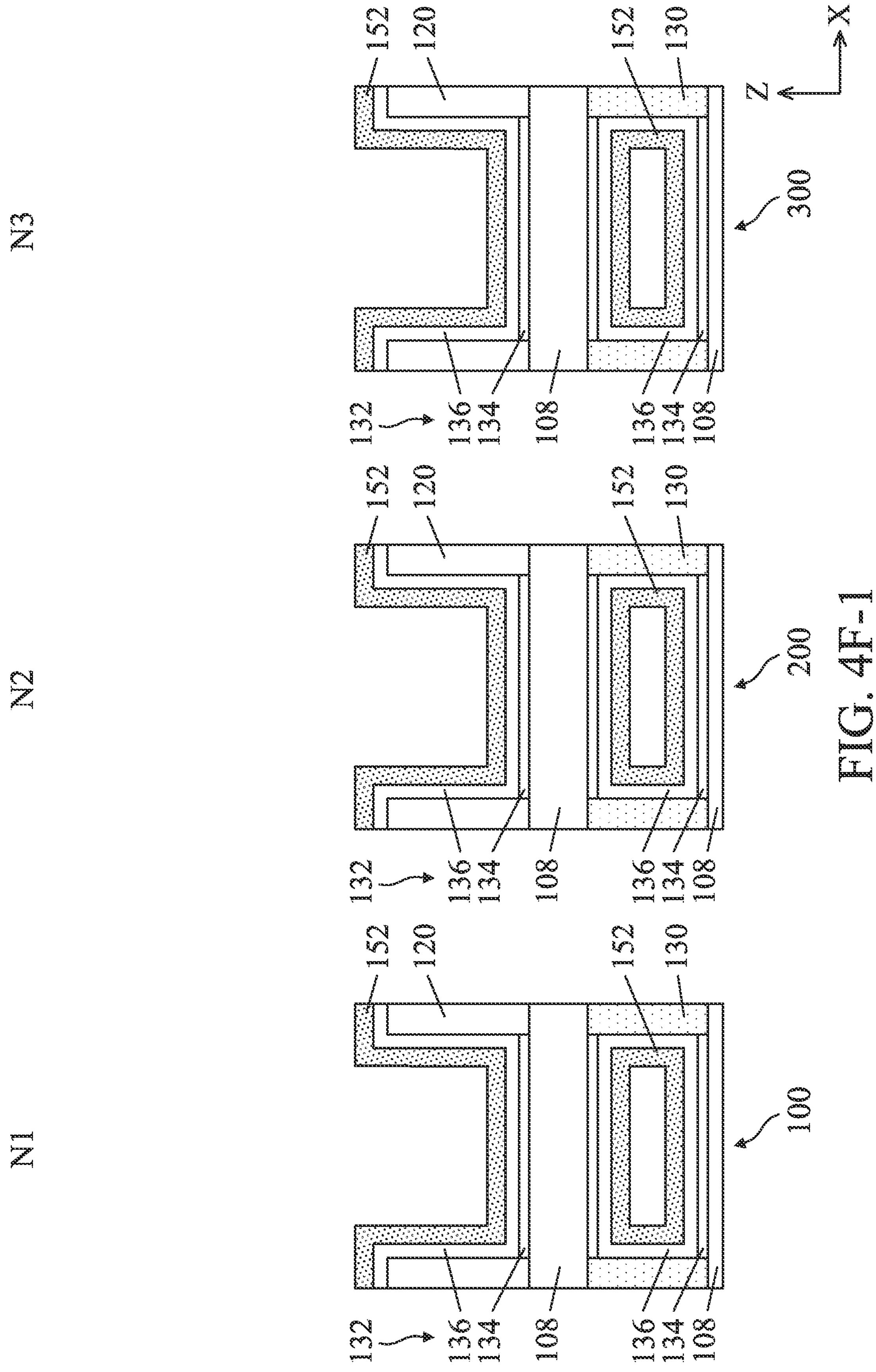
Figures 2, 4F:
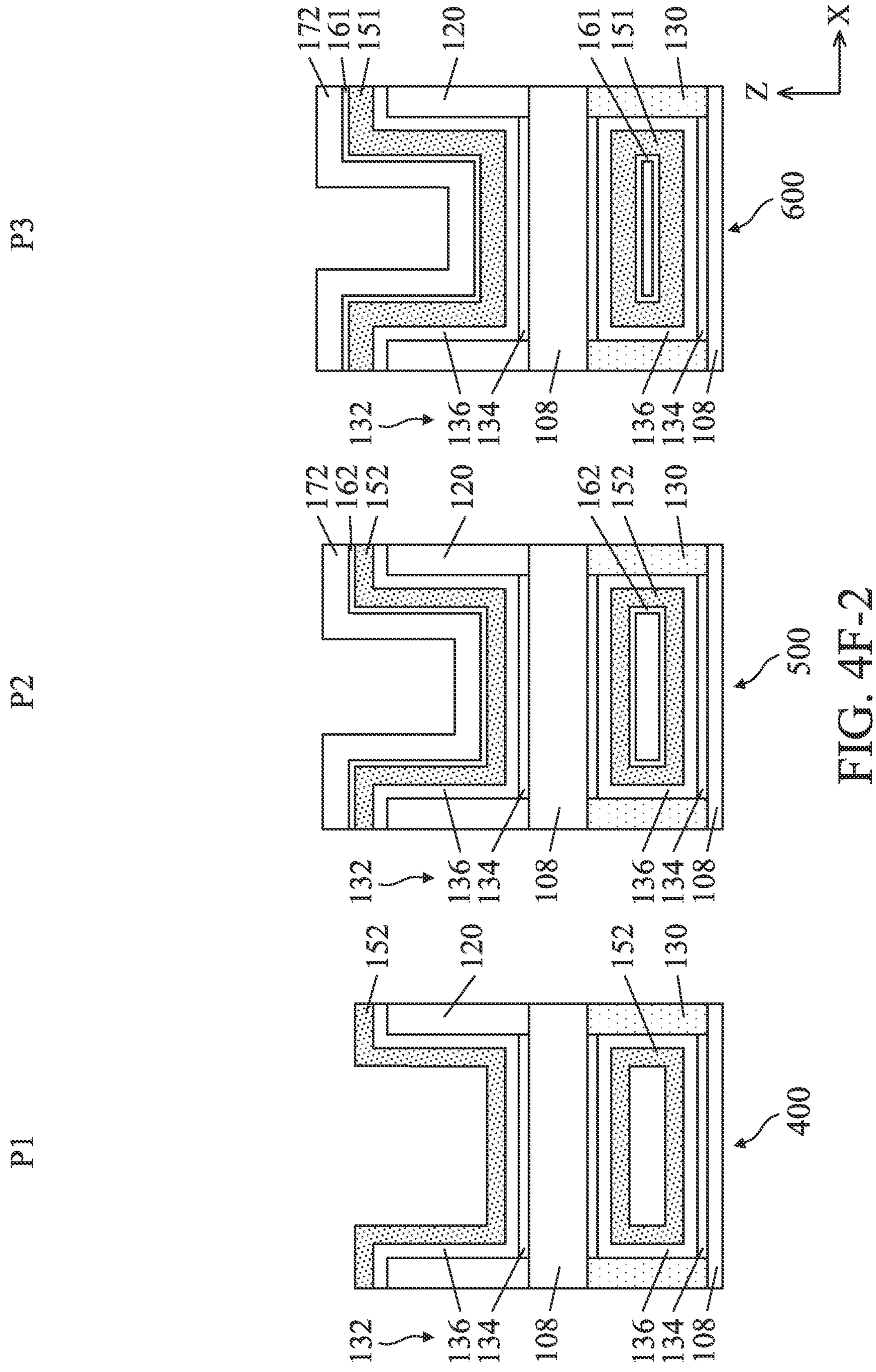

FIGS. 4F-1 and 4F-2 are cross-sectional views illustrating some portions of a semiconductor structure after an etching process, in accordance with some embodiments.

An etching process is performed on the semiconductor structure of FIGS. 4E-1 and 4E-2 to remove the barrier oxide 162 at the regions 100, 200, 300 and 400 of the substrate, as shown in FIGS. 4F-1 and 4F-2, in accordance with some embodiments. The mask element 172 protects the barrier oxides 161 and 162 at the regions 600 and 500 from being removed, in accordance with some embodiments. The etching process is performed until the barrier material 152 is exposed, in accordance with some embodiments. The etching process may be similar to or the same as that described previously with respect to FIGS. 4D-1 and 4D-2. Afterward, the mask element 172 may be removed by a clean process using for example standard clean 1 (SC1).

Figures 1, 4G:
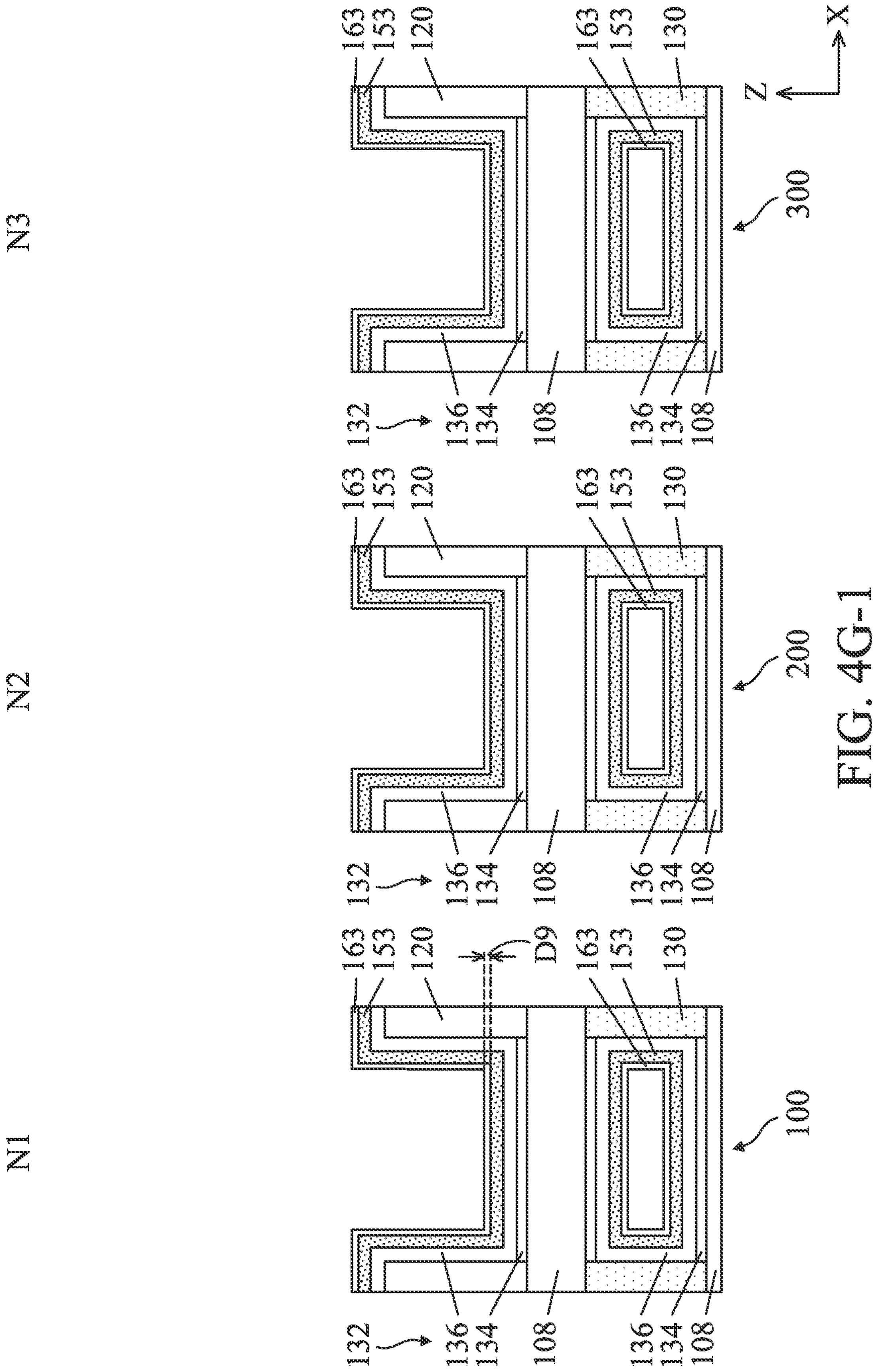
Figures 2, 4G:
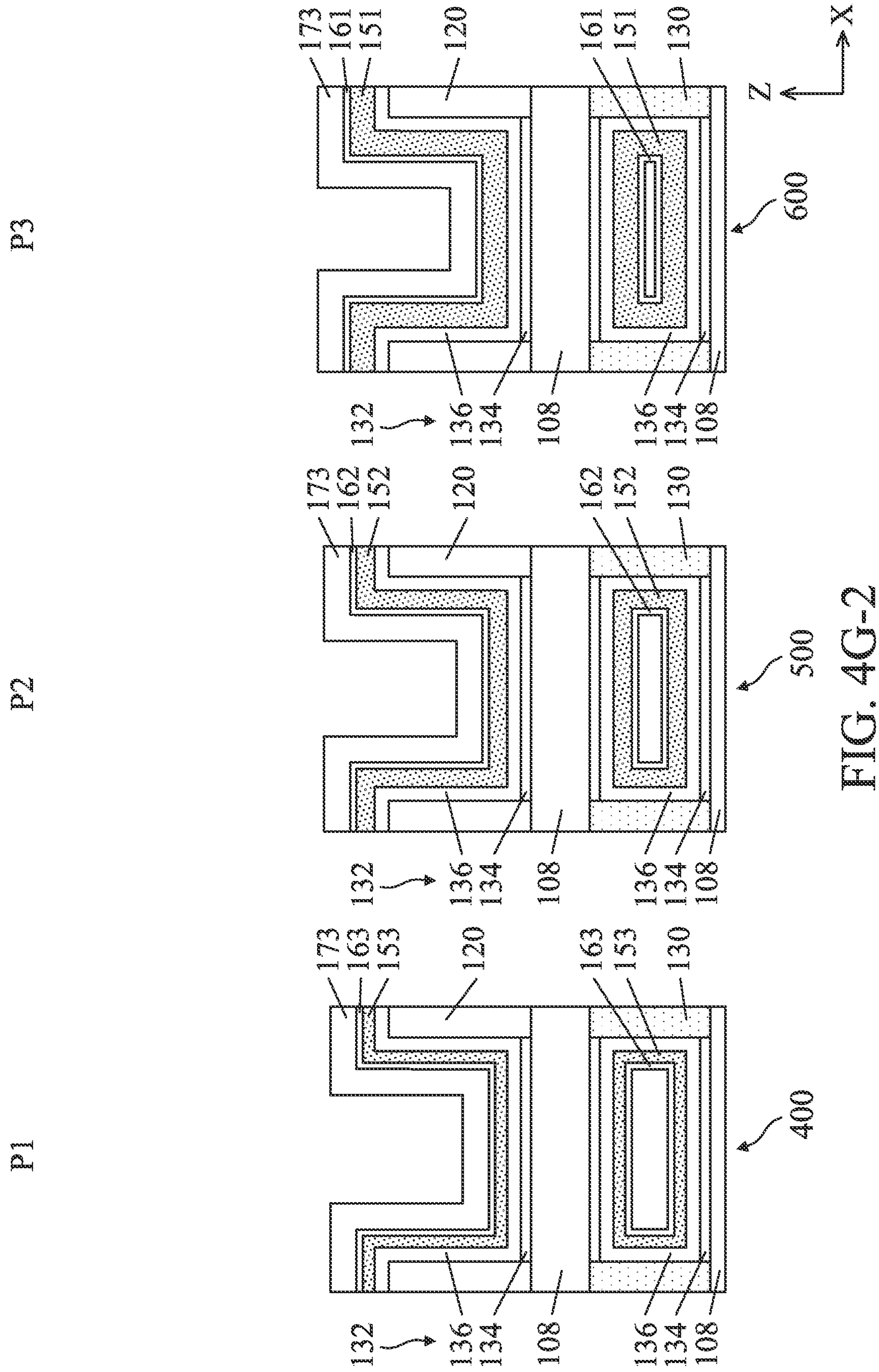

FIGS. 4G-1 and 4G-2 are cross-sectional views illustrating some portions of a semiconductor structure after the formation of a mask element, in accordance with some embodiments.

After the etching process for removing the barrier oxide 162, an outer portion of the exposed barrier material 152 (i.e., surface portion exposed to the ambient) is oxidized to form a native oxide layer 163 (also referred to as barrier oxide) at the regions 100, 200, 300, and 400 of the substrate due to being exposed to an ambient containing $O_2$ or $H_2O$, as shown in FIGS. 4G-1 and 4G-2, in accordance with some embodiments. The remaining portion (i.e., the inner portion) of the barrier material 152 remains unoxidized and is denoted as a barrier material 153.

In some embodiments, the barrier oxide 163 is a metal oxide or a metal oxynitride based on the chosen barrier material 150, e.g., $Ta_2O_5$, TaON, $TiO_2$, TiON, $W_2O_5$, WOCN, another suitable oxide, and/or a combination thereof, in accordance with some embodiments. In some embodiments, the thickness D9 of the barrier oxide 163 is in a range from about 3.6 Å to about 4.4 Å. In some embodiments, the thickness of the barrier material 153 is in a range from about 7.2 Å to about 8.8 Å.

Afterward, a mask element 173 is formed over the regions 400, 500 and 600 of the substrate, in accordance with some embodiments. In some embodiments, the material and formation method of the mask element 173 is similar to or the same as the mask element 171.

Figures 1, 4H:
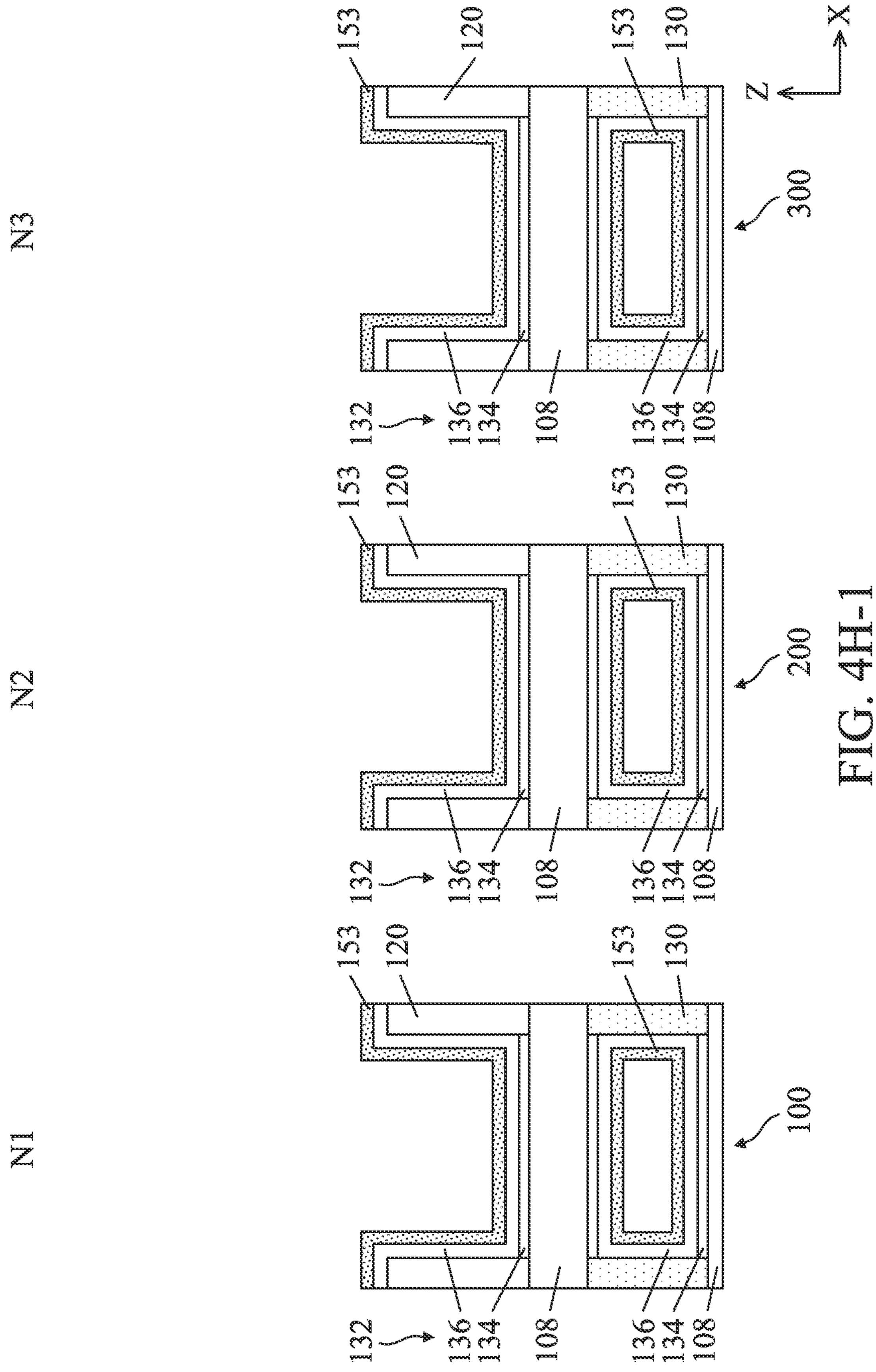
Figures 2, 4H:
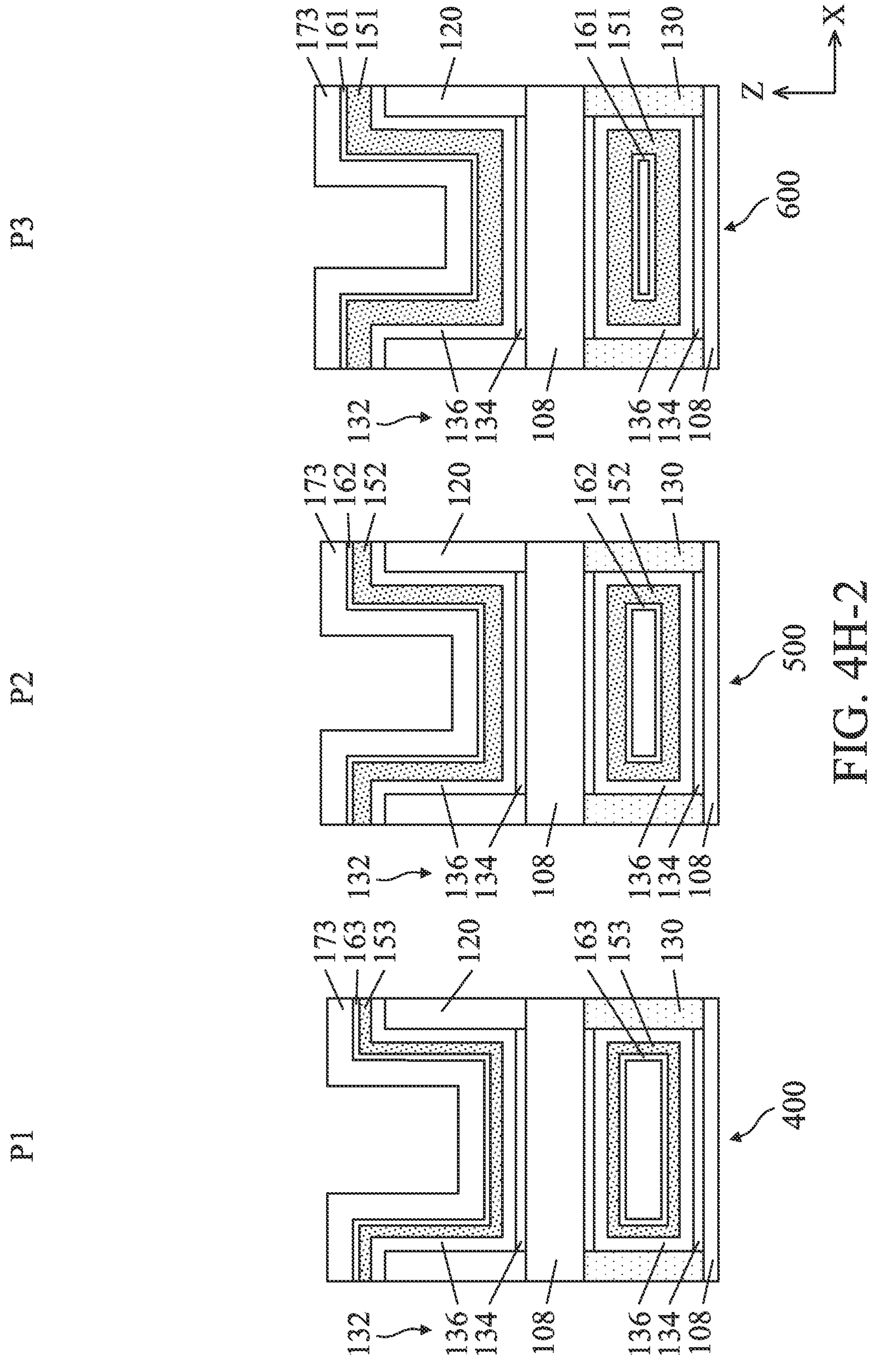

FIGS. 4H-1 and 4H-2 are cross-sectional views illustrating some portions of a semiconductor structure after an etching process, in accordance with some embodiments.

An etching process is performed on the semiconductor structure of FIGS. 4G-1 and 4G-2 to remove the barrier oxide 163 at the regions 100, 200 and 300 of the substrate, as shown in FIGS. 4H-1 and 4H-2, in accordance with some embodiments. The mask element 173 protects the barrier oxides 161, 162 and 163 at the regions 600, 500 and 400 from being removed, in accordance with some embodiments. The etching process is performed until the barrier material 153 is exposed, in accordance with some embodiments. The etching process may be similar to or the same as that described previously with respect to FIGS. 4D-1 and 4D-2. Afterward, the mask element 173 may be removed by a clean process using for example standard clean 1 (SC1).

Figures 1, 4I:
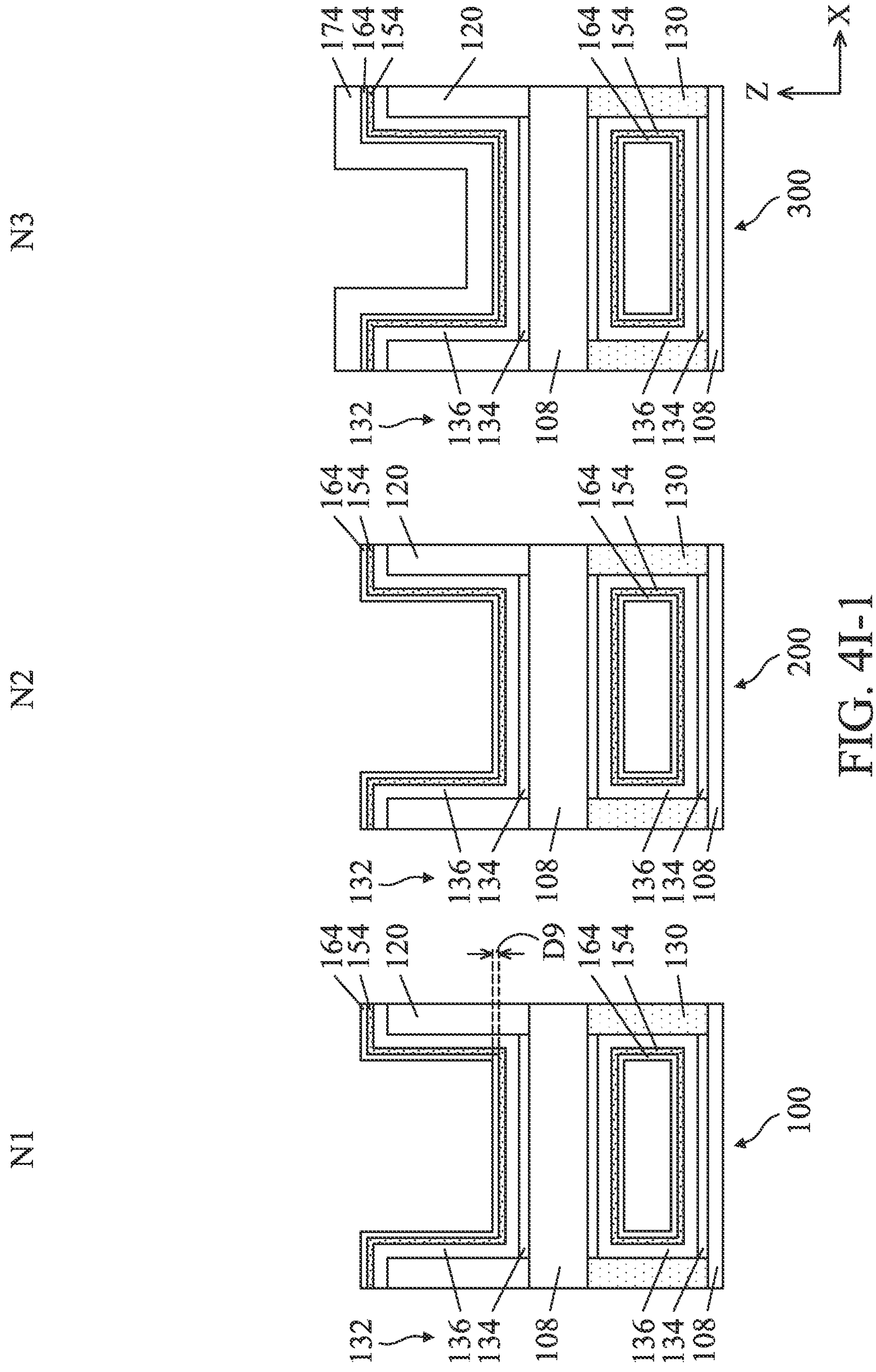
Figures 2, 4I:
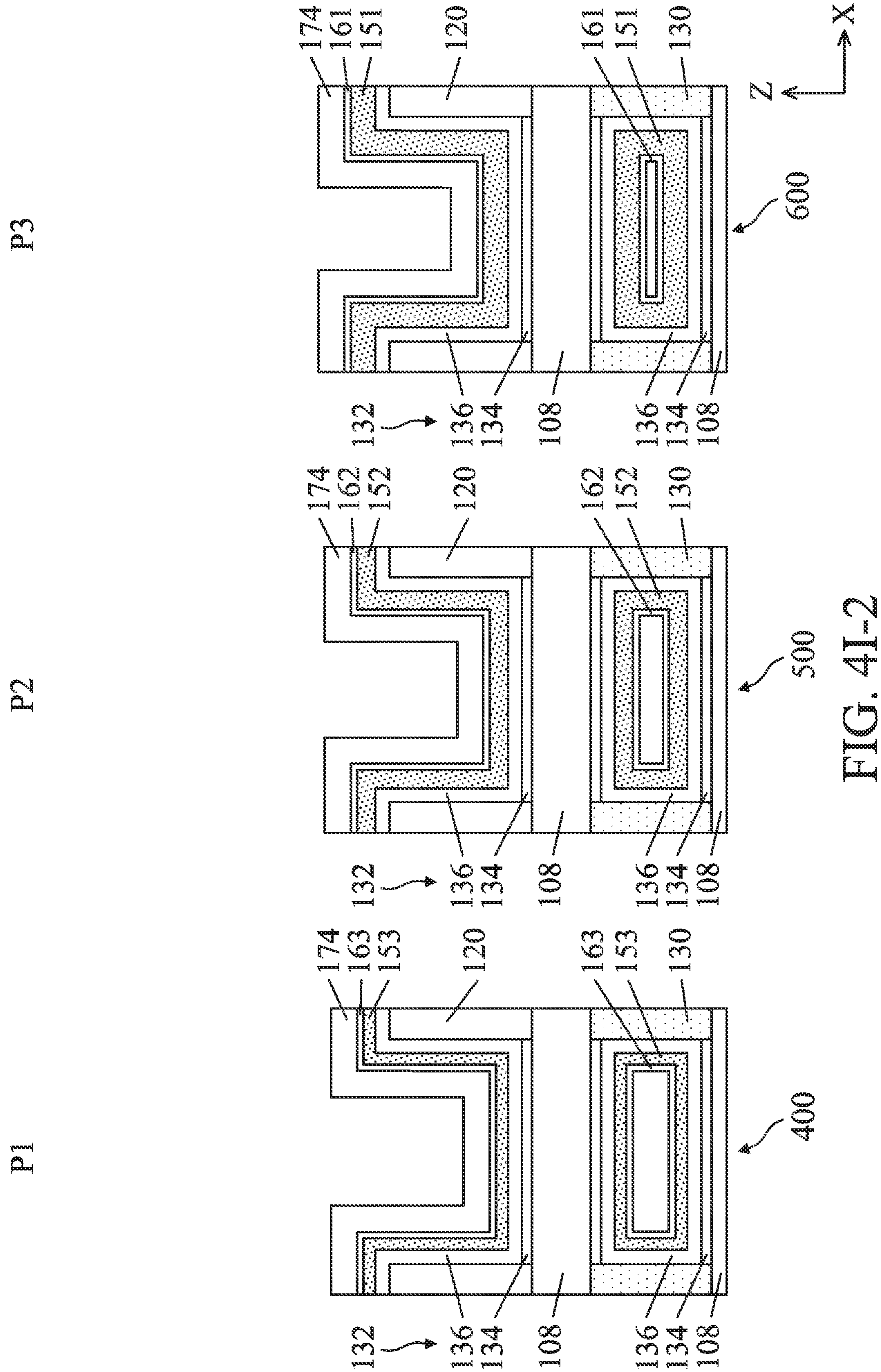

FIGS. 4I-1 and 4I-2 are cross-sectional views illustrating some portions of a semiconductor structure after the formation of a mask element, in accordance with some embodiments.

After the etching process for removing the barrier oxide 163, an outer portion of the barrier material 153 (i.e., surface portion exposed to the ambient) is oxidized to form a native oxide layer 164 (also referred to as barrier oxide) at the regions 100, 200 and 300 of the substrate due to being exposed to an ambient containing $O_2$ or $H_2O$, as shown in FIGS. 4I-1 and 4I-2, in accordance with some embodiments. The remaining portion (i.e., the inner portion) of the barrier material 153 remains unoxidized and is denoted as a barrier material 154.

In some embodiments, the barrier oxide 164 is a metal oxide or a metal oxynitride based on the chosen barrier material 150, e.g., $Ta_2O_5$, TaON, $TiO_2$, TiON, $W_2O_5$, WOCN, another suitable oxide, and/or a combination thereof, in accordance with some embodiments. In some embodiments, the thickness D9 of the barrier oxide 164 is in a range from about 3.6 Å to about 4.4 Å. In some embodiments, the thickness of the barrier material 154 is in a range from about 3.6 Å to about 4.4 Å.

Afterward, a mask element 174 is formed over the regions 300, 400, 500 and 600 of the substrate, in accordance with some embodiments. In some embodiments, the material and formation method of the mask element 174 is similar to or the same as the mask element 171.

Figures 1, 4J:
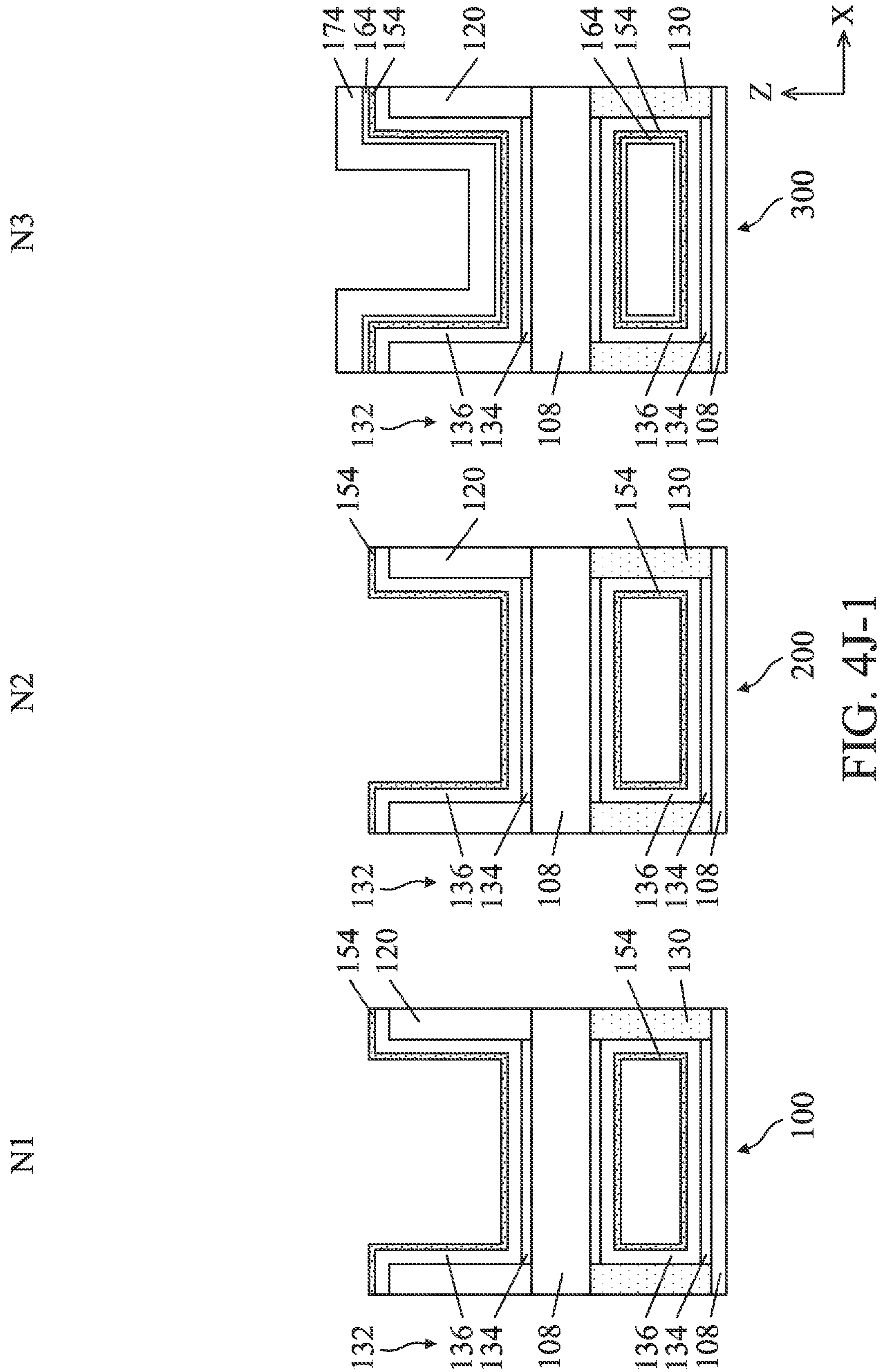
Figures 2, 4J:
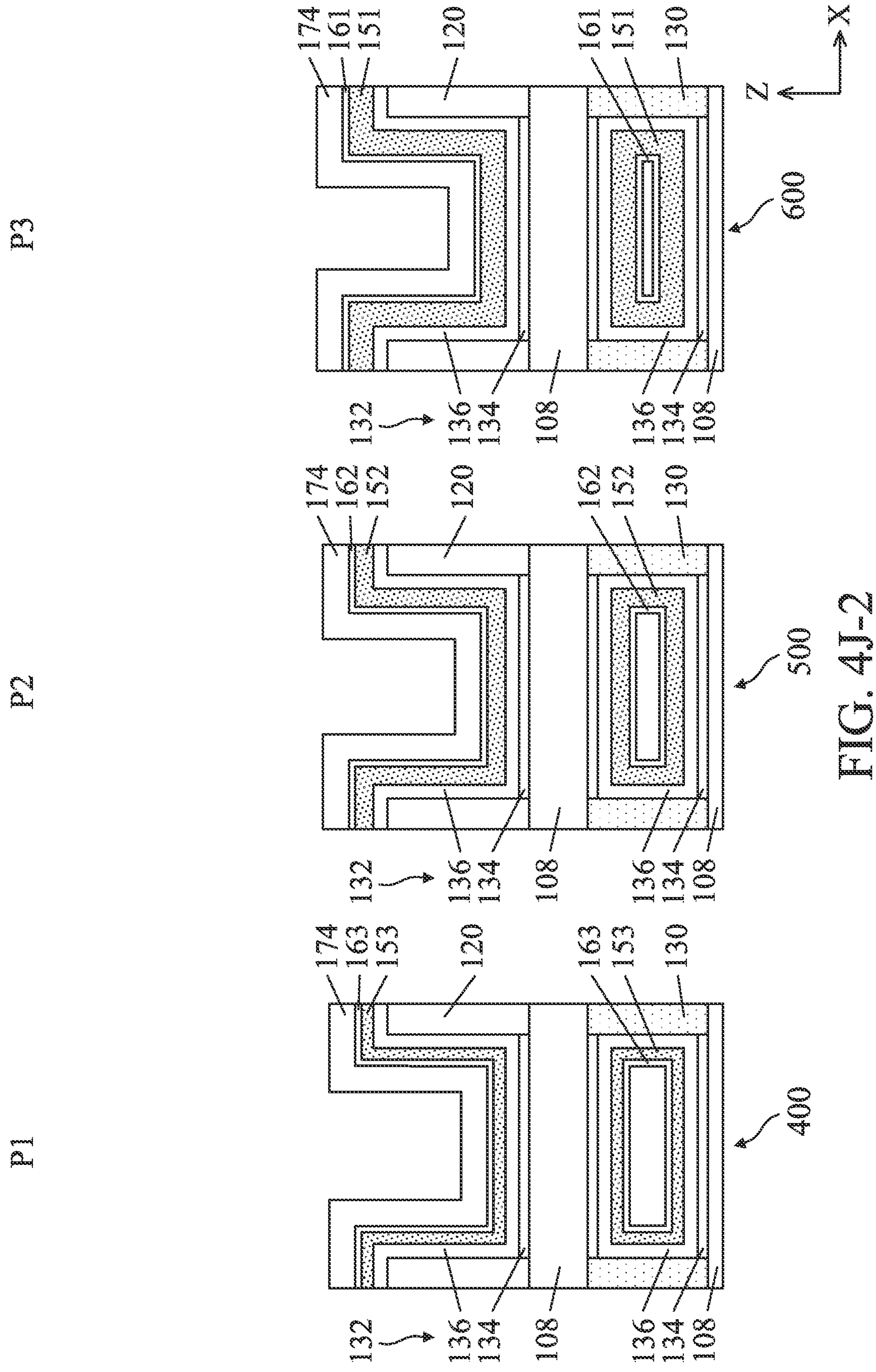

FIGS. 4J-1 and 4J-2 are cross-sectional views illustrating some portions of a semiconductor structure after an etching process, in accordance with some embodiments.

An etching process is performed on the semiconductor structure of FIGS. 4I-1 and 4I-2 to remove the barrier oxide 164 at the regions 100 and 200 of the substrate, as shown in FIGS. 4J-1 and 4J-2, in accordance with some embodiments. The mask element 174 protects the barrier oxides 161, 162, 163 and 164 at the regions 600, 500, 400 and 300 from being removed, in accordance with some embodiments. The etching process is performed until the barrier material 154 is exposed, in accordance with some embodiments. The etching process may be similar to or the same as that described previously with respect to FIGS. 4D-1 and 4D-2. Afterward, the mask element 174 may be removed by a clean process using for example standard clean 1 (SC1).

Figures 1, 4K:
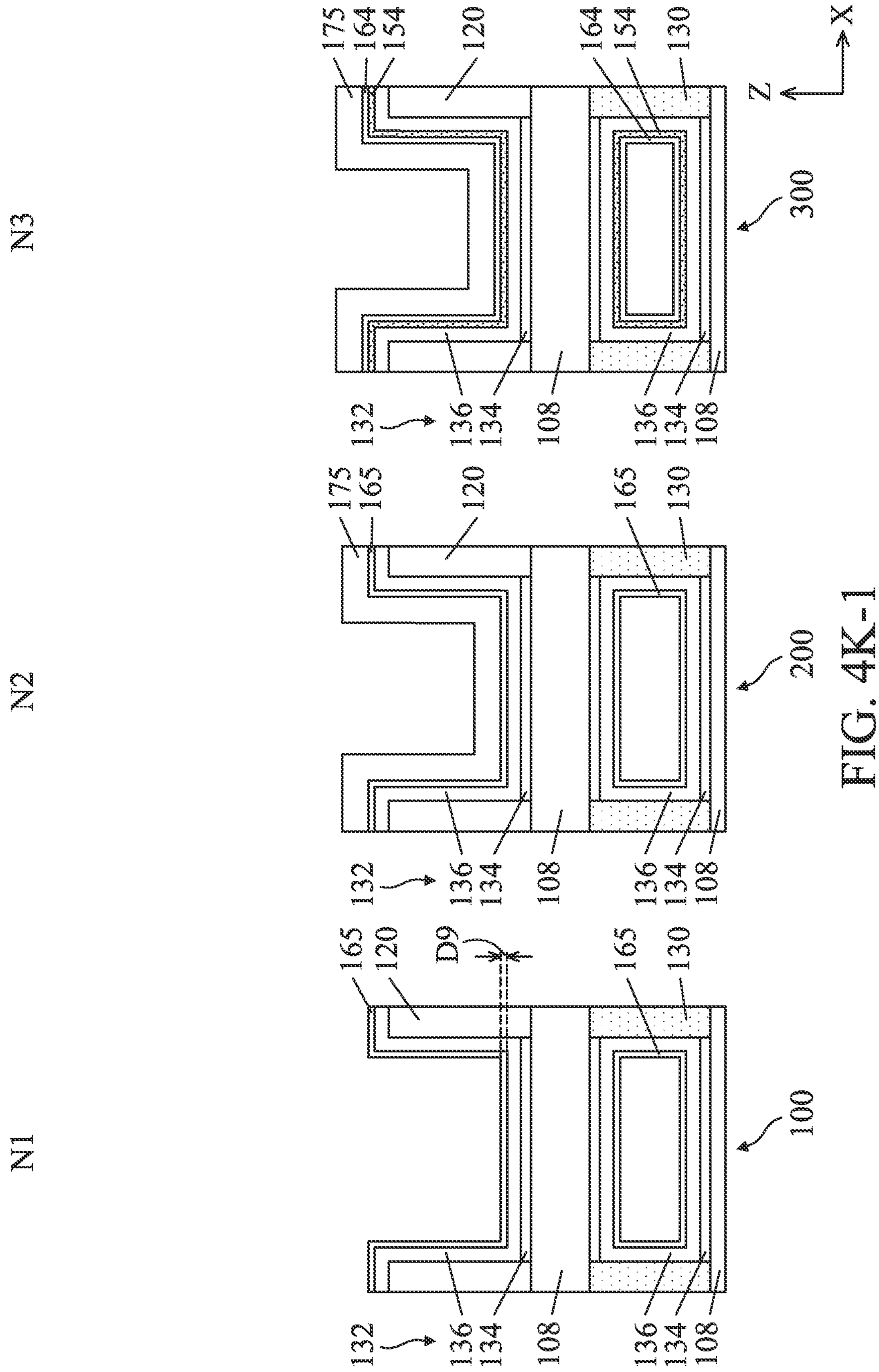
Figures 2, 4K:
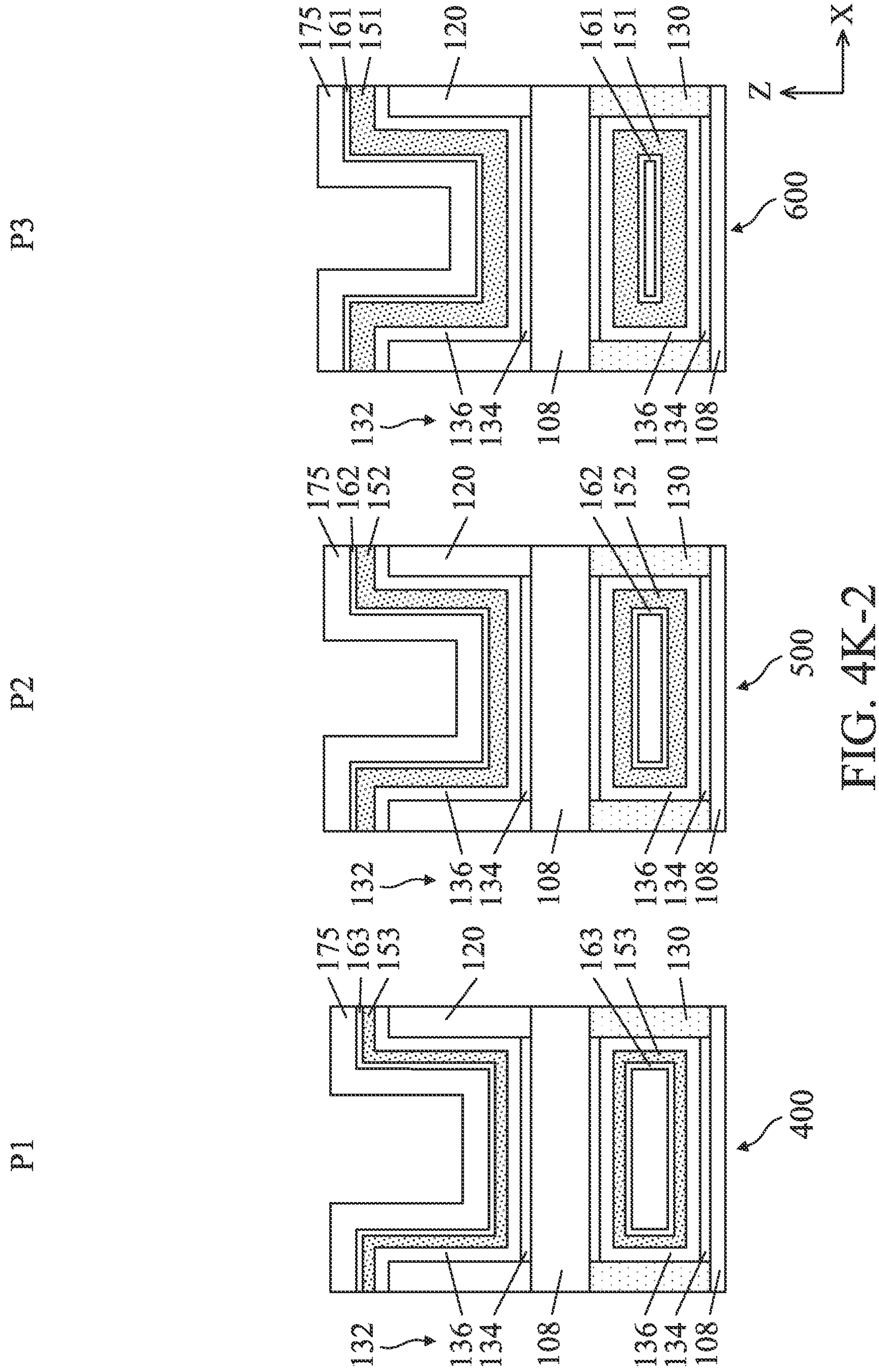

FIGS. 4K-1 and 4K-2 are cross-sectional views illustrating some portions of a semiconductor structure after the formation of a mask element, in accordance with some embodiments.

After the etching process for removing the barrier oxide 164, the exposed barrier material 154 are substantially entirely oxidized to form a native oxide layer 165 (also referred to as barrier oxide) at the regions 100 and 200 of the substrate due to being exposed to an ambient containing $O_2$ or $H_2O$, as shown in FIGS. 4K-1 and 4K-2, in accordance with some embodiments. The barrier oxide 165 is in direct contact the high-k gate dielectric layer 136, in accordance with some embodiments.

In some embodiments, the barrier oxide 165 is a metal oxide or a metal oxynitride based on the chosen barrier material 150, e.g., $Ta_2O_5$, TaON, $TiO_2$, TiON, $W_2O_5$, WOCN, another suitable oxide, and/or a combination thereof, in accordance with some embodiments. In some embodiments, the thickness D9 of the barrier oxide 165 is in a range from about 3.6 Å to about 4.4 Å.

Afterward, a mask element 175 is formed over the regions 200, 300, 400, 500 and 600 of the substrate, in accordance with some embodiments. In some embodiments, the material and formation method of the mask element 175 is similar to or the same as the mask element 171.

Figures 1, 4L:
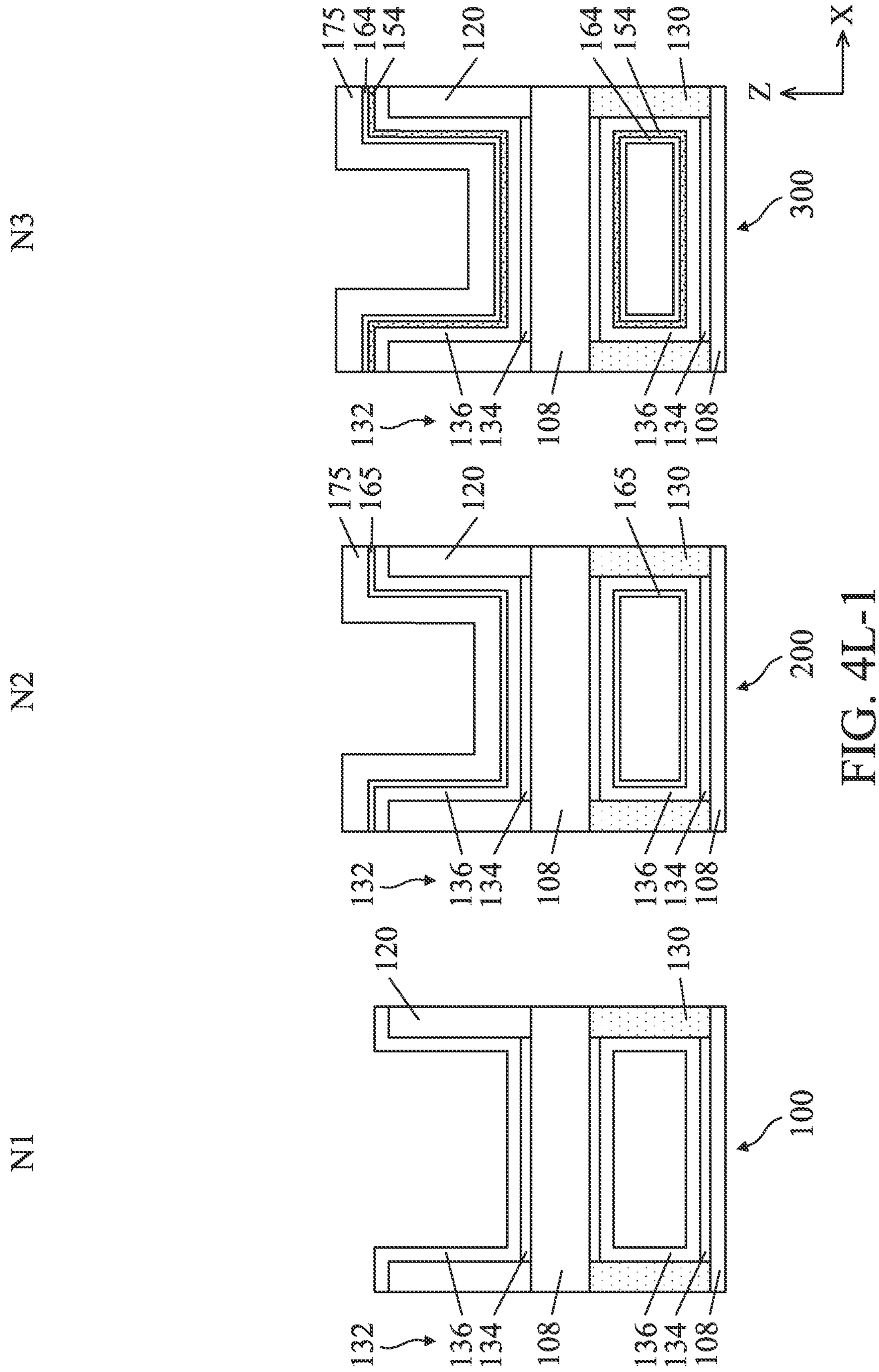
Figures 2, 4L:
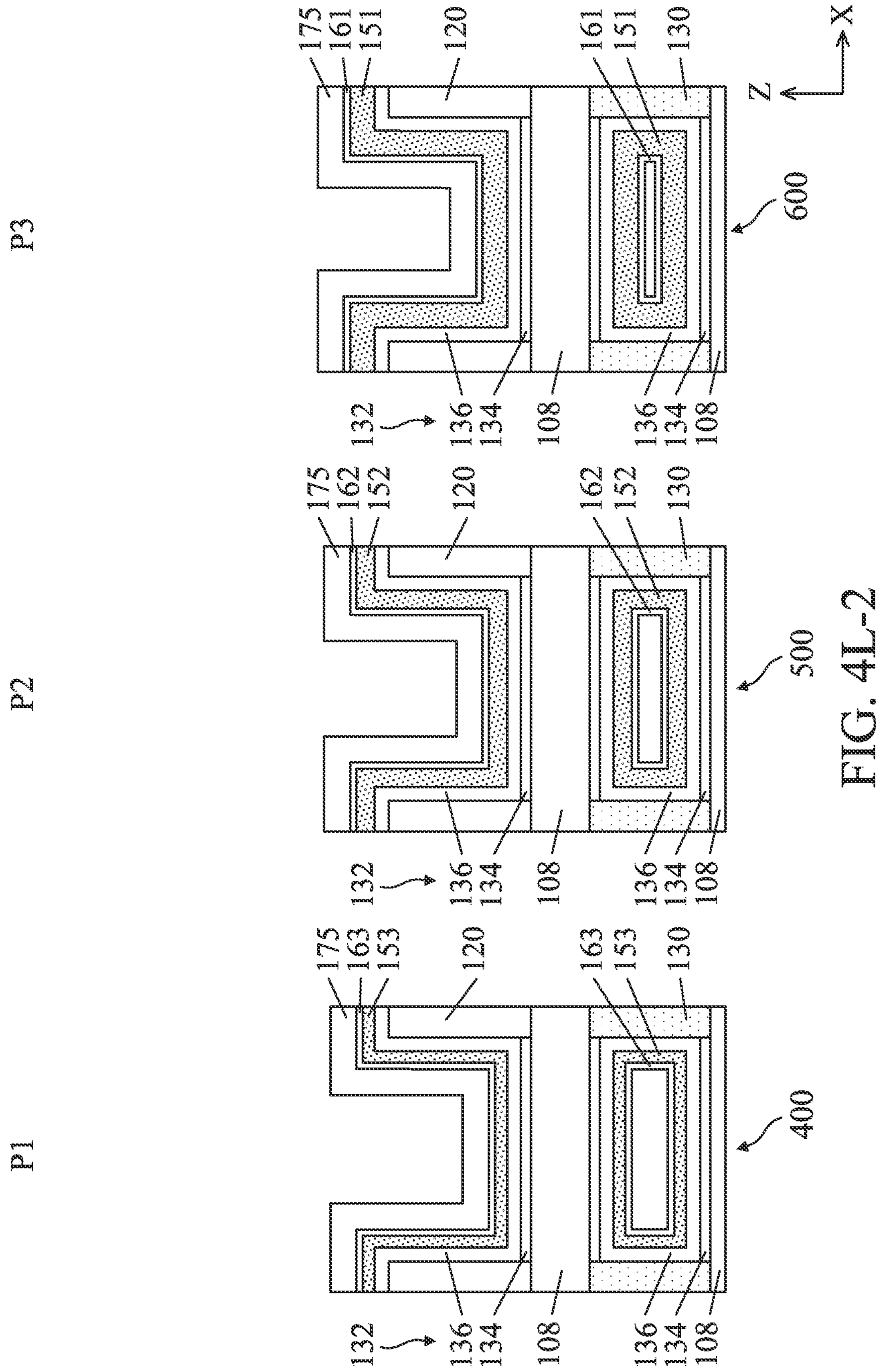

FIGS. 4L-1 and 4L-2 are cross-sectional views illustrating some portions of a semiconductor structure after an etching process, in accordance with some embodiments.

An etching process is performed on the semiconductor structure of FIGS. 4K-1 and 4K-2 to remove the barrier oxide 165 at the region 100 of the substrate, as shown in FIGS. 4L-1 and 4L-2, in accordance with some embodiments. The mask element 175 protects the barrier oxides 161, 162, 163, 164 and 165 at the regions 600, 500, 400, 300 and 200 from being removed, in accordance with some embodiments. The etching process is performed until the high-k gate dielectric layer 136 is exposed, in accordance with some embodiments. The etching process may be similar to or the same as that described previously with respect to FIGS. 4D-1 and 4D-2. Afterward, the mask element 175 may be removed by a clean process using for example standard clean 1 (SC1).

The etching processes discussed previously with respect to FIGS. 4C-1 through 4L-2 are self-limiting etching processes, which removes the native oxide layer 161-165 of the barrier material 150 step-by-step, thereby thinning down the barrier material 150, in accordance with some embodiments. The thinning-down process of the barrier material 150 may thus be precisely controlled at different regions of the substrate. As a result, the respective barrier layers of the gate electrode structure having different thicknesses may be realized for various transistors N1, N2, N3, P1, P2 and P3 while keeping the gaps 128 from being completely filled.

Figures 1, 4M:
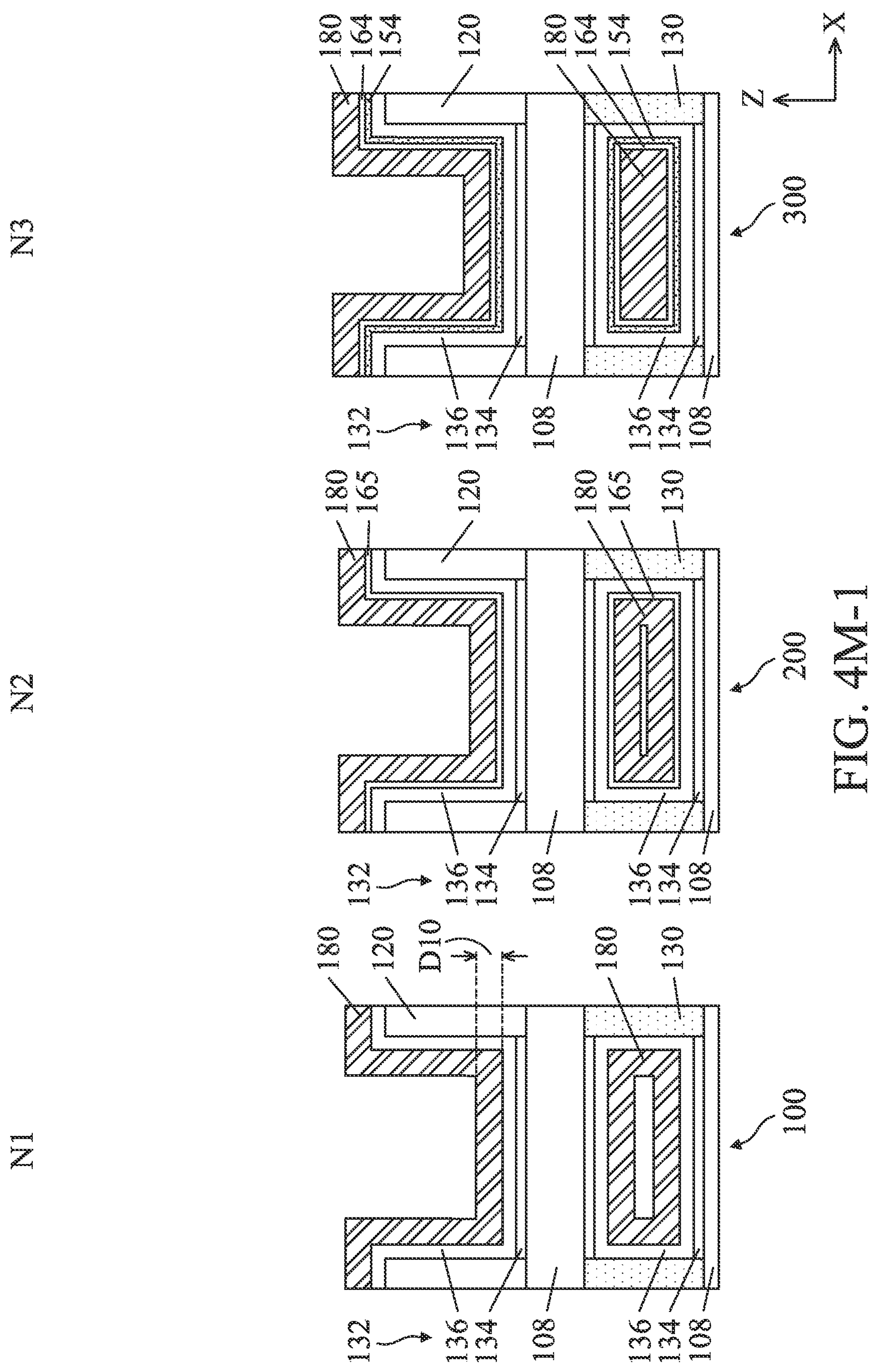
Figures 2, 4M:
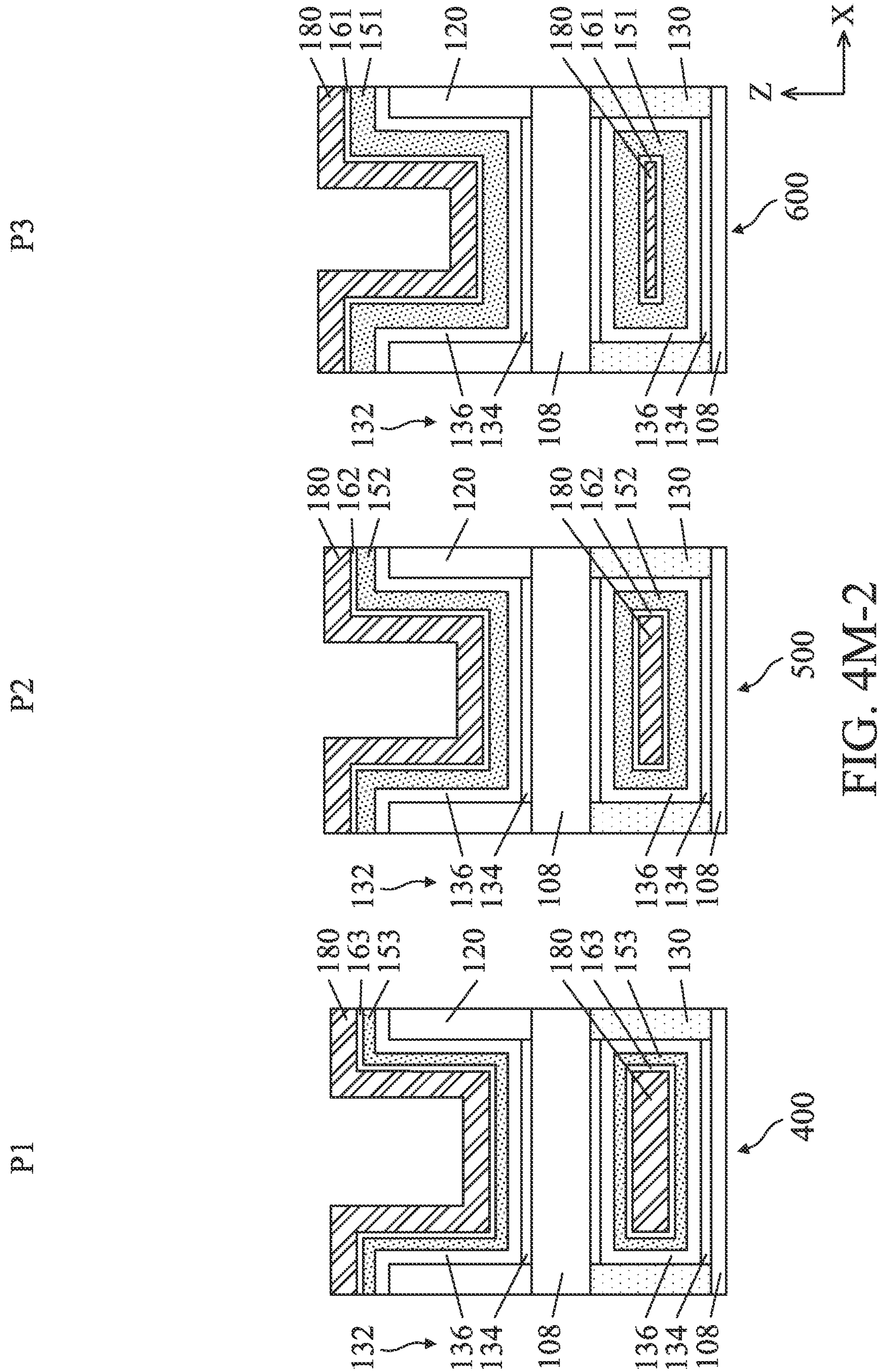

FIGS. 4M-1 and 4M-2 are cross-sectional views illustrating some portions of a semiconductor structure after the formation of a work function layer, in accordance with some embodiments.

A work function layer 180 is formed on the semiconductor structure of FIGS. 4L-1 and 4L-2, as shown in FIGS. 4M-1 and 4M-2, in accordance with some embodiments. The work function layer 180 is filled into the gap 128 and the gate trench 126 to wrap around the second semiconductor layers 108, in accordance with some embodiments. In the region 100, the work function layer 180 is in direct contact with the high-k gate dielectric layer 136, in accordance with some embodiments. In the regions 200-600, the work function layer 180 is in direct contact the barrier oxides 161-165, in accordance with some embodiments. Furthermore, in the regions 300-600, the remainder of the gap 128 may be overfilled by the work function layer 180.

In some embodiments, the work function layer 180 is made of an n-type work function metal such as TiAlC, TaAlN, TiAlN, another suitable n-type work function metal, and/or a combination thereof. In some embodiments, the work function layer 180 is formed using ALD, CVD, PVD, another suitable technique, and/or a combination thereof. In some embodiments, the thickness D10 of the work function layer 180 is in a range from about 13.5 Å to about 16.5 Å.

As the scale of semiconductor devices continues to shrink, the space between two adjacent second semiconductor layers 108 (the dimension of the gap 128 in the Z direction) becomes smaller and smaller. The gap 128 may not provide enough space to accommodate more than one work function layer to adjust the work function of the gate electrode structure.

In the embodiments of the present disclosure, by forming the respective barrier layers (including the barrier material and the barrier oxide) with different thicknesses along with a single-layer work function layer to adjust the influence from the work function layer on the energy band of the conductive carrier, transistors with different threshold voltages may be formed in a semiconductor structure. The single-layer work function layer may wrap around the channel region, which may enhance the performance of the transistors, e.g., the uniformity of the threshold voltage.

Figures 1, 4N:
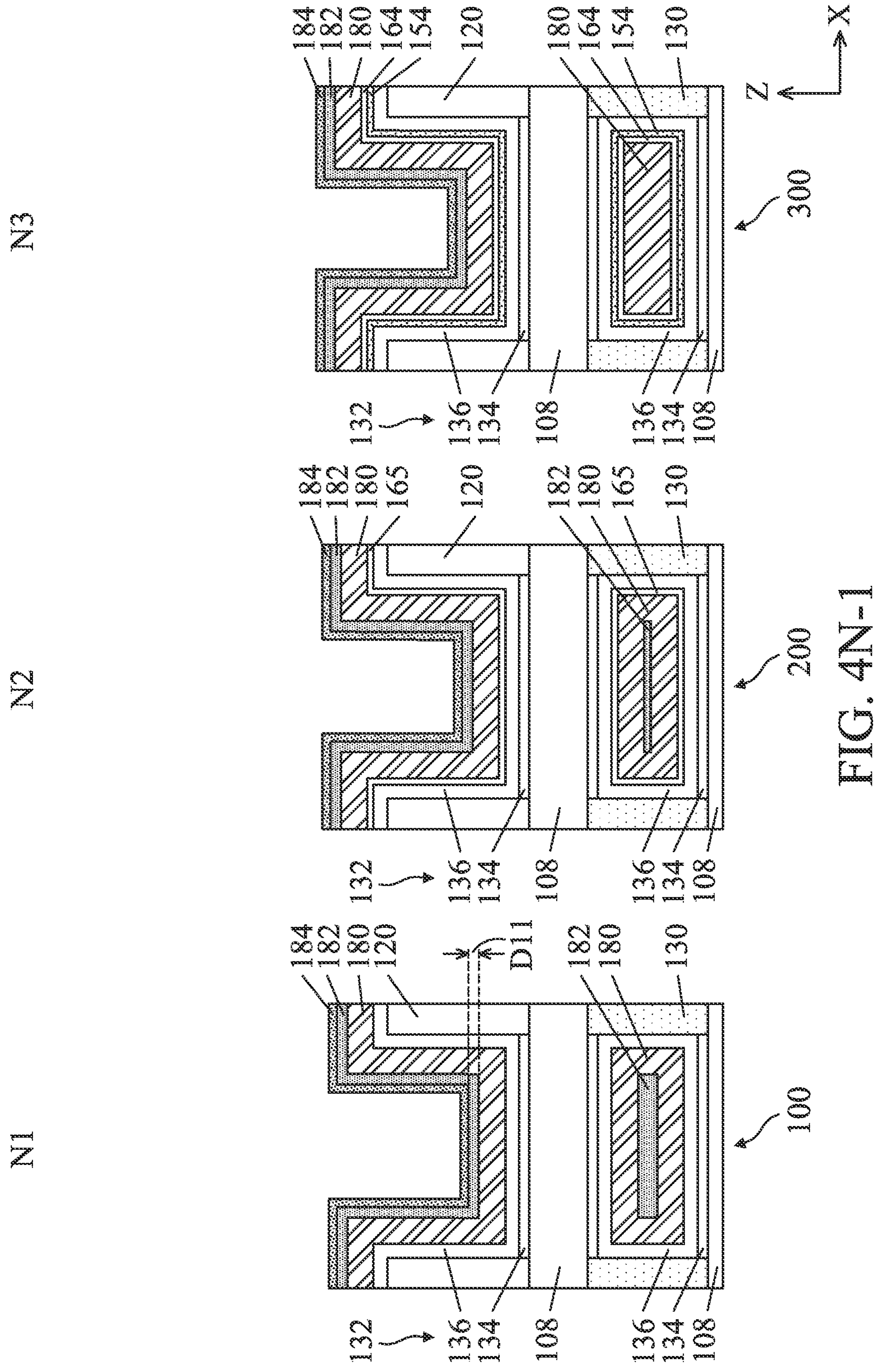
Figures 2, 4N:
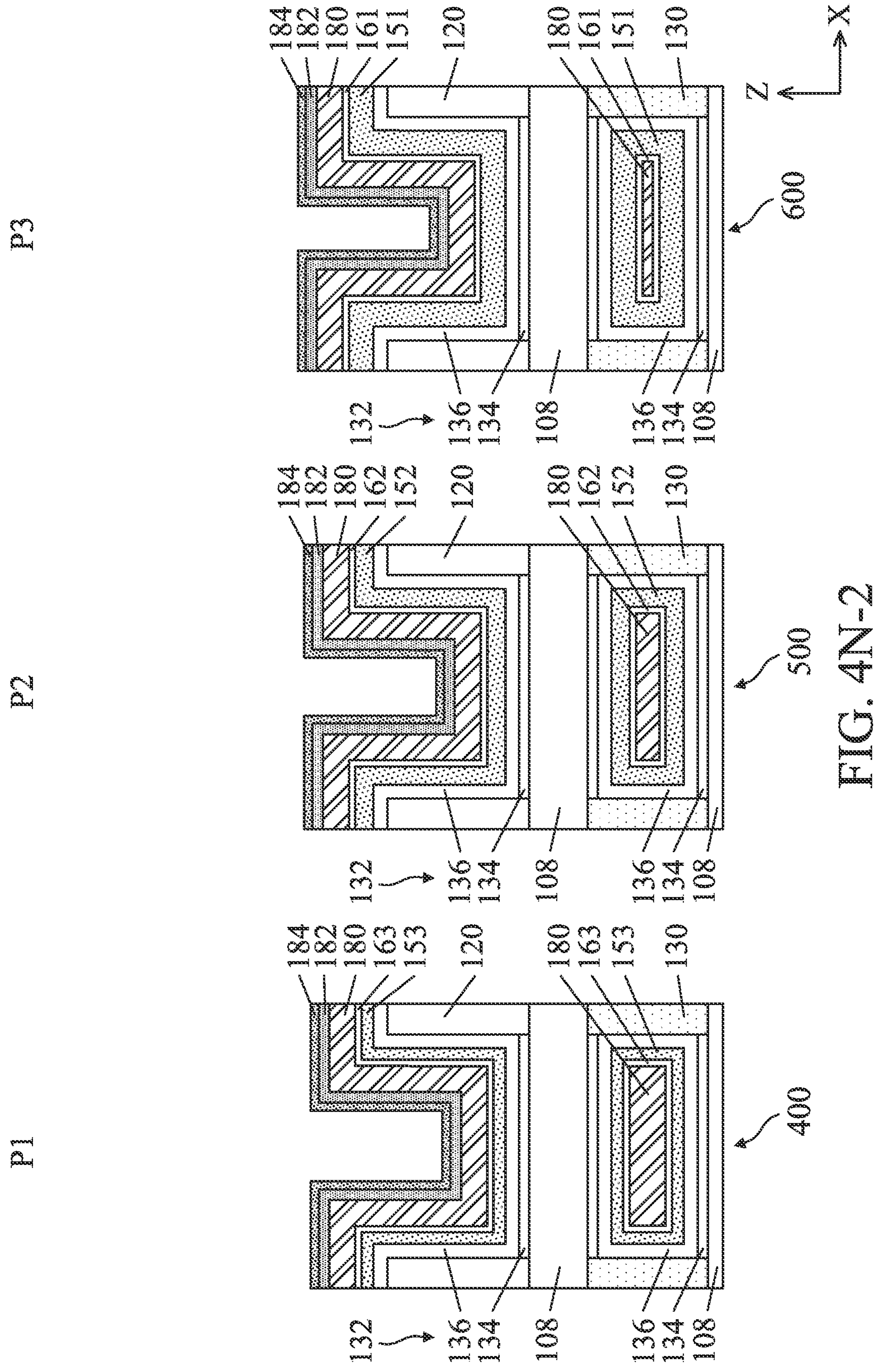

FIGS. 4N-1 and 4N-2 are cross-sectional views illustrating some portions of a semiconductor structure after the formation of a capping layer, in accordance with some embodiments.

A first capping layer 182 is formed on the work function layer 180, as shown in FIGS. 4N-1 and 4N-2, in accordance with some embodiments. In the regions 100 and 200, the remainder of the gap 128 may be overfilled by the first capping layer 182. In some embodiments, the thickness D11 of the first capping layer 182 is in a range from about 9.0 Å to about 11.0 Å. In some embodiments, the first capping layer 182 is made of TiN. In some embodiments, the first capping layer 182 is formed using ALD, CVD, PVD, another suitable technique, and/or a combination thereof.

A second capping layer 184 is formed on the first capping layer 182, as shown in FIGS. 4L-1 and 4L-2, in accordance with some embodiments. In some embodiments, the second capping layer 184 is a substantially pure Si layer or Al layer. In some embodiments, the second capping layer 184 is an Al layer, formed by soaking the semiconductor structure in triethylaluminium (TEA)-containing ambient. In some embodiments, the second capping layer 184 is a Si layer, formed by soaking the semiconductor structure in $SiH_4$-containing ambient.

In some embodiments, the deposition processes of the work function layer 180, the first capping layer 182 and the second capping layer 184 are performed in-situ. That is, in some embodiments, the deposition processes of the work function layer 120, the first capping layer 182 and the second capping layer 184 are continuously performed in a single process tool, for example, an ALD tool. As a result, the work function layer 180 may not be exposed to the atmosphere or an ambient containing $O_2$ or $H_2O$ during transportation between two deposition tools, thereby preventing the oxidation of the work function layer 180. After the semiconductor structure leaves the deposition process and is exposed to the atmosphere or an ambient containing $O_2$ or $H_2O$, the as-deposited second capping layer 184 may be oxidized to form $SiO_2$ and/or $Al_2O_3$, which may prevent the work function layer 180 from being oxidized.

Figures 1, 4O:
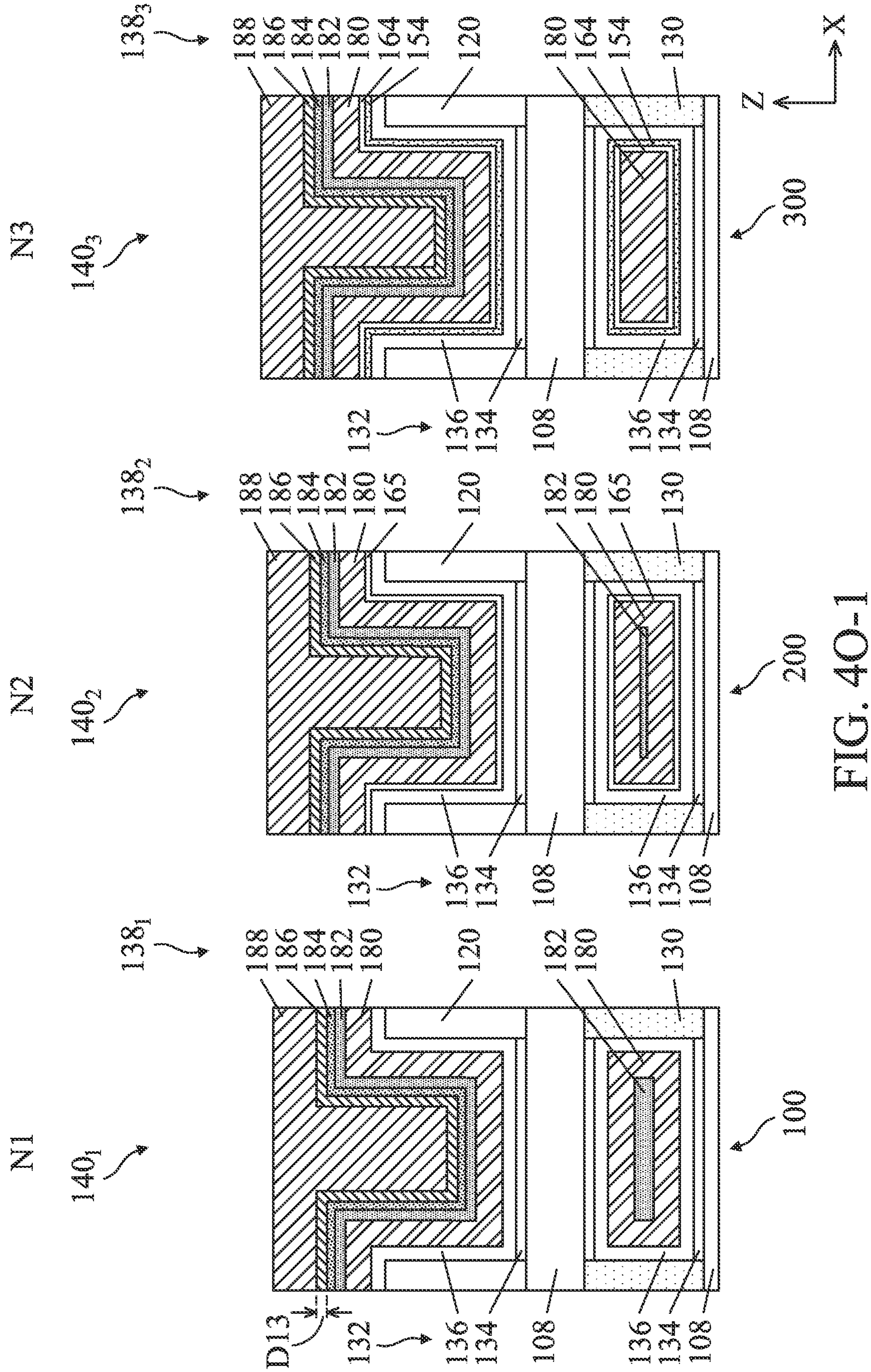
Figures 2, 4O:
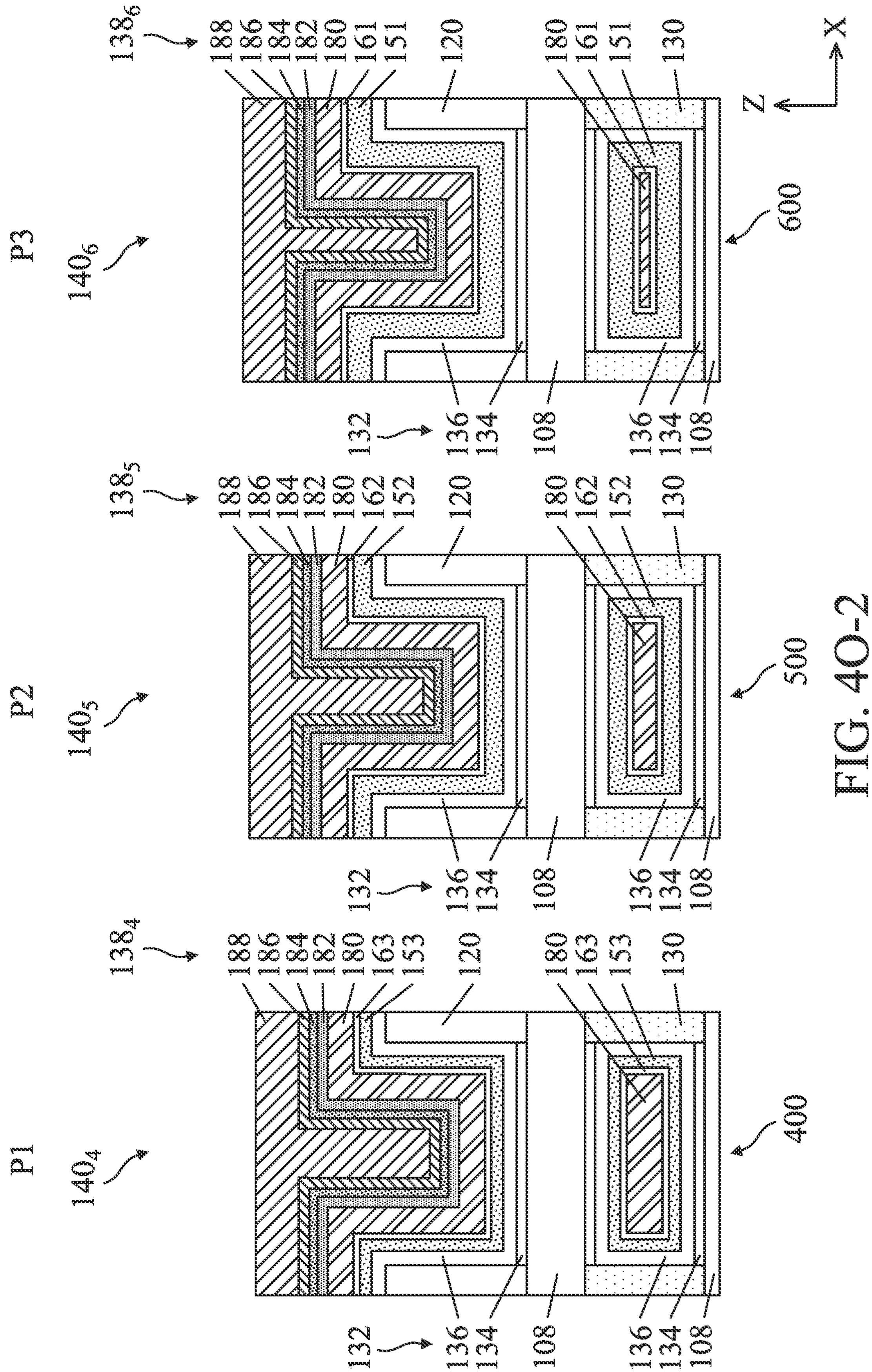

FIGS. 4O-1 and 4O-2 are cross-sectional views illustrating some portions of a semiconductor structure after the formation of a glue layer and a metal fill layer, in accordance with some embodiments.

A glue layer 186 is formed on the second capping layer 184, as shown in FIGS. 4O-1 and 4O-2, in accordance with some embodiments. In some embodiments, the glue layer 186 is configured to provide a better adhesion of a subsequently formed metal fill layer to the underlying layers (e.g., the capping layers 182 and 184, the work function layer 180, etc.). In some embodiments, the glue layer 186 is made of TiN. In some embodiments, the glue layer 186 is formed using ALD, CVD, PVD, another suitable technique, and/or a combination thereof. In some embodiments, the thickness of the glue layer 186 is in a range from about 10 Å to about 25 Å.

A metal fill layer 188 is formed on the glue layer 186, as shown in FIGS. 4O-1 and 4O-2, in accordance with some embodiments. The metal fill layer 188 overfills the remainder of the gate trench 126, in accordance with some embodiments. After the formation of the metal fill layer 188, respective gate electrode structures $138_1$, $138_2$, $138_3$, $138_4$, $138_5$ and $138_6$, have been formed, in accordance with some embodiments. The gate electrode structures 138 and the gate dielectric structures 132 combine to form metal gate structures 140, in accordance with some embodiments.

In some embodiments, the metal fill layer 188 is made of W, Ru, Al, Cu, Co, another suitable conductive material with low resistance, and/or a combination thereof. In some embodiments, the metal fill layer 188 is formed using ALD, CVD, PVD, another suitable technique, and/or a combination thereof. Because only one work function layer is formed, the gate trench 126 may provide more space to accommodate the metal fill layer 188, and thus the resistance of the transistors may be reduced.

After the formation of the metal gate structure 140, a planarization process such as CMP may be performed on the semiconductor structure of FIGS. 4O-1 and 4O-2 to produce the semiconductor structure as shown in FIGS. 3-1 and 3-2.

As described above, the method for forming a semiconductor structure includes forming gaps 128 between the second semiconductor layers 108, forming a gate dielectric layer 136 on the second semiconductor layers, and forming a barrier material 150 on the gate dielectric layer 136. At least a portion of the barrier material 150 is oxidized to form a barrier oxide 161. The method also includes etching away the barrier oxide 161 and forming a work function layer 180 to wrap around the second semiconductor layers 108. The etching process for thinning down the barrier material may be performed for one or more times, thereby adjusting the transistor having a desirable threshold voltage. Furthermore, the work function layer may wrap around the second semiconductor layers (the channel region), which may enhance the performance of the transistors, e.g., the uniformity of the threshold voltage.

Embodiments of a method for forming a semiconductor structure are provided. The method for forming the semiconductor structure may include forming a gate dielectric layer wrapping around second semiconductor layers, and forming a barrier material on the gate dielectric layer. At least a portion of the barrier material is oxidized to form a first barrier oxide. The method may also include etching away the first barrier oxide and forming a work function layer to wrap around the second semiconductor layers. As a result, the etching process for thinning down the barrier material may be precisely controlled, which may achieve the various transistors having different threshold voltages in a semiconductor structure.

In some embodiments, a semiconductor structure is provided. The semiconductor structure includes a first channel layer over a first region of a substrate, a first gate dielectric layer over the first channel layer, and a first gate electrode structure over the first gate dielectric layer. The first gate electrode structure includes a barrier layer over the first gate dielectric layer, a barrier oxide over and in contact with the barrier layer, and a metal fill layer over the barrier oxide. The barrier layer is made of a nitride of a metal, and the barrier oxide is made of an oxide of the metal.

In some embodiments, a semiconductor structure is provided. The semiconductor structure includes a first nanostructure over a second nanostructure, a first inner spacer layer between a first end portion of the first nanostructure and a first end portion of the second nanostructure, a second inner spacer layer between a second end portion of the first nanostructure and a second end portion of the second nanostructure, and a first gate stack surrounding a middle portion of the first nanostructure and a middle portion of the second nanostructure and filled in a first space defined by the first nanostructure, the second nanostructure, the first inner spacer and the second inner spacer. A portion of the first gate stack filled in the first space includes a gate dielectric layer, a nitride layer within the gate dielectric layer, and an oxide layer within the nitride layer.

In some embodiments, a method for forming a semiconductor structure is provided. The method includes forming a first channel layer, a second channel layer and a third channel layer over a first region, a second region and a third region of a substrate, respectively, forming a gate dielectric layer over the first channel layer, the second channel layer and the third channel layer, forming a barrier layer over the gate dielectric layer, forming a first mask element covering the third region of the substrate while exposing the first region and the second region of the substrate, partially etching the barrier layer from the first region and the second region of the substrate, removing the first mask element, forming a second mask element covering the second region and the third region of the substrate while exposing the first region of the substrate, partially etching the barrier layer from the first region, removing the second mask element, and forming a work function layer over the barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a first channel layer over a first region of a substrate;

a first gate dielectric layer over the first channel layer;

a first gate electrode structure over the first gate dielectric layer, wherein the first gate electrode structure comprises a barrier layer over the first gate dielectric layer, a barrier oxide over and in contact with the barrier layer, and a metal fill layer over the barrier oxide, wherein the barrier layer is made of a nitride of a metal, and the barrier oxide is made of an oxide of the metal, wherein the barrier layer is interfaced with the first gate dielectric layer;

a second channel layer over a second region of the substrate;

a second gate dielectric layer over the second channel layer;

a second gate electrode structure over the second gate dielectric layer, wherein the second gate electrode structure comprises the barrier layer over the second gate dielectric layer, the barrier oxide over and in contact with the barrier layer, and the metal fill layer over the barrier oxide, wherein the barrier layer of the second gate electrode structure is thinner than the barrier layer of the first gate electrode structure;

a third channel layer over a third region of the substrate;

a third gate dielectric layer over the third channel layer; and a third gate electrode structure over the third gate dielectric layer, wherein the third gate electrode structure comprises the barrier layer over the third gate dielectric layer, the barrier oxide over and in contact with the barrier layer, and the metal fill layer over the barrier oxide, wherein the barrier layer of the third gate electrode structure is thinner than the barrier layer of the second gate electrode structure.

2. The semiconductor structure as claimed in claim 1, further comprising:

a first transistor over the first region of the substrate, comprising the first channel layer, the first gate dielectric layer and the first gate electrode structure; and a second transistor over the second region of the substrate, comprising the second channel layer, the second gate dielectric layer and the second gate electrode structure, wherein the first transistor has a first threshold voltage, the second transistor has a second threshold voltage, and the absolute value of the first threshold voltage is less than the absolute value of the second threshold voltage.

3. The semiconductor structure as claimed in claim 1, wherein the first gate electrode structure further comprises a work function layer over the barrier oxide, a capping layer over the work function layer and a glue layer over the capping layer, wherein the metal fill layer is located over the glue layer.

4. The semiconductor structure as claimed in claim 3, wherein the capping layer is made of Al, $Al_2O_3$, Si or $SiO_2$.

5. The semiconductor structure as claimed in claim 1, further comprising:

a fourth channel layer over a fourth region of the substrate;

a fourth gate dielectric layer over the fourth channel layer; and a fourth gate electrode structure over the fourth gate dielectric layer, wherein the fourth gate electrode structure comprises the barrier layer over the fourth gate dielectric layer, the barrier oxide over and in contact with the barrier layer, and the metal fill layer over the barrier oxide, wherein the barrier layer of the fourth gate electrode structure is thinner than the barrier layer of the third gate electrode structure.

6. The semiconductor structure as claimed in claim 5, further comprising:

a first p-type source/drain feature adjoining the first channel layer;

a second p-type source/drain feature adjoining the second channel layer;

a third p-type source/drain feature adjoining the third channel layer; and an n-type source/drain feature adjoining the fourth channel layer.

7. The semiconductor structure as claimed in claim 6, further comprising:

a fifth channel layer over a fifth region of the substrate;

a fifth gate dielectric layer over the fifth channel layer; and a fifth gate electrode structure over the fifth gate dielectric layer, wherein the fifth gate electrode structure comprises the barrier oxide over and in contact with the fifth gate dielectric layer, and the metal fill layer over the barrier oxide.

8. The semiconductor structure as claimed in claim 1, wherein a thickness of the barrier oxide of the first gate electrode structure, a thickness of the barrier oxide of the second gate electrode structure and a thickness of the barrier oxide of the third gate electrode structure are substantially the same.

9. A semiconductor structure, comprising:

a first nanostructure over a second nanostructure;

a first inner spacer layer between a first end portion of the first nanostructure and a first end portion of the second nanostructure;

a second inner spacer layer between a second end portion of the first nanostructure and a second end portion of the second nanostructure;

a first p-type source/drain feature adjoining the first and second nanostructures;

a first gate stack surrounding a middle portion of the first nanostructure and a middle portion of the second nanostructure and filled in a first space defined by the first nanostructure, the second nanostructure, the first inner spacer layer and the second inner spacer layer, wherein a portion of the first gate stack filled in the first space includes a gate dielectric layer, a nitride layer within the gate dielectric layer, and an oxide layer within the nitride layer, wherein the oxide layer is separate from the gate dielectric layer by the nitride layer;

a third nanostructure over a fourth nanostructure;

a third inner spacer layer between a third end portion of the third nanostructure and a third end portion of the fourth nanostructure;

a fourth inner spacer layer between a fourth end portion of the third nanostructure and a fourth end portion of the fourth nanostructure;

a second p-type source/drain feature adjoining the third and fourth nanostructures;

a second gate stack surrounding a middle portion of the third nanostructure and a middle portion of the fourth nanostructure and filled in a second space defined by the third nanostructure, the fourth nanostructure, the third inner spacer layer and the fourth inner spacer layer, wherein a portion of the second gate stack filled in the second space includes the gate dielectric layer, the nitride layer within the gate dielectric layer, and the oxide layer within the nitride layer;

a fifth nanostructure over a sixth nanostructure;

a fifth inner spacer layer between a fifth end portion of the fifth nanostructure and a fifth end portion of the sixth nanostructure;

a sixth inner spacer layer between a sixth end portion of the fifth nanostructure and a sixth end portion of the sixth nanostructure;

a third p-type source/drain feature adjoining the fifth and sixth nanostructures; and a third gate stack surrounding a middle portion of the fifth nanostructure and a middle portion of the sixth nanostructure and filled in a third space defined by the fifth nanostructure, the sixth nanostructure, the fifth inner spacer layer and the sixth inner spacer layer, wherein a portion of the third gate stack filled in the third space includes the gate dielectric layer, the nitride layer within the gate dielectric layer, and the oxide layer within the nitride layer, wherein the nitride layer of the third gate stack is thicker than the nitride layer of the second gate stack, and the nitride layer of the second gate stack is thicker than the nitride layer of the first gate stack.

10. The semiconductor structure as claimed in claim 9, wherein the portion of the first gate stack filled in the first space further includes a work function layer within the oxide layer.

11. The semiconductor structure as claimed in claim 9, wherein in a cross-section view, the nitride layer has a profile with a ring-shape and the oxide layer has a profile with a ring-shape.

12. The semiconductor structure as claimed in claim 9, wherein the oxide layer includes $Ta_2O_5$, $TiO_2$, $W_2O_5$, or a combination thereof.

13. The semiconductor structure as claimed in claim 9, further comprising:

a first transistor comprising the first and second nanostructures and the first gate stack;

a second transistor comprising the third and fourth nanostructures and the second gate stack;

a third transistor comprising the fifth and sixth nanostructures and third gate stack, wherein the first transistor has a first threshold voltage, the second transistor has a second threshold voltage, the third transistor has a third threshold voltage, and the absolute value of the first threshold voltage is greater than the absolute value of the second threshold voltage, and the absolute value of the second threshold voltage is greater than the absolute value of the third threshold voltage.

14. The semiconductor structure as claimed in claim 9, further comprising:

a seventh nanostructure over an eighth nanostructure;

a seventh inner spacer layer between a seventh end portion of the seventh nanostructure and a seventh end portion of the eighth nanostructure;

an eighth inner spacer layer between an eighth end portion of the seventh nanostructure and an eighth end portion of the eighth nanostructure;

an n-type source/drain feature adjoining the seventh and eighth nanostructures; and a fourth gate stack surrounding a middle portion of the seventh nanostructure and a middle portion of the eighth nanostructure and filled in a fourth space defined by the seventh nanostructure, the eighth nanostructure, the seventh inner spacer layer and the eighth inner spacer layer, wherein a portion of the fourth gate stack filled in the fourth space includes the gate dielectric layer, the nitride layer within the gate dielectric layer, and the oxide layer within the nitride layer, wherein the nitride layer of the first gate stack is thicker than the nitride layer of the fourth gate stack.

15. The semiconductor structure as claimed in claim 9, wherein the nitride layer is interfaced with the gate dielectric layer and the oxide layer.

16. A semiconductor structure, comprising:

a first n-type transistor over a substrate, wherein the first n-type transistor includes a first gate stack, the first gate stack includes a first gate dielectric layer, a first barrier oxide over the first gate dielectric layer, and a first work function layer over the first barrier oxide, wherein the first barrier oxide is interfaced with the first gate dielectric layer and the first work function layer;

a second n-type transistor over the substrate, wherein the second n-type transistor includes a second gate stack, the second gate stack includes a second gate dielectric layer, a first barrier nitride over the second gate dielectric layer, a second barrier oxide over the first barrier nitride, and a second work function layer over the first barrier oxide; and a p-type transistor over the substrate, wherein the p-type transistor includes a third gate stack, the third gate stack includes a third gate dielectric layer, a second barrier nitride over the third gate dielectric layer, a third barrier oxide over the second barrier nitride, and a third work function layer over the first barrier oxide, wherein the first to third barrier oxides are made of an oxide of a first metal, and the first to third work function layers are made of a second metal different than the first metal.

17. The semiconductor structure as claimed in claim 16, wherein the first metal is TiN, TaN, or WCN, and the second metal is TiAlC, TaAlN, or TiAlN.

18. The semiconductor structure as claimed in claim 16, wherein the first n-type transistor further includes a plurality of first nanostructures surrounded by the first gate stack, and the p-type transistor further includes a plurality of second nanostructures surrounded by the third gate stack.

19. The semiconductor structure as claimed in claim 16, wherein the third barrier nitride is thicker than the second barrier nitride.

20. The semiconductor structure as claimed in claim 16, further comprising:

a third n-type transistor over the substrate, wherein the third n-type transistor includes a fourth gate stack, the fourth gate stack includes a fourth gate dielectric layer and a fourth work function layer over and in contact with the fourth gate dielectric, wherein the fourth work function layer is made of the second metal.

* * * * *